US006845140B2

(12) United States Patent
Moon et al.

(10) Patent No.: US 6,845,140 B2
(45) Date of Patent: Jan. 18, 2005

(54) METHOD OF DRIVING A SHIFT REGISTER, A SHIFT REGISTER, A LIQUID CRYSTAL DISPLAY DEVICE HAVING THE SHIFT REGISTER

(75) Inventors: Seung-Hwan Moon, Yongin-si (KR); Back-Won Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 10/460,856

(22) Filed: Jun. 13, 2003

(65) Prior Publication Data

US 2003/0231735 A1 Dec. 18, 2003

(30) Foreign Application Priority Data

Jun. 15, 2002 (KR) .............................. 10-2002-0033455
Jul. 2, 2002 (KR) .............................. 10-2002-0037946
Jul. 6, 2002 (KR) .............................. 10-2002-0039129
Feb. 4, 2003 (KR) .............................. 10-2003-0006683

(51) Int. Cl.[7] .............................................. G11C 19/00
(52) U.S. Cl. ............................ 377/78; 377/79; 377/68; 345/99; 345/100
(58) Field of Search .............................. 377/78, 79, 68; 345/99, 100

(56) References Cited

U.S. PATENT DOCUMENTS 6,778,627 B2 * 8/2004 Yu .............................. 377/72

* cited by examiner

Primary Examiner—Margaret R. Wambach
(74) Attorney, Agent, or Firm—Cantor Colburn LLP

(57) ABSTRACT

In a shift register and LCD device having the shift register that may be employed in the liquid crystal display device having a large screen size and a large resolution, the shift register includes stages cascade-connected with each other and each of the stages have a carry buffer for generating a carry signal. The pull-down transistor of each of the stages of the shift register is divided into a first pull-down transistor and a second pull-down transistor. A power voltage Vona larger than the power voltage Von applied to a clock generator is applied to the shift register. A signal delay due to the RC delay of the gate lines may be minimized, the shift register is independent of the variation of the threshold voltage of the TFTs, and image display quality may not be deteriorated.

31 Claims, 36 Drawing Sheets

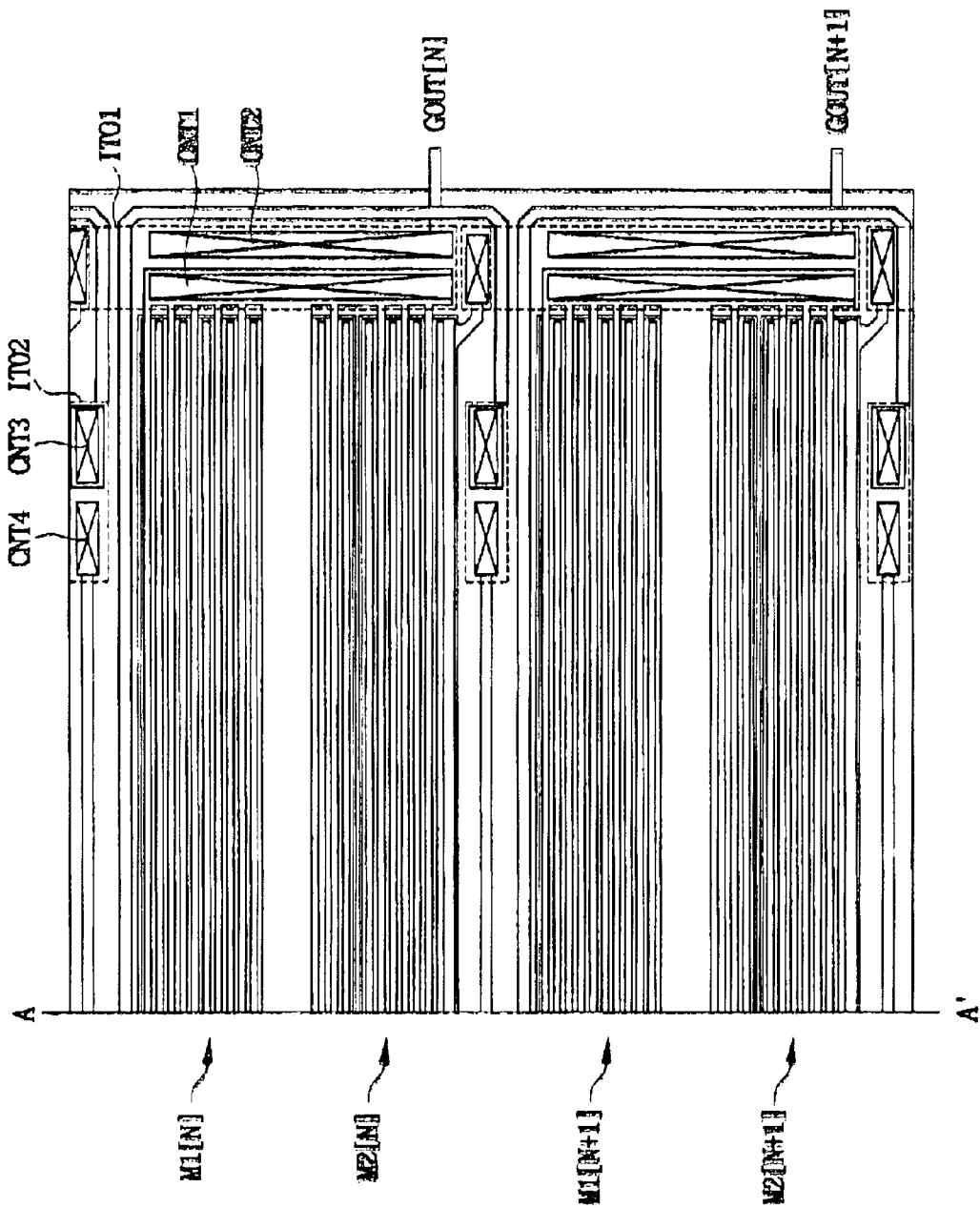

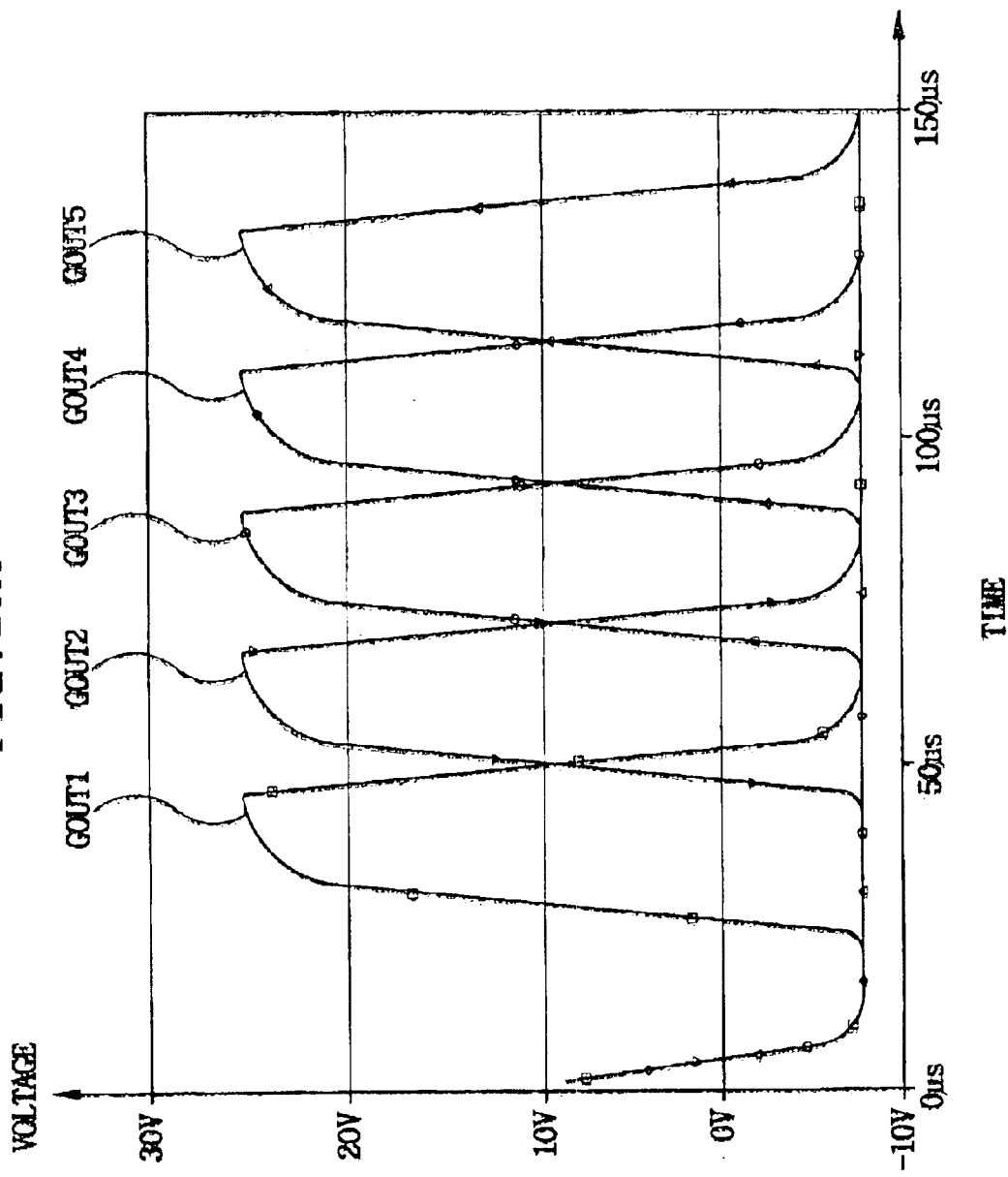

METHOD OF DRIVING A SHIFT REGISTER, A SHIFT REGISTER, A LIQUID CRYSTAL DISPLAY DEVICE HAVING THE SHIFT REGISTER

CROSS-REFERENCE TO RELATED APPLICATIONS

This application relies for priority upon Korean Patent Application No. 2002-33455 filed on Jun. 15, 2002, Korean Patent Application No. 2002-37946 filed on Jul. 2, 2002, Korean Patent Application No. 2002-39129 filed on Jul. 6, 2002 and Korean Patent Application No. 2003-6683 filed on Feb. 4, 2003, the contents of which are herein incorporated by reference in their entirety.

BACKGROUND OF THE INVENTION

1. Field of the Invention

The present invention relates to a method of driving a shift register, a shift register, and a liquid crystal display (LCD) device having the shift register. More particularly, the present invention relates to a method of driving a shift register that may be used in an a-Si thin film transistor liquid crystal display device (a-Si TFT LCD) having a large display screen, a shift register, and a liquid crystal display (LCD) device having the shift register.

2. Description of the Related Art

The TFT LCD device is classified into amorphous-Si TFT LCD (or a-Si TFT LCD) device and a poly-Si TFT LCD device. The poly-silicon TFT LCD (or poly-Si TFT LCD) device has lower power consumption and a low price, but is manufactured through complex processes compared with the a-Si TFT LCD device. Accordingly, the poly-Si TFT LCD is used in a display device having a small display screen such as a mobile phone.

The a-Si TFT LCD device may provide a large display screen and a high yield (or high productivity), and is used in a display device having a large display screen such as a laptop computer, an LCD monitor or a high definition television (HDTV).

FIG. 1 is a schematic view showing a conventional poly-silicon thin film transistor LCD, and FIG. 2 is a schematic view showing a conventional a-Si thin film transistor LCD.

As shown in FIG. 1, the poly-Si TFT LCD device includes a poly-Si TFT pixel array formed on a glass substrate 10. A data driver circuit 12 and a gate driver circuit 14 are formed on the glass substrate 10. An integrated printed circuit board 20 is connected to a terminal part 16 by means of a film cable 18, so that the cost for manufacturing the poly-Si TFT LCD device may be reduced, the thickness of the poly-Si TFT LCD device may be reduce, and power consumption may be minimized because the data driver circuit 12 and the gate driver circuit 14 are integrated on the glass substrate 10.

However, as shown in FIG. 2, in the a-Si TFT LCD device, a data driver chip 34 is mounted on a flexible printed circuit board 32 via a chip on film (COF), and a data printed circuit board 36 is connected to a data line terminal on the a-Si TFT pixel array through the flexible printed circuit board 32. A gate driver chip 40 is mounted on the flexible printed circuit board 32 via the chip on film (COF), and a gate printed circuit board 42 is connected to a gate line terminal on the a-Si TFT pixel array through a flexible printed circuit board 40.

The a-Si TFT LCD device has an advantage in aspect of yield (or productivity), but has disadvantage in aspect of manufacturing cost and thickness.

In addition, in an a-Si TFT LCD device used for displaying an images on a large display screen having a high resolution, the gate driver circuit need to rapidly discharge electric charges accumulated (or charged) at the gate lines connected to pixels. The gate lines have a capacitive load.

However, deterioration of display quality may occur when the conventional gate driver circuit is used in the a-Si TFT LCD device having a large display screen.

SUMMARY OF THE INVENTION

Accordingly, the present invention is provided to substantially obviate one or more problems due to limitations and disadvantages of the related art.

It is an aspect of the present invention to provide a shift register, which may drive an a-Si TFT LCD device used for displaying an image on a large display screen having a high resolution.

It is another aspect of the present invention to provide a liquid crystal display device having above shift register.

It is still another aspect of the present invention to provide a method of driving above the shift register.

In one aspect of the present invention, there is provided a shift register including a plurality of cascade-connected stages. The stages receive a first clock signal and a second clock signal to sequentially produce a plurality of scan line driving signals for selecting a plurality of scan lines. Each of the stages includes a carry buffer, a pull-up part, a pull-down part, a pull-up driver part and a pull-down driver part. The carry buffer provides a next stage with a carry signal corresponding to the first clock signal or the second clock signal, and the second clock signal has an inverted phase with respect to the first clock signal. The pull-up part provides an output terminal with a first scan line driving signal corresponding to the first clock signal or the second clock signal. The pull-down part provides the output terminal with a first power voltage. The pull-up driver part turns on the pull-up part in response to the carry signal provided from a previous stage and turns off the pull-up part in response to a second scan line driving signal of the next stage. The pull-down driver part turns off the pull-down part in response to the carry signal provided from the previous stage and turns on the pull-up part in response to the second scan line driving signal of the next stage.

In another aspect of the present invention, there is provided a liquid crystal display device including a display cell array, a data driver circuit and a gate driver circuit. The display cell array is formed on a transparent substrate and includes a plurality of gate lines, a plurality of data lines and a plurality of switching elements. The switching elements are coupled to the gate lines and the data lines. The data driver circuit provides each of the data lines with an image signal. The gate driver circuit includes a shift register, and the shift register includes a plurality of cascade-connected stages. The stages receive a first clock signal and a second clock signal to sequentially produce a plurality of gate line driving signals for selecting the gate lines. Each of the stages includes a carry buffer, a pull-up part, a pull-down part, a pull-up driver part and a pull-down driver part. The carry buffer provides a next stage with a carry signal corresponding to the first clock signal or the second clock signal, and the second clock signal has an inverted phase with respect to the first clock signal. The pull-up part provides an output terminal with a first gate driving signal corresponding to the first clock signal or the second clock signal. The pull-down part provides the output terminal with a first power voltage. The pull-up driver part turns on the pull-up part in response to the carry signal provided from a previous stage and turns off the pull-up part in response to a second gate line driving signal of the next stage. The pull-down driver part turns off the pull-down part in response to the carry signal provided from the previous stage and turns on the pull-up part in response to the second gate line driving signal of the next stage.

In further another aspect of the present invention, there is provided a method of driving a shift register. The shift register includes a plurality of cascade-connected stages. The stages receive a first clock signal and a second clock signal to sequentially produce a plurality of scan line driving signals for selecting a plurality of scan lines. A next stage is provided with a carry signal corresponding to the first clock signal or the second clock signal, and the second clock signal has an inverted phase with respect to the first clock signal. Then, a first scan line driving signal corresponding to the first clock signal or the second clock signal is produced in response to the carry signal outputted from a previous stage. A first voltage level of the first scan line driving signal outputted from a present stage is lowered in response to a second scan line driving signal outputted from the next stage.

In still another aspect of the present invention, there is provided a shift register including a plurality of cascade-connected stages. A first stage receive a scan start signal, and the stages receive a first clock signal and a second clock signal to sequentially produce a plurality of scan line driving signals for selecting a plurality of scan lines. Each of the stages includes a first carry buffer, a pull-up part, a pull-down part, a pull-up driver part, and a pull-down driver part and a second carry buffer. The first carry buffer provides a next stage with a first carry signal corresponding to the first clock signal or the second clock signal, and the second clock signal has an inverted phase with respect to the first clock signal. The pull-up part provides a first output terminal with a first scan line driving signal corresponding to the first clock signal or the second clock signal. The pull-down part provides the first output terminal with a first power voltage. The pull-up driver part turns on the pull-up part in response to a second carry signal outputted from the first carry buffer of a previous stage and turns off the pull-up part in response to a second scan line driving signal of the next stage. The pull-down driver part turns off the pull-down part in response to the first carry signal provided from the first carry buffer of the previous stage and turns on the pull-up part in response to the second scan line driving signal of the next stage. The second carry buffer lowers a first voltage level of the second carry signal, and the first carry signal is outputted from the first carry buffer of the previous stage to be applied to the pull-up part.

In still another aspect of the present invention, there is provided a liquid crystal display device including a display cell array, a data driver circuit and a gate driver circuit. The display cell array is formed on a transparent substrate and includes a plurality of gate lines, a plurality of data lines and a plurality of switching elements. The switching elements are coupled to the gate lines and the data lines. The data driver circuit provides each of the data lines with an image signal. The gate driver circuit includes a shift register, and the shift register includes a plurality of cascade-connected stages. The stages receive a first clock signal and a second clock signal to sequentially produce a plurality of gate line driving signals for selecting the gate lines. Each of the stages includes a first carry buffer, a pull-up part, a pull-down part, a pull-up driver part, and a pull-down driver part and a second carry buffer. The first carry buffer provides a next stage with a first carry signal corresponding to the first clock signal or the second clock signal, and the second clock signal has an inverted phase with respect to the first clock signal. The pull-up part provides a first output terminal with a first scan line driving signal corresponding to the first clock signal or the second clock signal. The pull-down part provides the first output terminal with a first power voltage. The pull-up driver part turns on the pull-up part in response to a second carry signal outputted from the first carry buffer of a previous stage and turns off the pull-up part in response to a second scan line driving signal of the next stage. The pull-down driver part turns off the pull-down part in response to the first carry signal provided from the first carry buffer of the previous stage and turns on the pull-up part in response to the second scan line driving signal of the next stage. The second carry buffer lowers a first voltage level of the second carry signal, and the first carry signal is outputted from the first carry buffer of the previous stage to be applied to the pull-up part.

In still another aspect of the present invention, there is provided a shift register including a plurality of cascade-connected stages. The stages receive a first clock signal and a second clock signal to sequentially produce a plurality of scan line driving signals for selecting a plurality of scan lines. Each of the stages includes a pull-up switching device, a first pull-up driver switching device, a second pull-up driver switching device, a first pull-down switching device, a pull-down driver switching device and a second pull-down switching device. The pull-up switching device provides an output terminal of each of the stages with a first scan line driving signal corresponding to the first clock signal or the second clock signal. The first pull-up driver switching device turns on the pull-up switching device in response to a scan start signal or a second scan line driving signal outputted from a previous stage. The second pull-up driver switching device turns off the pull-up switching device in response to a third scan line driving signal outputted from a next stage. The first pull-down switching device provides the output terminal with a first power voltage. The pull-down driver switching device turns off the pull-down switching device in response to the scan start signal or the second scan line driving signal outputted from the previous stage. The second pull-down switching device is turned on in response to the third scan line driving signal to provide the output terminal with the first power voltage.

In still another aspect of the present invention, there is provided a liquid crystal display device including a display cell array, a data driver circuit and a gate driver circuit. The display cell array is formed on a transparent substrate and includes a plurality of gate lines, a plurality of data lines and a plurality of switching elements. The switching elements are coupled to the gate lines and the data lines. The data driver circuit provides each of the data lines with an image signal. The gate driver circuit includes a shift register, and the shift register includes a plurality of cascade-connected stages. The stages receive a first clock signal and a second clock signal to sequentially produce a plurality of gate line driving signals for selecting the gate lines. Each of the stages includes a pull-up switching device, a first pull-up driver switching device, a second pull-up driver switching device, a first pull-down switching device, a pull-down driver switching device and a second pull-down switching device. The pull-up switching device provides an output terminal of each of the stages with a first gate line driving signal corresponding to the first clock signal or the second clock signal. The first pull-up driver switching device turns on the pull-up switching device in response to a scan start signal or a second gate line driving signal outputted from a previous stage. The second pull-up driver switching device turns off the pull-up switching device in response to a third gate line driving signal outputted from a next stage. The first pull-down switching device provides the output terminal with a first power voltage. The pull-down driver switching device turns off the pull-down switching device in response to the scan start signal or the second gate line driving signal outputted from the previous stage. The second pull-down switching device is turned on in response to the third gate line driving signal to provide the output terminal with the first power voltage.

In still another aspect of the present invention, there is provided a shift register including a plurality of cascade-connected stages. The stages receive a first clock signal and a second clock signal to sequentially produce a plurality of scan line driving signals for selecting a plurality of scan lines. Each of the stages includes a first pull-up driver switching device, a pull-up switching device, a first pull-down switching device, a second pull-down switching device, a capacitor, a second pull-up driver switching device, a third pull-up driver switching device, a first pull-up driver switching device and a second pull-down driver switching device. A first electrode of the first pull-up driver switching device receives a second power voltage, a second electrode of the first pull-up driver switching device receives a scan start signal or a first scan line driving signal outputted from a previous stage, and a third electrode of the first pull-up driver switching device is coupled to a first node. A fourth electrode of the pull-up switching device receives the first clock signal or the second clock signal, a fifth electrode of the pull-up switching device is coupled to the first node, and a sixth electrode of the pull-up switching device is coupled to an output terminal. A seventh electrode of the first pull-down switching device is coupled to the output terminal, an eighth electrode of the first pull-down switching device is coupled to a second node, and a ninth electrode of the first pull-down switching device receives a first power voltage. A tenth electrode of the second pull-down switching device is coupled to the output terminal, an eleventh electrode of the second pull-down switching device receives a second gate line driving signal outputted from a next stage, and a twelfth electrode of the second pull-down switching device receives the first power voltage. The capacitor is coupled between the first node and the output terminal. A thirteenth electrode of the second pull-up driver switching device is coupled to the first node, a fourteenth electrode of the second pull-up driver switching device receives the second gate line driving signal outputted from the next stage, and a fifteenth electrode of the second pull-up driver switching device receives the first power voltage. A sixteenth electrode of the third pull-up driver switching device is coupled to the first node, a seventeenth electrode of the third pull-up driver switching device is coupled to the second node, and an eighteenth electrode of the third pull-up driver switching device receives the first power voltage. A nineteenth electrode of the first pull-up driver switching device and a twentieth electrode of the first pull-up driver switching device are commonly coupled with each other to receive the second power voltage, and a twenty first electrode of the first pull-up driver switching device is coupled to the second node. A twenty second electrode of the second pull-down driver switching device is coupled to the second node, a twenty third electrode of the second pull-down driver switching device is coupled to the first node, and a twenty fourth electrode of the second pull-down driver switching device receives the first power voltage.

In still another aspect of the present invention, there is provided a method of driving a shift register. The shift register includes a plurality of cascade-connected stages, and the stages receive a first clock signal and a second clock signal to sequentially produce a plurality of scan line driving signals for selecting a plurality of scan lines. The first clock signal or the second clock signal is received, and each of the stages is provided with the first clock signal or the second clock signal. The first clock signal and the second clock signal have substantially a first voltage level corresponding to the first voltage level of a first power voltage. A second power voltage is generated, and each of the stages is provided with the second power voltage. The second power voltage has a second voltage level higher than the first voltage level by a predetermined voltage level. A first scan line driving signal for selecting a first scan line coupled to a present stage is generated. A third voltage level of the first scan line driving signal is lowered to a fourth voltage level lower than the third voltage level in response to a second scan line driving signal outputted from a next stage. The first scan line is provided with the first scan line driving signal having the fourth voltage level. The fourth voltage level of the first scan line driving signal is maintained for a predetermined period when a voltage level of an output signal of a pull-down switching device is changed from a fifth voltage level to a sixth voltage level higher than the fifth voltage level after lowering the third voltage level of the first scan line driving signal.

In still another aspect of the present invention, there is provided a method of driving a shift register. The shift register includes a plurality of cascade-connected stages, and the stages alternately receive a first clock signal and a second clock signal generated from a clock generator to sequentially generate a plurality of scan line driving signals for selecting a plurality of scan lines. The first and second clock signal have substantially a first voltage level corresponding to the first voltage level of a first power voltage. Each of the stages includes a pull-up switching device, a first pull-up driver switching device, a second pull-up driver switching device, a pull-down switching device and a pull-down driver switching device. The pull-up switching device provides an output terminal of each of the stages with a first scan line driving signal corresponding to the first clock signal or the second clock signal. The first pull-up driver switching device turns on the pull-up switching device in response to a scan start signal or a second scan line driving signal outputted from a previous stage. The second pull-up driver switching device turns off the pull-up switching device in response to a third scan line driving signal outputted from a next stage. The pull-down switching device provides the output terminal with a third power voltage. The pull-down driver switching device turns off the pull-down switching device in response to the scan start signal or the second scan line driving signal outputted from the previous stage. The first clock signal or the second clock signal is received, and each of the stages is provided with the first clock signal or the second clock signal. A second power voltage is generated, and each of the stages is provided with the second power voltage. The second power voltage has a second voltage level higher than the first voltage level by a predetermined voltage level. A first scan line driving signal for selecting a first scan line coupled to a present stage is generated during a high level period of the first clock signal or the second clock signal. A third voltage level of the first scan line driving signal is lowered to a fourth voltage level lower than the third voltage level in response to the third scan line driving signal outputted from the next stage. The first scan line is provided with the first scan line driving signal having the fourth voltage level. The fourth voltage level of the first scan line driving signal for a predetermined period is maintained when a voltage level of an output signal of the pull-down switching device is changed from a fifth voltage level to a sixth voltage level higher than the fifth voltage level after lowering the third voltage level of the first scan line driving signal.

As described above, according to the shift register of this invention, the shift register includes a plurality of stages and a carry buffer transistor for generating a carry signal. A signal delay due to the RC delay of the gate lines may be minimized in the liquid crystal display device having a large screen size and a large resolution.

The carry signal is independent of the output signal that is outputted from the output terminal of a present stage and is transferred to the gate lines by the carry buffer transistor disposed in the present stage. Therefore, the effect of the RC loads due to the gate lines may be prevented.

In addition, since the next stage is not reset by the gate line driving signal but is reset by the clock signal, image display quality may not be deteriorated.

In addition, in the liquid crystal display device having a large screen size and a large resolution, the shift register is independent of the variation of the threshold voltage of the thin film transistors, and thus the shift register may output normal gate line driving signals even when the threshold voltage of the thin film transistor varies due to the variation of the peripheral temperature and an abnormal operation of the shift register due to the variation of the threshold voltage of the thin film transistors may be prevented.

In addition, since the shift register is independent of the variation of the threshold voltage of the thin film transistors in the liquid crystal display device having a large screen size and a large resolution may be enhanced.

In addition, the reliability of the shift register may be enhanced throughout a wide range of peripheral temperature.

In addition the yield for manufacturing the shift register may be increased because the tolerance of the variation of the threshold voltage may be increased.

In addition, the pull-down transistor of each of the stages of the shift register is divided into a first pull-down transistor and a second pull-down transistor. Therefore, the transistor size of the pull-down transistor that contributes to the capacitive loads of an inverter of the shift register may be reduced, the operation speed of the inverter may be increased, and thus image display quality may not be deteriorated.

In addition, a power voltage Vona larger than the power voltage Von applied to a clock generator is applied to the shift register, and thus image display quality may not be deteriorated even in the liquid crystal display device having a large screen size and a large resolution.

BRIEF DESCRIPTION OF THE DRAWINGS

The above and other advantages of the present invention will become more apparent by describing in detail the preferred embodiments thereof with reference to the accompanying drawings, in which:

FIGS. 15A and 15B are layouts showing a pull-up part, a pull-down part and a carry buffer in a stage of the shift register of FIG. 11;

FIGS. 16A, 16B and 16C are graphs showing the gate line driving signal outputted from the shift register of FIG. 7;

DESCRIPTION OF EMBODIMENTS

Hereinafter the preferred embodiment of the present invention will be described in detail with reference to the accompanying drawings.

Figure 1:
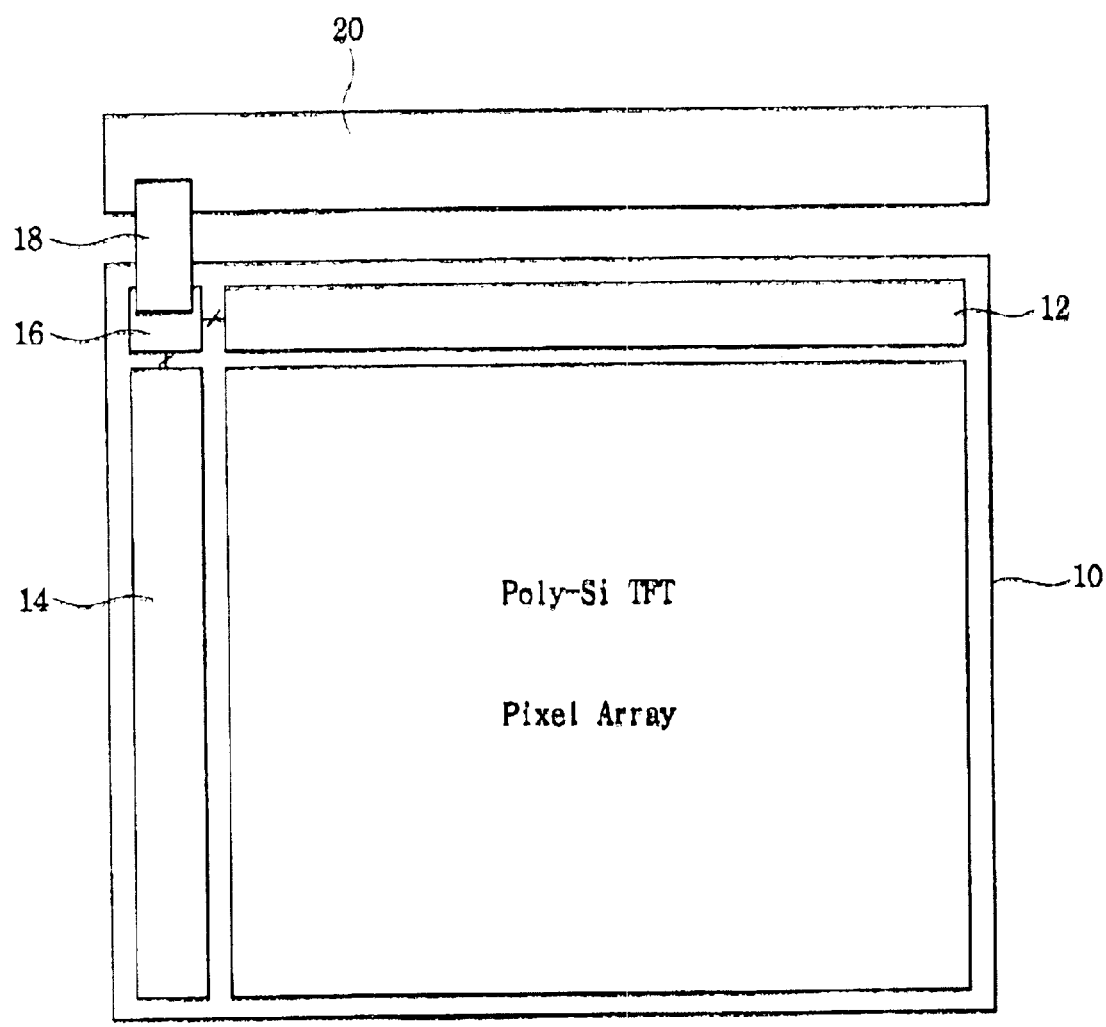
FIG. 1 is a schematic view showing a conventional poly-silicon thin film transistor LCD.
Figure 2:
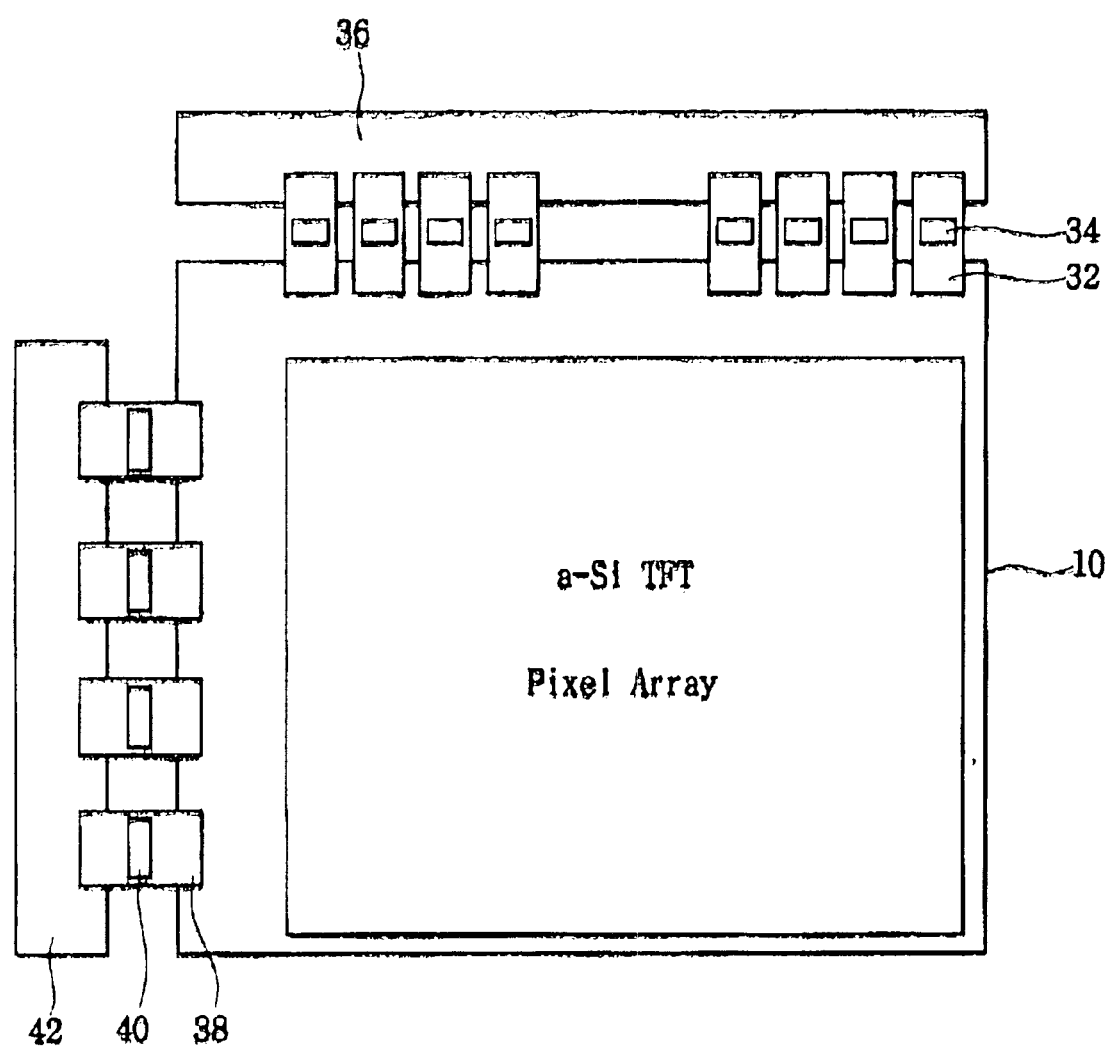
FIG. 2 is a schematic view showing a conventional a-Si thin film transistor LCD.
Figure 3:
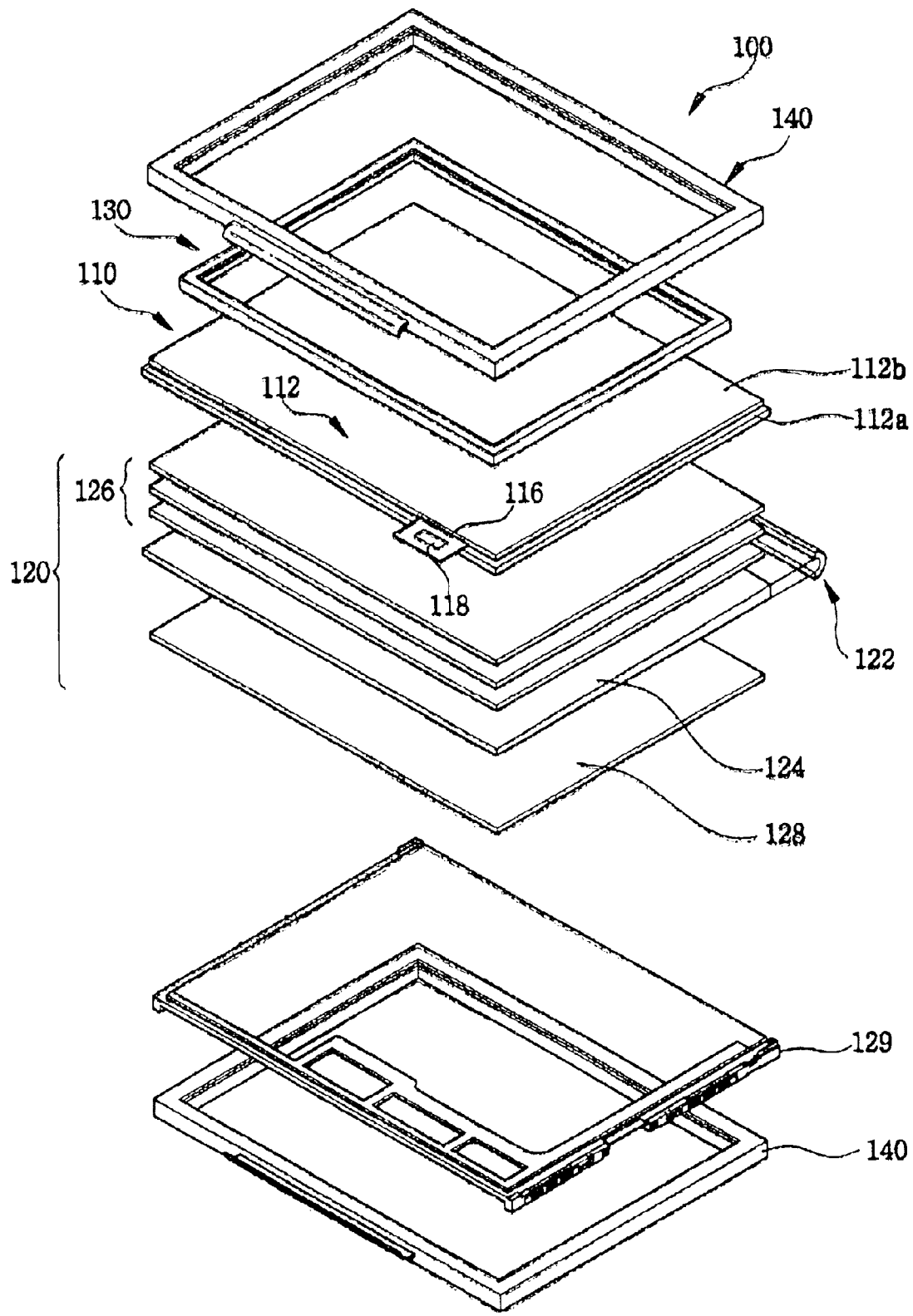
FIG. 3 is an exploded perspective view showing an a-Si thin film transistor LCD according to one exemplary embodiment of the present invention.

FIG. 3 is an exploded perspective view showing an a-Si thin film transistor LCD according to one exemplary embodiment of the present invention.

Referring to FIG. 3, the liquid crystal display device 100 includes a liquid crystal display panel assembly 110, a backlight assembly 120, a chassis 130 and a cover case 140.

The liquid crystal display panel assembly 110 includes a liquid crystal display panel 112, a flexible printed circuit board 116 and an integrated control chip 118. The liquid crystal display panel 112 includes a TFT substrate 112a and a color filter substrate 112b.

A display cell array, a data driver circuit, a gate driver circuit and external connection terminals are formed on the TFT substrate 112a. Color filters and transparent common electrodes are formed on the color filter substrate 112b. The color filter substrate 112b faces the TFT substrate 112a, and liquid crystal is filled between the color filter substrate 112b and the TFT substrate 112a.

The integrated control chip 118 is electrically connected to the thin film transistors formed on display cell array of the TFT substrate 112a through the flexible printed circuit 116. Data signal, data timing signal, gate timing signal and power voltage for driving the gate driver circuit is supplied to the data driver circuit and the gate driver circuit formed on the TFT substrate 112a. The display cell array includes a plurality of gate lines, a plurality of data lines and a plurality of switching elements, and the switching elements respectively is connected to each of the data lines and each of the gate lines. The gate driver circuit is connected with the gate lines, and drives the switching elements. The data driver circuit is connected with the data lines, and provides the data lines with image signals.

The backlight assembly 120 includes a lamp assembly 122, a light-guide plate 124, optical sheets 126, a reflection plate 128 and a mold frame 129.

Figure 4:
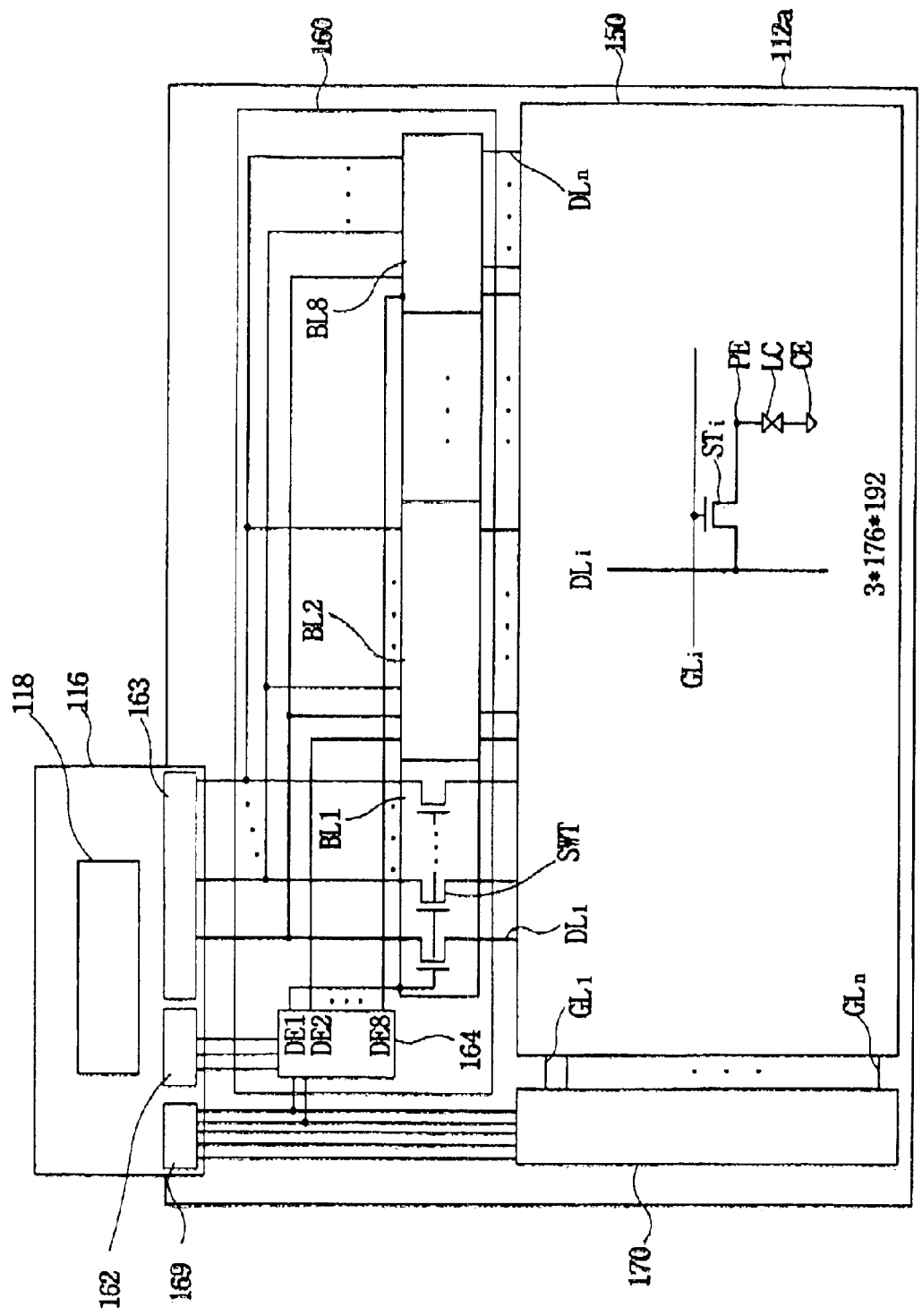
FIG. 4 is a schematic view showing an a-Si thin film transistor substrate of FIG. 3.

FIG. 4 is a schematic view showing an a-Si thin film transistor substrate of FIG. 3.

Referring to FIG. 4, a display cell array 150, a data driver circuit 160, a gate driver circuit 170 and an external connection terminals 162 and 163 for connecting the data driver circuit 160 to the integrated control chip 118 and another external connection terminal 169 for connecting the gate driver circuit 170 to the integrated control chip 118 are formed on the TFT substrate 112a in the same process in which the TFTs are formed on the TFT substrate 112a.

The display cell array 150 includes m data lines DL1, DL2, ..., DLm and n gate lines GL1, GL2, ..., GLn. The data lines DL1, DL2, ..., DLm are extended in a column direction, and the gate lines GL1, GL2, ..., GLn are extended in a row direction. For example, a liquid crystal display panel having 2-inch screen size is disclosed. The liquid crystal display panel has 176 data lines and 192 gate lines, to thereby provide a dot resolution 525 (176×3)×192.

Switching transistors (ST; or switching elements) are formed on an intersection between the data lines and the gate lines. A drain of the switching transistor STi is connected to a data line DLi, a gate of the switching transistor STi is connected to a gate line GLi, and a source of the switching transistor STi is connected to a pixel electrode PE. Liquid crystal LC is disposed between the pixel electrode PE and the common electrode CE. The common electrode CE is formed on the color filter substrate 112b.

Therefore, the voltage applied to the pixel electrode PE and the common electrode CE changes the alignment angle of the liquid crystal molecules, the amount of the light that passing through the liquid crystal molecules are regulated, and an image may be displayed.

The data driver circuit 160 includes a shift register 164 and 528 switching transistors (SWTs). Each of 8 data line blocks BL1, BL2, ..., BL8 includes 66 switching transistors (SWTs).

66 input terminals of each of the data line blocks are commonly connected to the external connection terminal 163, and 66 output terminals are connected to the 66 corresponding data lines, respectively. The external connection terminal 163 has 66 data input terminals. A block selection terminal is connected to an output terminal of the shift register 164.

Sources of the 528 switching transistors (SWTs) are connected to the corresponding data lines, drains of the 528 switching transistors (SWTs) are connected to the corresponding data input terminals, respectively, and the gates of the 528 switching transistors (SWTs) are connected to the block selection terminal. Each of the 528 switching transistors (SWTs) is a-Si TFT MOS transistor.

Accordingly, 66 data lines of the 528 data lines are divided into 8 blocks, and 8 block selection signals may sequentially select each of the blocks.

The shift register 164 receives a first clock CKH, a second clock CKHB and a block selection start signal STH through the external connection terminal 162 having three terminals. Each of the output terminals of the shift register 164 is connected to the block selection terminal of the corresponding data line block.

Figure 5:
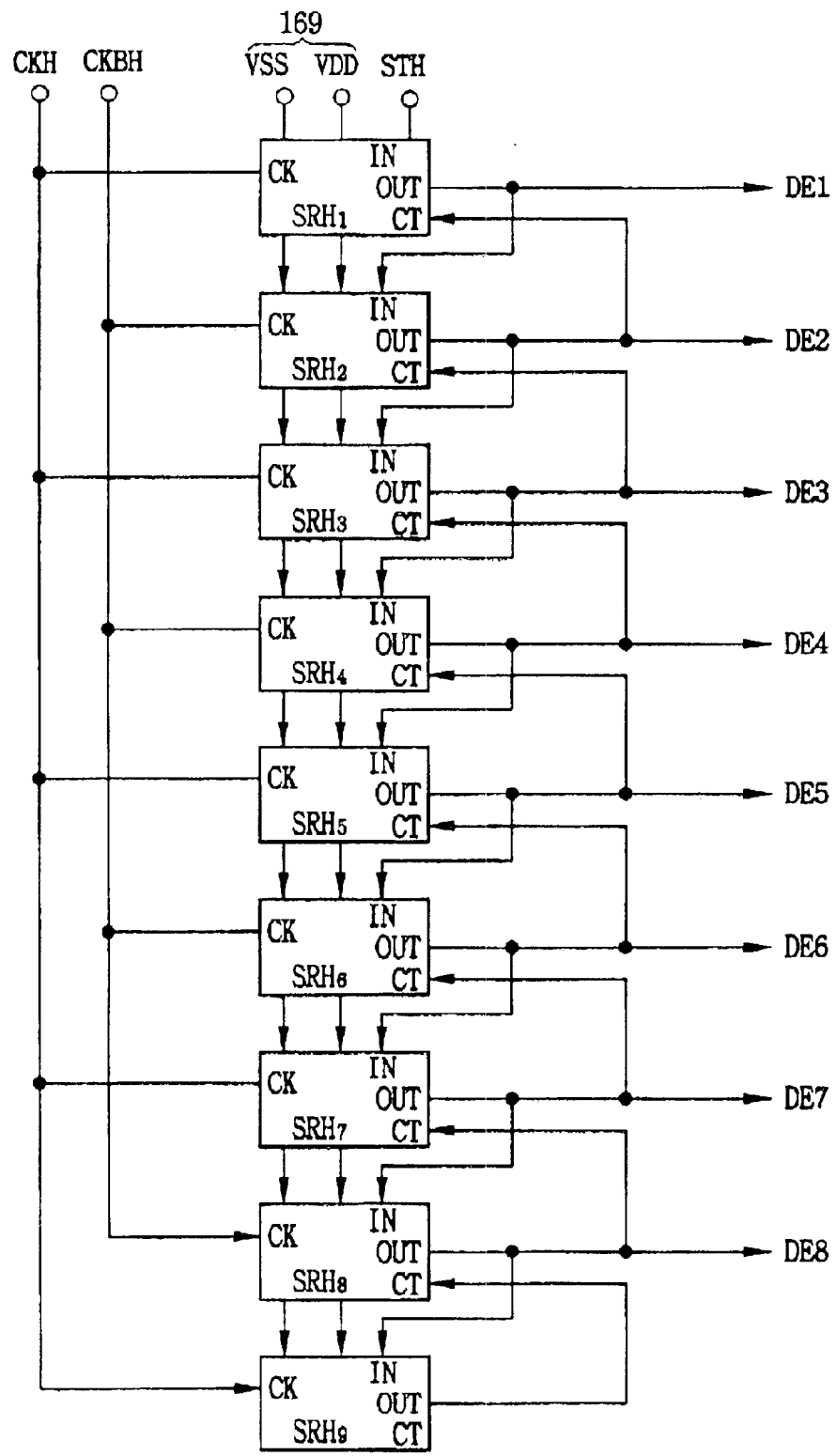
FIG. 5 is a block diagram showing a data driver circuit of FIG. 4.

FIG. 5 is a block diagram showing a data driver circuit of FIG. 4.

Referring to FIG. 5, the shift register 164 according to the present invention includes, for example, 9 stages $SRH_1$, $SRH_2$, ..., $SRH_9$ that are cascade-connected with each other. An output terminal OUT of each of the stages is connected to the input terminal IN of a next stage. The stages includes 8 stages $SRH_1$, $SRH_2$, ..., $SRH_8$ and a dummy stage ($SRC_9$). The 8 stages $SRH_1$, $SRH_2$, ..., $SRH_8$ correspond to the 8 data line blocks. Each of the stages includes an input terminal IN, an output terminal OUT, a control terminal CT, a clock terminal CK, a first power voltage terminal VSS and a second power voltage terminal VDD. The 8 stages $SRH_1$, $SRH_2$, ..., $SRH_8$ provide the block selection terminal of each of the data line blocks BL1, BL2, ..., BL8 with the block selection start signals DE1, DE2, ..., DE8, respectively. The block selection start signals DE1, DE2, ..., DE8 is an enable signal for selecting each of the data line blocks.

The first clock CKH is applied to odd numbered stages $SRH_1$, $SRH_3$, $SRH_5$, $SRH_7$, and $SRH_9$, and the second clock CKHB is applied to even numbered stages $SRH_2$, $SRH_4$, $SRH_6$, $SRH_8$. The first clock CKH has an inverted phase with respect to the second clock CKHB. For example, the duty period of the first clock CKH and the second clock CKHB is lower than 1/66 ms.

An output signal (or gate line driving signal) of the next stage is applied to a control terminal CT as a control signal.

The output signals of each of the stages have sequentially an active period (or a high level period), the data line block corresponding to the active period is selected.

The dummy stage $SRH_9$ provides the control terminal CT of a previous stage ($SRH_8$) with a control signal.

Figure 6:
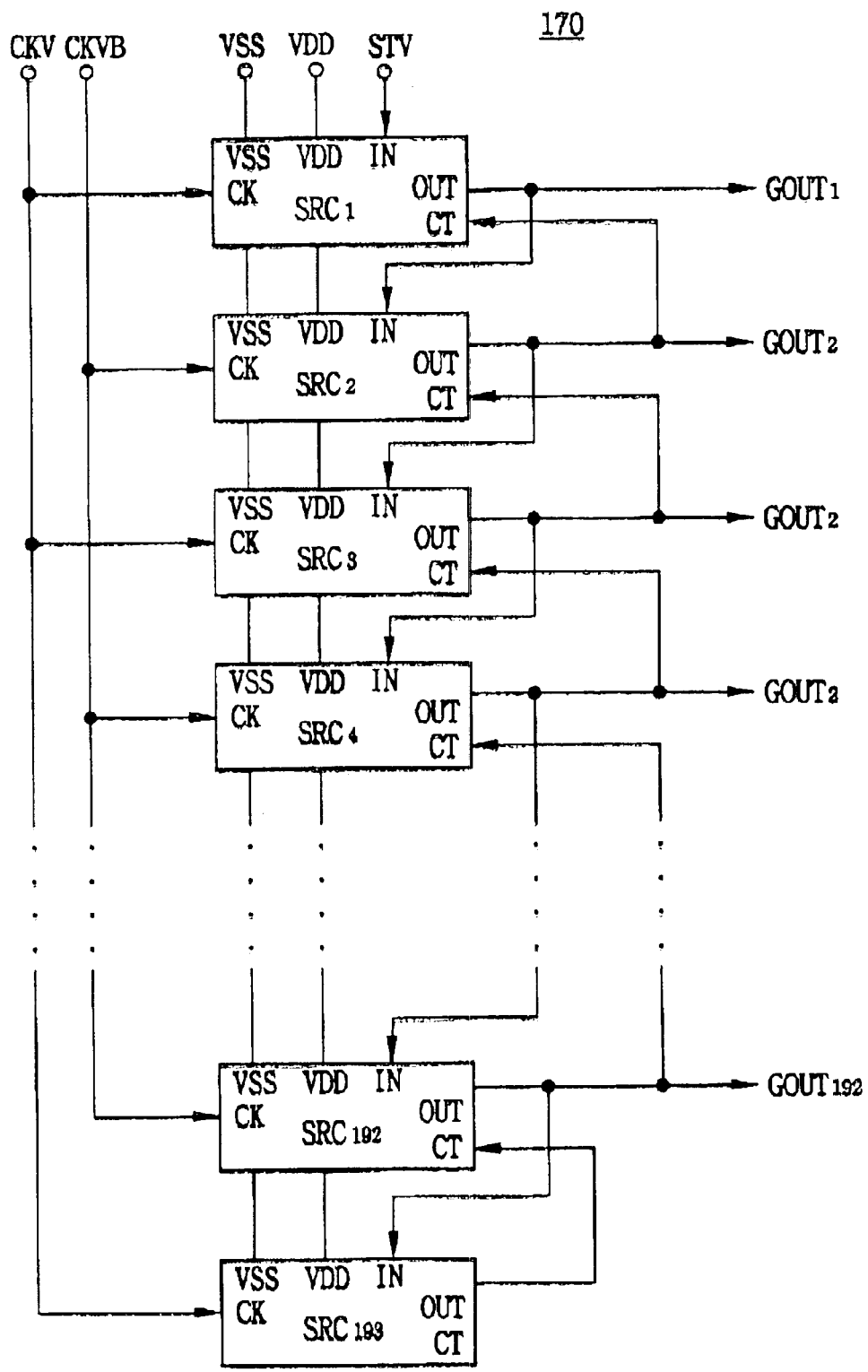
FIG. 6 is a block diagram showing a shift register used in a gate driver circuit of FIG. 4.

FIG. 6 is a block diagram showing a shift register used in a gate driver circuit of FIG. 4.

Referring to FIG. 6, the gate driver circuit 170 includes a shift register, and the shift register, a plurality of stages $SRC_1$, $SRC_2$, ..., $SRC_{192}$ and a dummy stage $SRC_{193}$ that are cascade-connected with each other. An output terminal OUT of each of the stages is connected to an input terminal IN of a next stage. The stages includes 192 stages $SRC_1$, $SRC_2$, ..., $SRC_{192}$ and a dummy stage $SRC_{193}$.

Each of the stages includes an input terminal IN, an output terminal OUT, a control terminal CT, a clock signal input terminal CK, a first power voltage terminal VSS and a second power voltage terminal VDD.

The first stage $SRC_1$ receives a scan start signal STV through the input terminal IN. The scan start signal STV is a pulse synchronized with a vertical synchronization signal Vsync. Each of the stages $SRC_1$, $SRC_2$, ..., $SRC_{192}$ generates gate line driving signals $GOUT_1$, $GOUT_2$, ..., $GOUT_{192}$, respectively, and the gate line driving signals $GOUT_1$, $GOUT_2$, ..., $GOUT_{192}$ are connected to the gate lines, respectively, so as to select the gate lines.

A first clock signal ckv is applied to odd numbered stages ($SRC_1$, $SRC_3$, $SRC_5$, ...), and the second clock signal ckvb is applied to even numbered stages ($SRH_2$, $SRH_4$, $SRH_6$, ...). The first clock ckb has an inverted phase with respect to the second clock ckvb. For example, the duty period of the first clock ckv and the second clock ckvb is about 16.6/192 ms.

The duty period of the clock used in the shift register 164 of the data driver circuit is about 8 times larger than that of the clock used in the shift register 170 of the gate driver circuit.

Output signals $GOUT_1$, $GOUT_2$, ..., $GOUT_{192}$ of the next stage $SRC_2$, $SRC_3$, $SRC_4$ is applied to control terminals CT of the stages $SRC_1$, $SRC_2$, $SRC_3$, respectively, as a control signal.

The output signals of each of the stages have sequentially an active period (or a high level period), and the gate line corresponding to the active period is selected.

The dummy stage $SRC_{193}$ resets (or inactivates) the last stage ($SRH_{192}$). Specifically, the dummy stage $SRC_{193}$ lowers a voltage level of the output signal of the last stage ($SRH_{192}$) from a high voltage level (HIGH) to a low voltage level (LOW).

Figure 7:
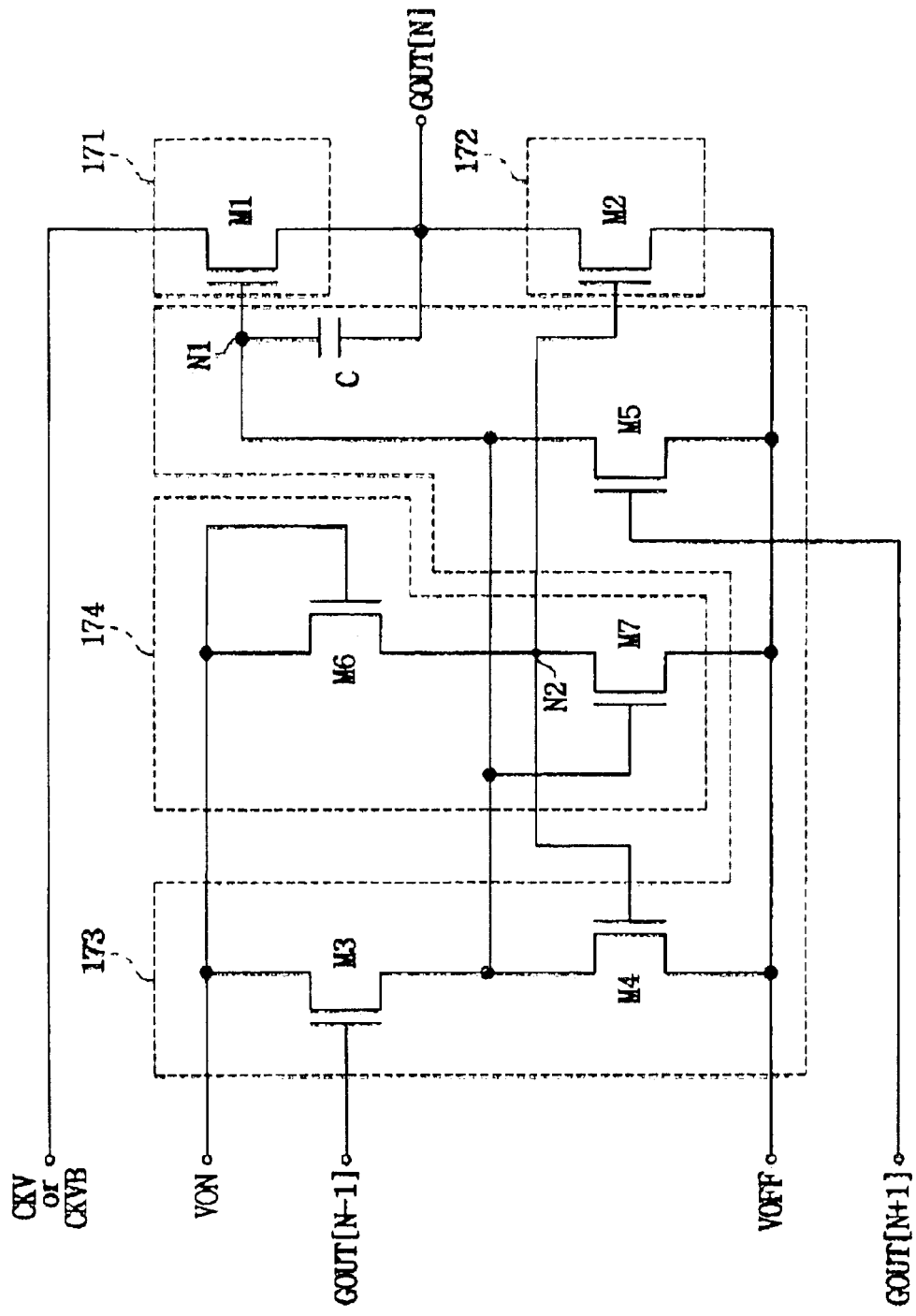
FIG. 7 is a circuit diagram showing a stage of the shift register of FIG. 6.
Figure 8:
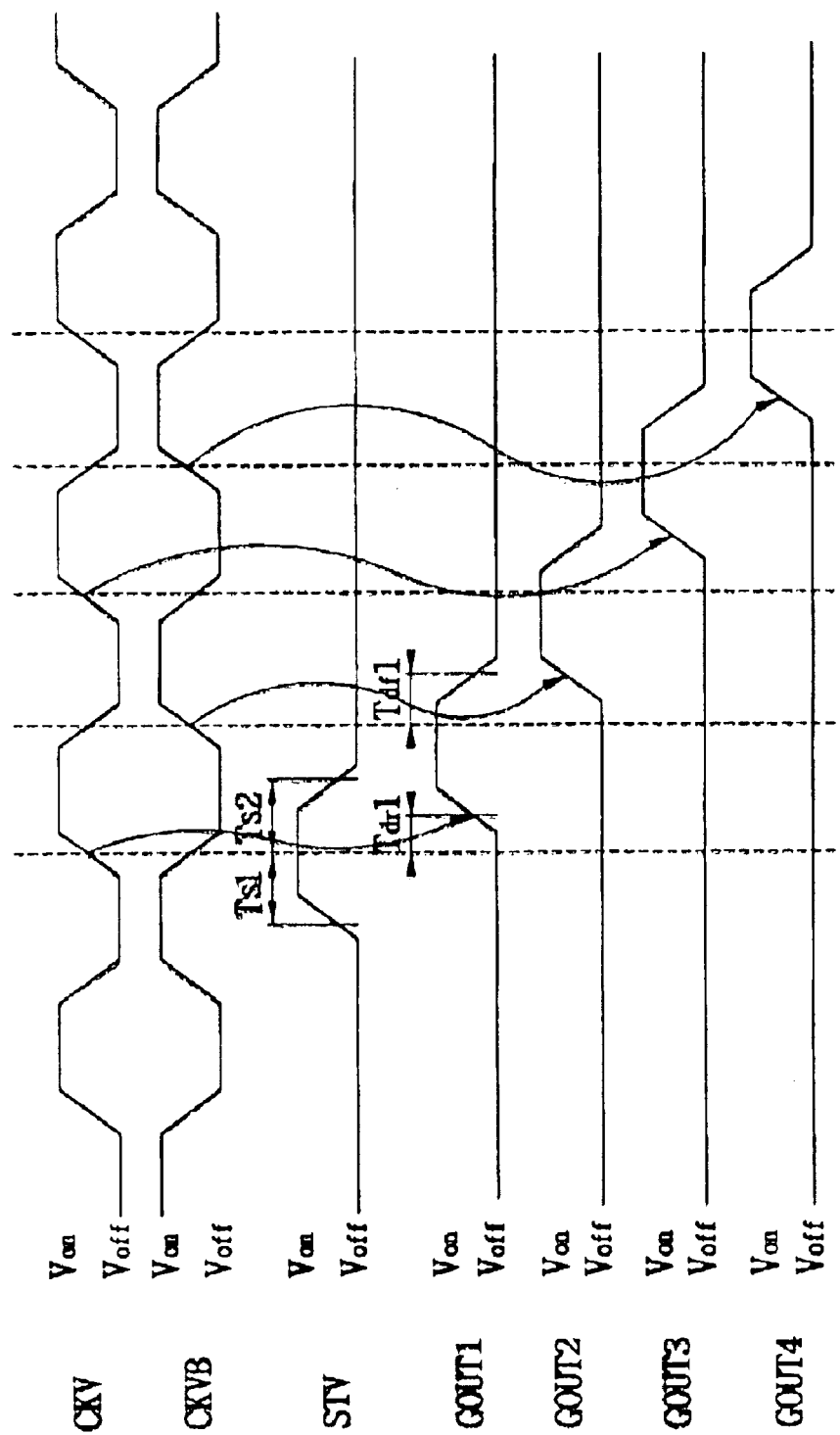
FIG. 8 is a graph showing scan line driving signals outputted from the stage of FIG. 7.

FIG. 7 is a circuit diagram showing a stage of the shift register of FIG. 6, and FIG. 8 is a graph showing scan line driving signals outputted from the stage of FIG. 7.

Referring to FIG. 7, each of the stages of the shift resister 170 includes a pull-up part 171, a pull-down part 172, a pull-up driver part 173 and a pull-down driver part 174.

The pull-up part 171 includes a first NMOS transistor M1 of which a drain is connected to a clock signal input terminal CK, a gate is connected to a first node N1 and a source is connected to an output terminal GOUT[N].

The pull-down part 172 includes a second NMOS transistor M2 of which a drain is connected to an output terminal OUT, a gate is connected to a second node N2 and a source is connected to a first power voltage terminal VSS.

The pull-up driver part 173 includes a capacitor C and NMOS transistors M3, M4 and M5. The capacitor C is connected between the first node N1 and the output terminal GOUT[N]. The third NMOS Transistor M3 has a drain connected to a second power voltage VON, a gate connected to an output terminal GOUT[N-1] of a previous stage, and a source connected to the first node N1. Transistor M4 has a drain connected to the first node N1, a gate connected to the second node N2 and a source connected to the first power voltage VOFF. Transistor M5 has a drain connected to the first node N1, a gate connected to the second node N2 and a source connected to the first power voltage VOFF. Transistor M3 has a transistor size about two times larger than that of transistor M5.

The pull-down driver part 174 includes two NMOS transistors M6 and M7. Transistor M6 has a drain and a gate commonly connected with each other to be connected to the second power voltage VON, a source connected to the second node N2. Transistor M7 has a drain connected to the second node N2, a gate connected to the first node N1 and a source connected to the first power voltage VOFF. Transistor M6 has a transistor size about sixteen times larger than that of transistor M7.

As shown in FIG. 8, when first and second clock signals ckv and ckvb and In scan start signal STV are supplied to the shift register 170, the first stage SRC1 delays a high level period of the first clock signal ckv in response to the front (leading) edge of the scan start signal STV for a predetermined time of Tdr1, to thereby output a delayed output signal GOUT1.

As described above, the shift register formed on the glass substrate receives the scan start signal STV, the first clock ckv and the second clock ckvb, and drives the gates of the TFTs formed on the TFT substrate.

Hereinafter, the operation of each of the stages of the shift register is described.

Figure 9:
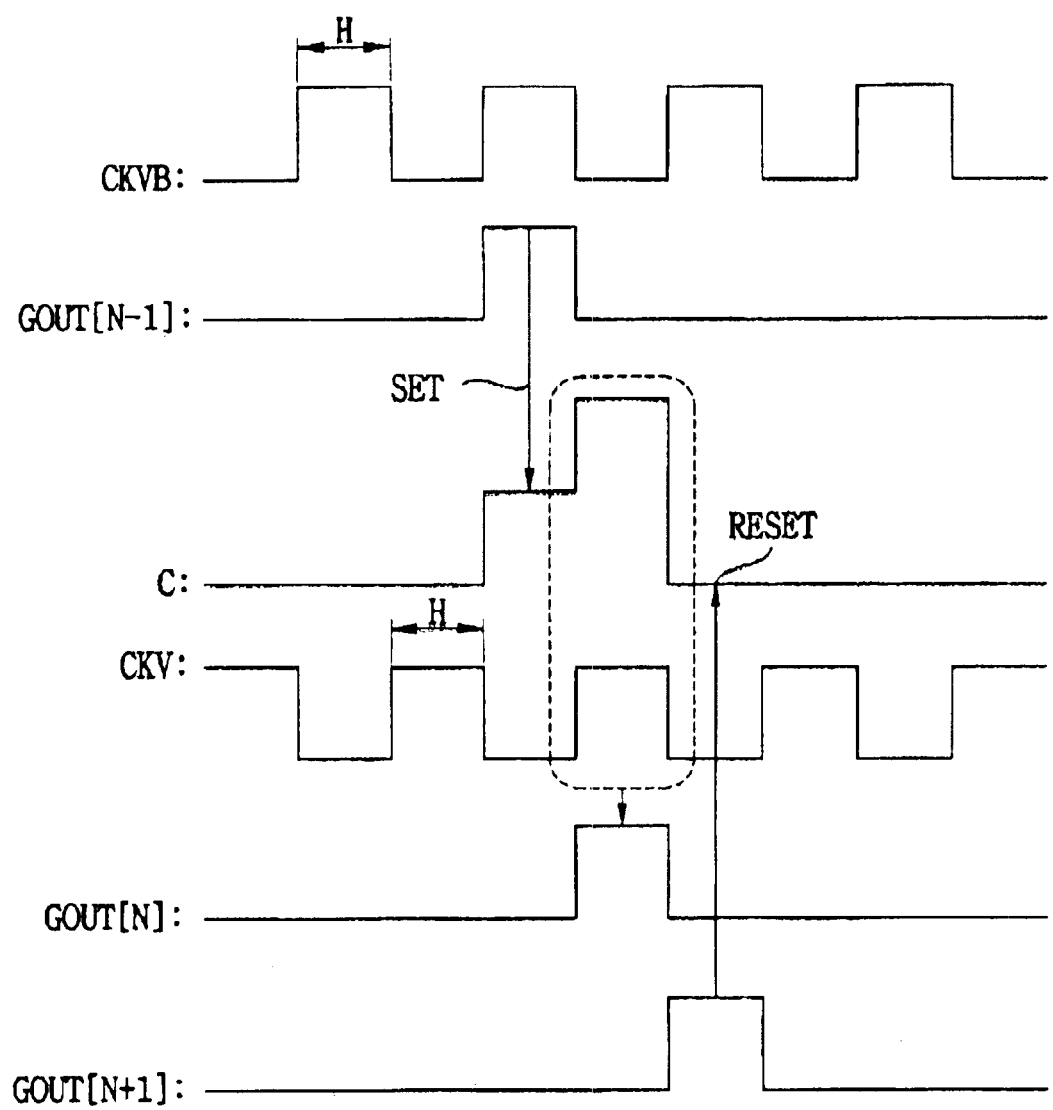
FIG. 9 is a graph showing the scan line driving signals outputted from the shift register of FIG. 6.

FIG. 9 is a graph showing the scan line driving signals outputted from the shift register of FIG. 6.

Referring to FIG. 9, the shift register receives a first clock signal ckv or a second clock signal ckvb and sequentially provides a plurality of gate lines with a plurality of gate line driving signal ($GOUT_1$, $GOUT_2$, $GOUT_3$, ...). The second clock ckvb has an inverted phase with respect to the first clock ckv. The first and second clock signals swings in a period of 2 H, as shown in FIG. 9. A signal outputted from a timing controller (not shown) has a voltage in a range from 0 volt to 3 volts and is amplified to have a voltage in a range from −8 volts to 24 volts, so that the first and second clock signals is acquired.

Referring again to FIG. 7, the output signal (or gate line driving signal) $GOUT_{N-1}$ of the previous stage charges the capacitor C and set (or activate) the present stage. The output signal (or gate line driving signal) $GOUT_{N+1}$ of the next stage discharges the capacitor C and reset (or inactivate) the present stage.

When the first clock signal ckv, the second clock signals ckvb and the scan start signal STV are applied to the first stage, a high level period of the first clock signal ckv is delayed by a predetermined period in response to an rising edge of the scan start signal STV to be outputted at the output terminal as an output signal GOUT[1].

The capacitor C begins to be charged in response to the rising edge of the scan start signal STV that is inputted into the gate of the transistor M1 through the input terminal IN. When the voltage Vc1 charged at the capacitor C is larger than the threshold voltage of the transistor M1, the pull-up transistor M1 is turned on, and the high level period of the first clock signal ckv is outputted at the output terminal OUT.

When the high level period of the first clock signal CKV is outputted at the output terminal OUT, this output voltage, or the high level period of the first clock signal ckv, is bootstrapped at the capacitor C and thereby the gate voltage of the pull-up transistor M1 rises over the turn-on voltage Von. Accordingly, the NMOS pull-up transistor M1 maintains a full turn-on state. The transistor M2 is turned on even when the transistor M4 is turned on by the scan start signal STV since a transistor size of the transistor M3 is about 2 times larger than that of the transistor M4.

Meanwhile, the voltage of the first node N1 rises to the second power voltage Von by the transistor M6 before the scan start signal STV is inputted into the pull-down driver part 174, and the transistor M2 is turned on. Accordingly, the output signal of the output terminal OUT has substantially the first power voltage Voff. When the scan start signal STV is inputted to the pull-down driver part 174, the transistor is turned on, and the voltage of the second node N2 is dropped to substantially the first power voltage Voff. Since the transistor size of the transistor M7 is about 16 times larger than that of the transistor M6, the second node N2 maintains substantially the first power voltage Voff even though the transistor M6 is turned on. Accordingly, the pull-down transistor M2 is turned off.

When the scan start signal STV is applied to the pull-down driver part 74, the pull-down transistor M2 is turned off, and the first clock signal ckv is delayed by a duty period of the first clock signal ckv to be outputted at the output terminal.

When the voltage of the output signal outputted fro the output terminal OUT is dropped to a turn-off voltage Voff (or Vss), the transistor M7 is turned off. Since only the second power voltage Von is provided to the second node N2 through the transistor M6, the voltage of the second node N2 begins to rise from a first power voltage Voff to a second power voltage Von. When the voltage of the fourth node begins to rise, the transistor M4 is turned on, and the charges at the capacitor are discharged through the transistor M4. Therefore, the pull-up transistor M1 begins to be turned off.

Then, since the output signal GOUT[N+1] outputted from the next stage rises to the turn-on voltage Von, the transistor M5 is turned on. Since the transistor size of the transistor M5 is about 2 times larger than that of the transistor M4, the voltage of the first node N1 is dropped to the first power voltage Voff more rapidly compared with the case in which only the transistor M4 is turned on.

In addition, when the voltage of the second node N2 rises to the second power voltage Von, the pull-down transistor M2 is turned on, and the output voltage outputted from the output terminal OUT is changed from the turn-on voltage Von to the turn-off voltage Voff.

Since the second node N2 is connected to the transistor M6, the second node N2 maintains the second power voltage Von even though the output signal GOUT[N+1] of the next stage that is applied to the control terminal CT is dropped to a low voltage level and the transistor M5 is turned off. Accordingly, the malfunction due to the turn-off of the pull-down transistor M2 is prevented.

As shown in FIG. 8, the output signals GOUT[1], GOUT[2], GOUT[3], GOUT[4], . . . are sequentially generated.

As described above, the capacitor C is charged in response to the output signal of the previous stage, the clock signal applied to the pull-up part or pull-down part is outputted as an output signal of the present stage. When the output signal of the next stage is generated at the gate line connected to the output terminal of the next stage, the output signal of the next stage turns on the discharge transistor M5 and discharges the capacitor C, to thereby terminate an operation cycle of the shift register.

Above described shift register is used as a gate driver circuit in a liquid crystal display device having a small or medium display size, but may not be used as a gate driver circuit in a liquid crystal display device having a large display screen because of an RC delay due to the resistance and capacitance existing in the gate lines.

As shown in FIG. 6, each of the stages receives a first clock ckv or a second clock ckvb having a period of 2 H and applies the first clock ckv or a second clock ckvb to the gate lines.

Particularly, an Nth stage receives a (N-1)th gate turn-on voltage (or a (N-1)th gate line driving signal) through an input terminal and generates an Nth gate turn-on voltage (or a Nth gate line driving signal) in response to the (N-1)th gate turn-on voltage. The Nth stage receives a (N+1)th gate line driving signal through a control terminal and provides the gate lines with a gate turn-of voltage in response to a (N+1)th gate line driving signal.

Since the (N-1)th gate turn-on voltage is electrically coupled with a (N-1)th gate line, the load of the (N-1)th gate line electrically affects the input terminal of the Nth stage. Therefore, a signal delay is generated and each of the stage is affected by the loads of the gate lines.

Figure 10:
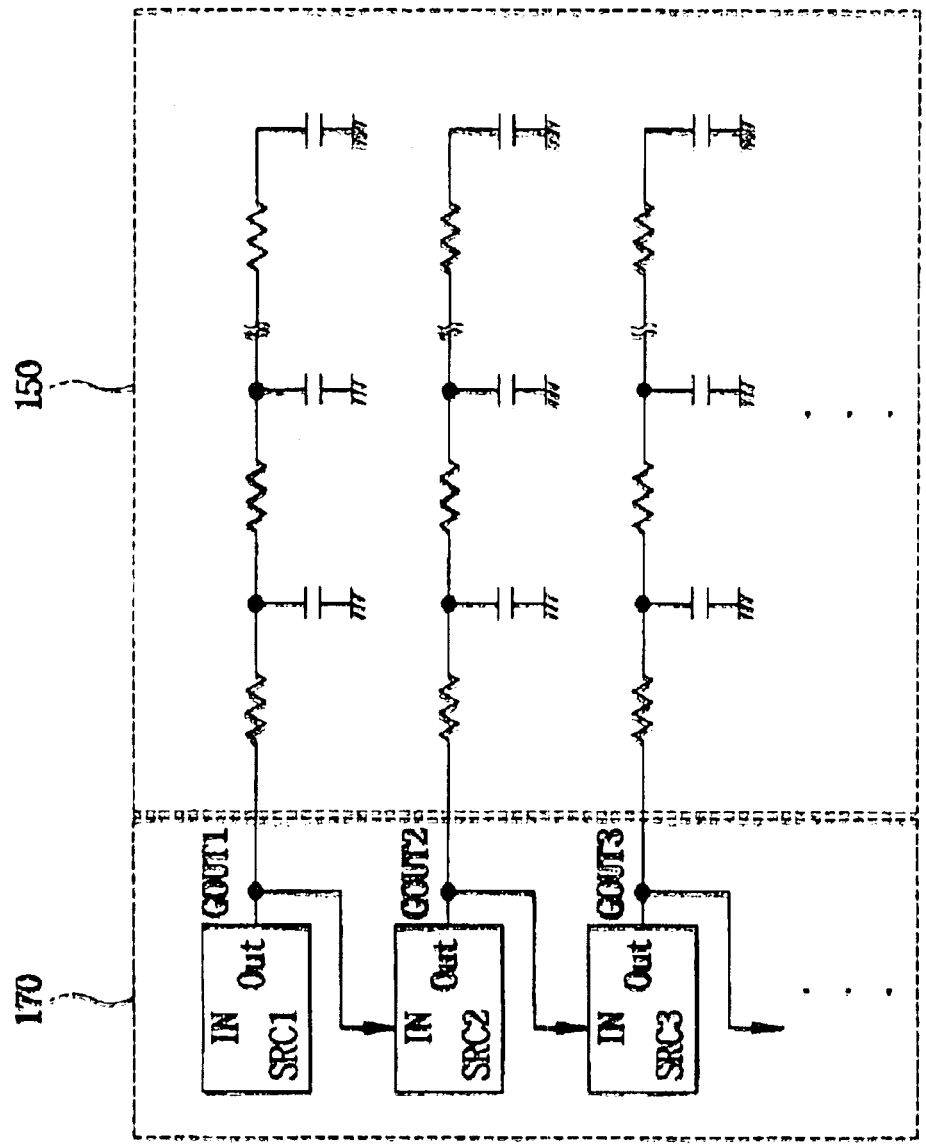
FIG. 10 is a schematic view showing the shift register of FIG. 6 and the gate lines.

As shown in FIG. 10, each of the gate lines have a plurality of resistive elements and a plurality of capacitive elements, and the input terminal of the Nth stage receives the (N-1)th output signal of the (N-1)th stage. Since the input terminal of the Nth stage is connected to the (N-1)th gate line, the signal delay (for example an RC delay) may occurs due to an RC load of the gate lines.

In addition, since each of the stages is cascade-connected with each other, the signal delay may increase according as N increases because of the RC loads of the previous gate lines (first gate line, second gate line, . . . , (N-1)th gate line) connected to previous stages (first stage, second stage, . . . , (N-1)th stage). Therefore, display quality may be seriously deteriorated. In a liquid crystal display device having small or medium screen sizes, the signal delay may not cause above seriously deteriorated display quality since the RC load of the gate lines are small and the period during which the gate turn-on voltage is shown is long. However, in a liquid crystal display device having a large display screen size, the signal delay may cause above seriously deteriorated display quality.

An external signal instead of the gate line driving signal outputted from the previous stage may be used so as to activate (or set) the next stage.

Figure 11:
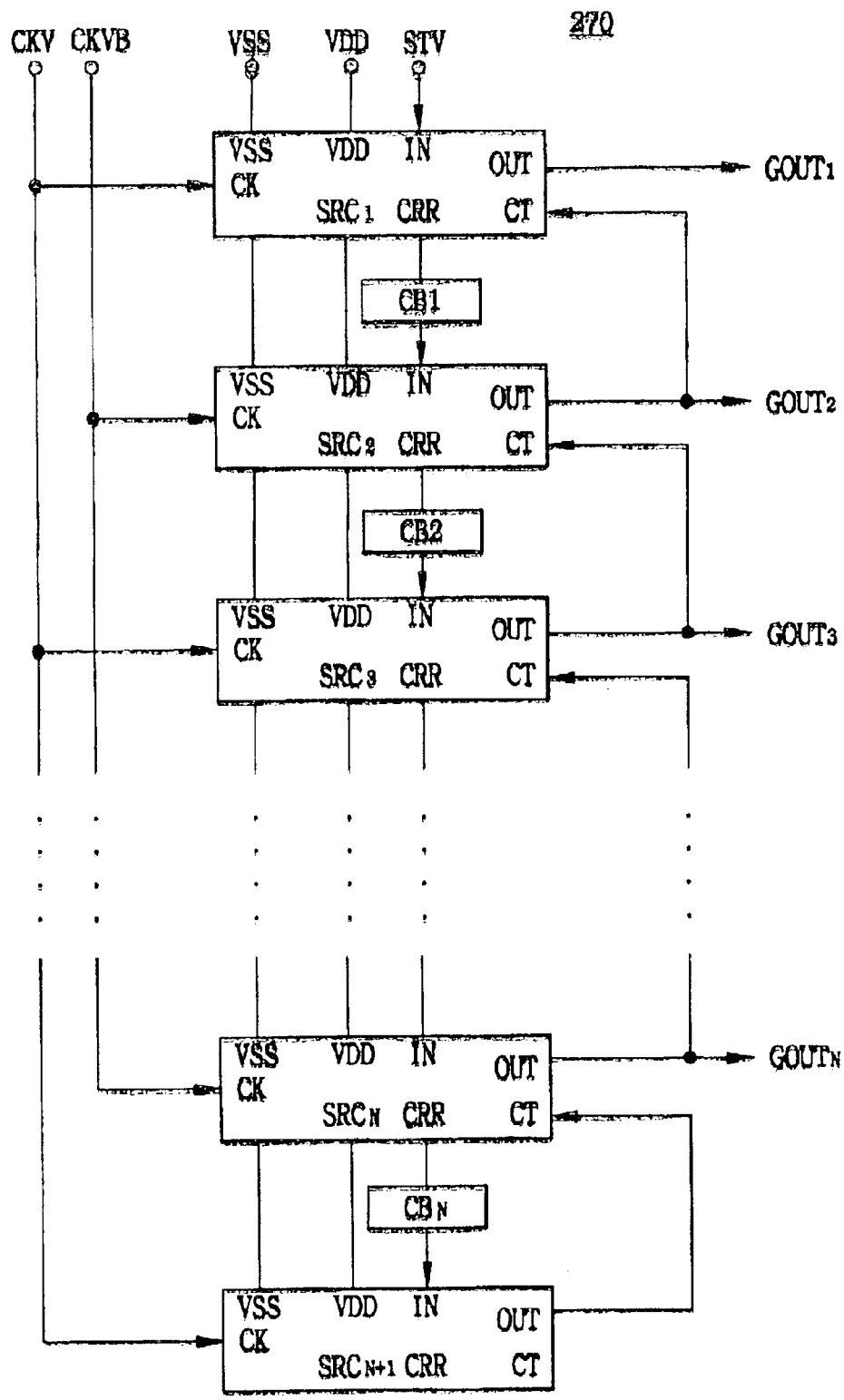
FIG. 11 is a block diagram showing a shift register used in a gate driver circuit according to a first exemplary embodiment of the present invention.

FIG. 11 is a block diagram showing a shift register used in a gate driver circuit according to a first exemplary embodiment of the present invention.

Referring to FIG. 11, the gate driver circuit according to the first exemplary embodiment of the present invention includes a plurality of stages $SRC_1$, $SRC_2$, $SRC_3$, ..., $SRC_N$, $SRC_{N+1}$ that are cascade-connected with each other and a plurality of carry buffers $CB_1$, $CB_2$, ..., $CB_N$. The carry buffers $CB_1$, $CB_2$, ..., $CB_N$ are interposed between two adjacent stages. An output terminal OUT of each of the stages is connected to an input terminal IN of a next stage. The stages includes N stages $SRC_1$, $SRC_2$, ..., $SRC_N$ and a dummy stage $SRC_{N+1}$.

Each of the stages includes an input terminal IN, an output terminal OUT, a control terminal CT, a clock signal input terminal CK, a first power voltage terminal VSS, a second power voltage terminal VDD and a carry output terminal CRR.

The first stage $SRC_1$ receives a scan start signal STV through the input terminal IN. The scan start signal STV is a pulse signal synchronized with a vertical synchronization signal Vsync supplied from an external graphic controller (not shown).

The stages $SRC_2$, ..., $SRC_N$ receives a carry voltage supplied from the carry output terminal CRR of a previous stage through a carry buffer.

Each of the stages $SRC_1$, $SRC_2$, ..., $SRC_{192}$ generates gate line driving signals $GOUT_1$, $GOUT_2$, ..., $GOUT_{192}$, respectively, and the gate line driving signals $GOUT_1$, $GOUT_2$, ..., $GOUT_{192}$ are connected to the gate lines, respectively, so as to select the gate lines.

A first clock signal ckv is applied to odd numbered stages ($SRC_1$, $SRC_3$, $SRC_5$, ...), and the second clock signal ckvb is applied to even numbered stages ($SRH_2$, $SRH_4$, $SRH_6$, ...). The first clock ckb has an inverted phase with respect to the second clock ckvb. For example, the duty period of the first clock ckv and the second clock ckvb is about 16.6/192 ms.

The duty period of the clock used in the shift register 164 of the data driver circuit is about 8 times larger than that of the clock used in the shift register 170 of the gate driver circuit.

Output signals $GOUT_2$, ..., $GOUT_{192}$ of the next stage $SRC_2$, $SRC_3$, $SRC_4$ is applied to control terminals CT of the stages $SRC_1$, $SRC_2$, $SRC_3$, respectively, as a control signal.

The carry buffers $CB_1$, $CB_2$, ..., $CB_N$ uses the clock signals supplied from an external power source as a carry signal instead of the gate line driving signal outputted from the previous stage so as to activate (or set) the next stage. The carry buffers $CB_1$, $CB_2$, ..., $CB_N$ may be installed inside each of the stages.

Figure 12:
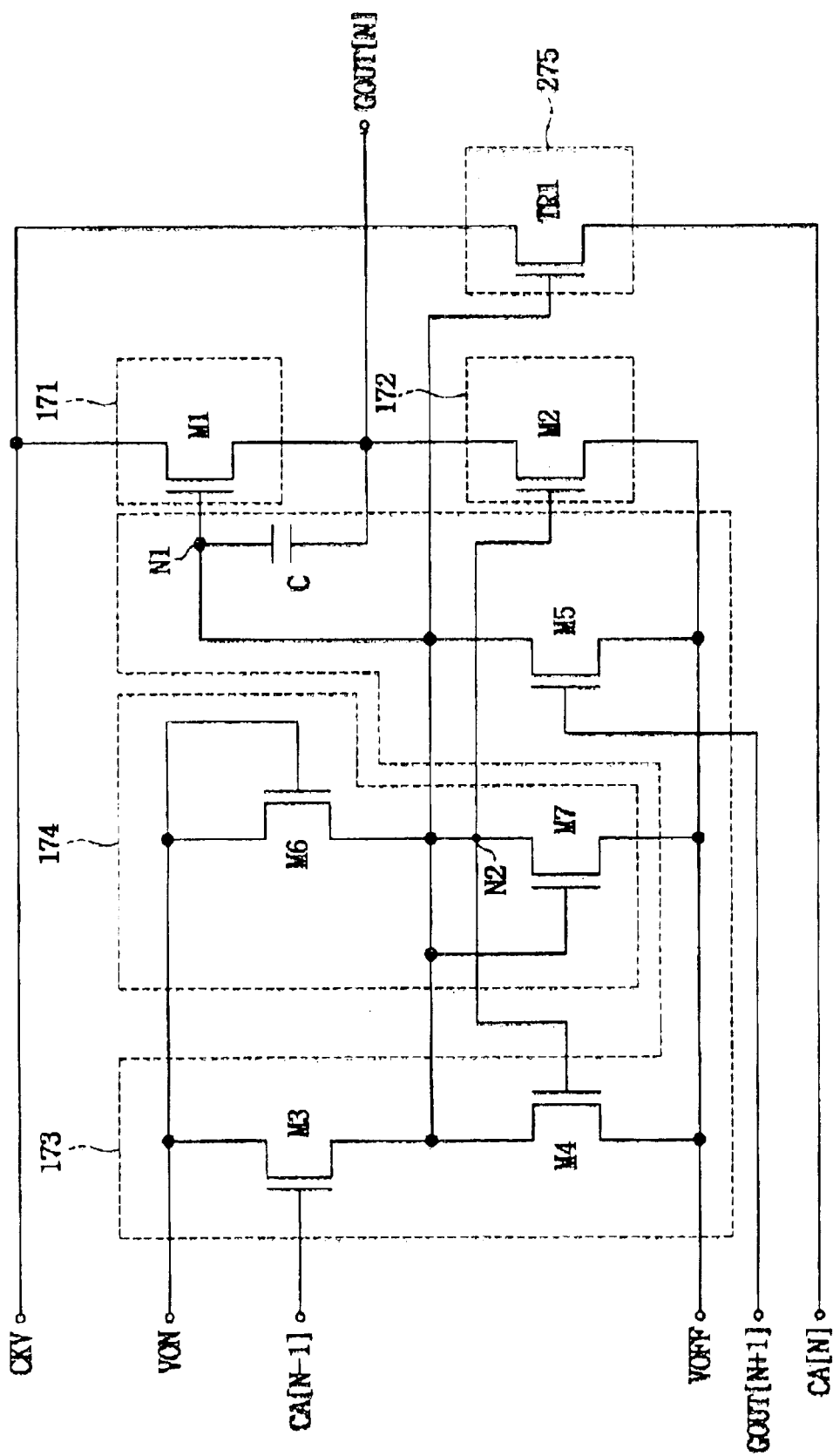
FIG. 12 is a circuit diagram showing an Nth stage in the shift register of FIG. 11.

FIG. 12 is a circuit diagram showing an Nth stage in the shift register of FIG. 11.

Referring to FIG. 12, each of the stages of the shift resister includes a pull-up part 171, a pull-down part 172, a pull-up driver part 173, a pull-down driver part 174 and a carry buffer 275.

The pull-up part 171 includes a first NMOS transistor M1 of which a drain is connected to a clock signal input terminal CK, a gate is connected to a first node N1 and a source is connected to an output terminal GOUT[N].

The pull-down part 172 includes a second NMOS transistor M2 of which a drain is connected to the output terminal GOUT[N], a gate is connected to a second node N2 and a source is connected to a first power voltage terminal VSS.

The pull-up driver part 173 includes a capacitor C and NMOS transistors M3, M4 and M5. The capacitor C is connected between the first node N1 and the output terminal GOUT[N]. The third NMOS Transistor M3 has a drain connected to a second power voltage VON, a gate connected to an output terminal GOUT[N−1] of a previous stage, and a source connected to the first node N1. Transistor M4 has a drain connected to the first node N1, a gate connected to the second node N2 and a source connected to the first power voltage VOFF. Transistor M5 has a drain connected to the first node N1, a gate connected to the second node N2 and a source connected to the first power voltage VOFF. Transistor M3 has a transistor size about two times larger than that of transistor M5.

The pull-down driver part 174 includes two NMOS transistors M6 and M7. Transistor M6 has a drain and a gate commonly connected with each other to be connected to the second power voltage VON, a source connected to the second node N2. Transistor M7 has a drain connected to the second node N2, a gate connected to the first node N1 and a source connected to the first power voltage VOFF. Transistor M6 has a transistor size about sixteen times larger than that of transistor M7.

The carry buffer 275 includes a carry buffer transistor TR1 and outputs the first clock ckv or the second clock ckvb to the next stage. Particularly, a gate of the carry buffer transistor TR1 is connected to an input terminal of the pull-down driver part 174, a drain of the carry buffer transistor TR1 is connected to a clock terminal CKV or CKVB, and a source of the carry buffer transistor TR1 is connected to a gate of a third transistor M3 of pull-up part 173 of the next stage.

The carry buffer transistor TR1 of a previous stage receives the first clock ckv or the second clock ckvb and transfers the first clock ckv or the second clock ckvb to the present stage as a carry signal. Since the clock signals having substantially a uniform voltage level is used as the carry signal, the RC delay due to the RC load of the gate lines may not occur.

Figure 13:
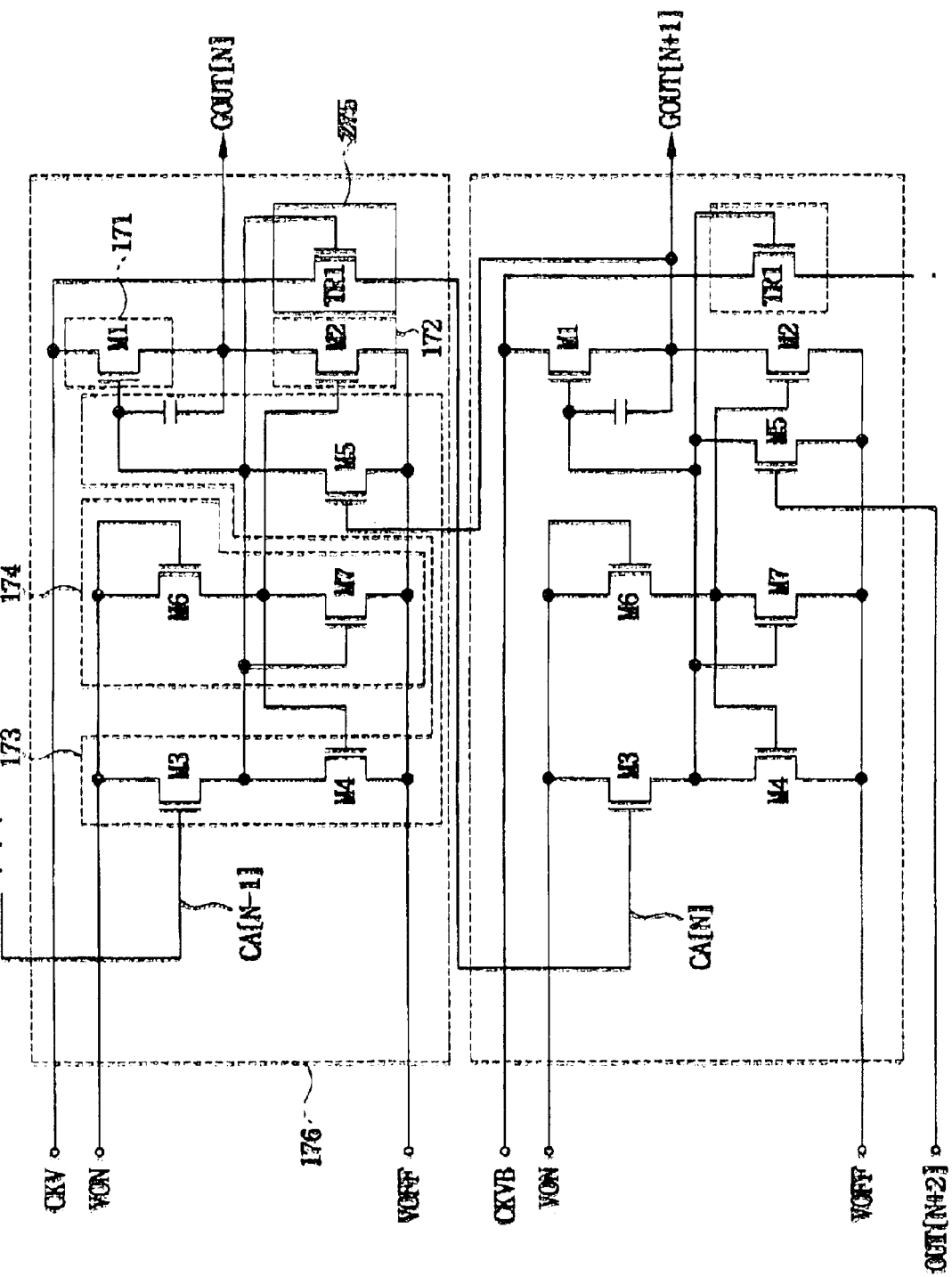
FIG. 13 is a circuit diagram showing a last stage and a dummy stage in the shift register of FIG. 11.

FIG. 13 is a circuit diagram showing a last stage and a dummy stage in the shift register of FIG. 11.

Referring to FIG. 13, each of the stages of the shift resister includes a pull-up part 171, a pull-down part 172, a pull-up driver part 173, a pull-down driver part 174 and a carry buffer 275. In FIG. 13, the same reference numerals denote the same elements in FIG. 12, and thus the detailed descriptions of the same elements will be omitted.

As shown in FIG. 13, since an output signal of the previous stage is affected by the RC load of the gate lines, the output signal of the previous stage is not applied to the input terminal of each of the stages, the clock signals is applied to the input terminal of each of the stages as a carry signal. Therefore, since the clock signals used as the carry signal is independent of the output signal of the previous stage, the RC delay due to the RC load of the gate lines may not occur.

Hereinafter, an upper stage of FIG. 13 is referred to as a previous stage $SRC_N$, a lower stage of FIG. 13 is referred to as a present stage $SRC_{N+1}$ in order to describe the operation of the shift register of the present invention.

The carry buffer transistor TR1 of a previous stage $SRC_N$ receives the first clock ckv (or a control signal of the pull-up transistor M1) for activating (or setting) the present stage $SRC_{N+1}$, and transfers substantially the first clock ckv to the present stage $SRC_{N+1}$ as a carry signal. Since the clock signal ckv having substantially a uniform voltage level is used as the carry signal, the RC delay due to the RC load of the gate lines may not occur.

The third transistor M3 remains in a turn-off state before the carry signal CA[N] is applied to a gate of the third transistor M3. When the carry signal CA[N] is applied to the gate of the third transistor M3, after a predetermined period, the third transistor M3 is turned on to form a current path through which the second power voltage Von is charged at the capacitor C.

When the clock ckv having a low level, or the voltage level of the first power voltage Voff, is applied to the gate of the third transistor M3, the third transistor M3 is turned off.

Figure 14:
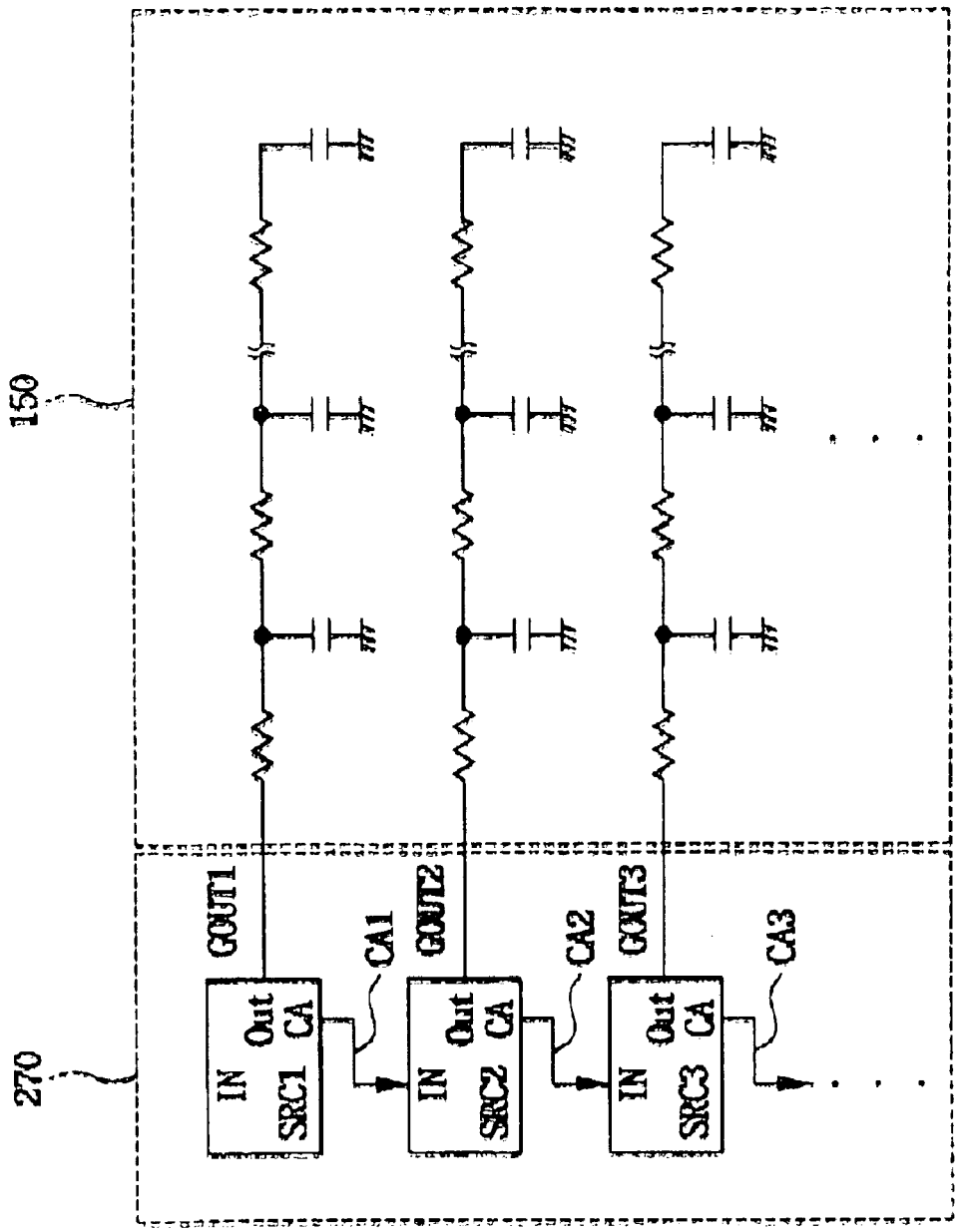
FIG. 14 is a schematic view showing the shift register of FIG. 11 and the gate lines.

FIG. 14 is a schematic view showing the shift register of FIG. 11 and the gate lines.

Referring to FIG. 14, each of the stages (SRC$_1$, SRC$_2$, SRC$_3$, . . . ) sequentially applies a plurality of gate line driving signals (GOUT$_1$, GOUT$_2$, GOUT$_3$, . . . ), respectively, through the output terminal of each of the stages in order to select the gate lines of a liquid crystal display panel 150.

In addition, each of the stages (SRC$_1$, SRC$_2$, SRC$_3$, . . . ) sequentially applies a carry signal to an input terminal of the next stage through a carry output terminal CA. The carry signal is a first clock ckv or a second clock ckvb. The first clock ckv or the second clock ckvb is supplied from an external power source and is independent of each of the stages. The second clock ckvb has an inverted phase with respect to the first clock ckv.

Since, instead of a gate line driving signal outputted from an output terminal OUT of a previous stage, the carry signal outputted from the carry output terminal of the previous stage is applied to the input terminal of the present stage in order to activate the present stage, the deterioration of the display quality due to RC load of the gate lines may be prevented.

Figure 15A:
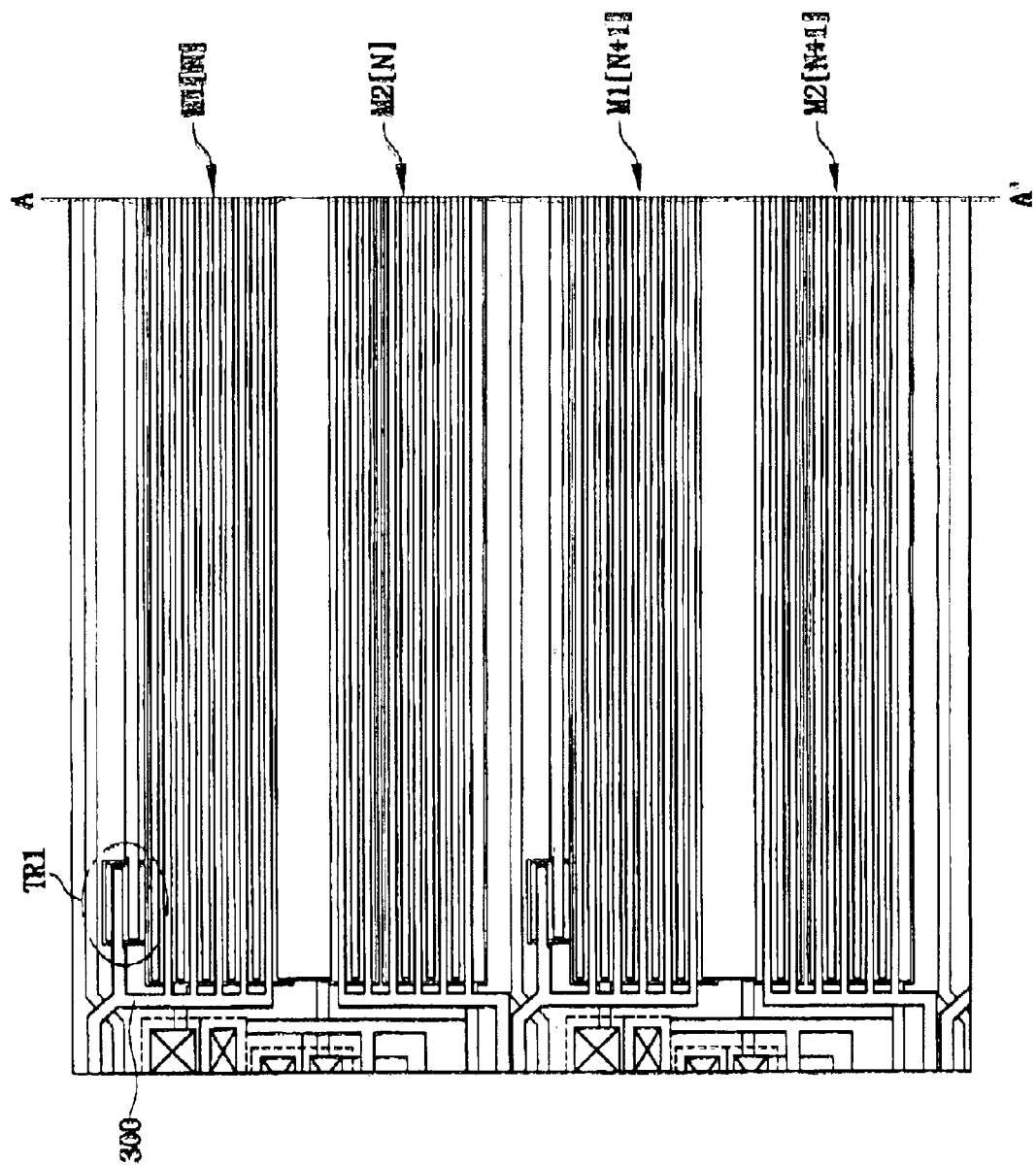
Figure 15C:
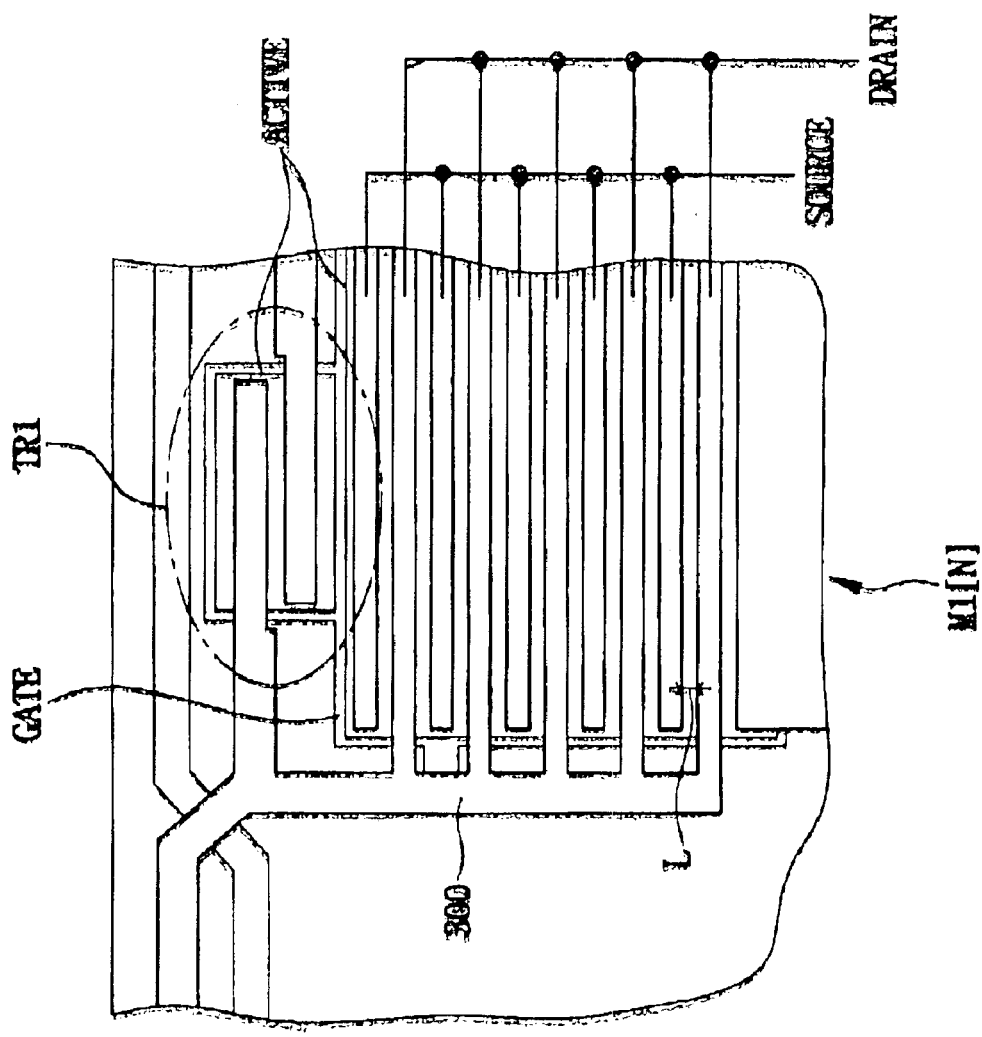
FIG. 15C is an enlarged view showing the carry buffer in the shift register of FIG. 15A.

FIGS. 15A and 15B are layouts showing a pull-up part, a pull-down part and a carry buffer in a stage of the shift register of FIG. 11, and FIG. 15C is an enlarged view showing the carry buffer in the shift register of FIG. 15A.

The pull-up NMOS transistor M1 and the pull-down NMOS transistor M2 of FIG. 12 has a transistor size larger than that of the pull-up driver NMOS transistors M3, M4, M5 and the pull-down driver NMOS transistor M6, M7 in order to drive the gate line connected to the pull-up transistor M1 and the pull-down transistor M2.

As shown in FIGS. 15A, 15B and 15C, a gate wiring and an active pattern is sequentially formed in a predetermined region on an insulation substrate, and a plurality of drain electrodes and a plurality of source electrodes are formed in a 'branch' type shape (or 'finger' type shape) on the gate wiring, so that pull-up transistors (M1[N] and M1[N+1]) and pull-down transistors (M2[N] and M2[N+1]) is formed. The gate wiring includes a gate electrode (or gate electrodes) and a gate line (or gate lines). M1[N] is a pull-up transistor M1 of the Nth stage, and M1[N+1] is a pull-up transistor M1 of the (N+1)th stage. M2[N] is a pull-down transistor M2 of the Nth stage, and M2[N+1] is a pull-down transistor M2 of the (N+1)th stage. In the 'branch' type shape of the present invention, the drain electrodes are branched from a main drain wiring and each of the drain electrodes is inserted into the branches of the drain electrodes. For example, the active pattern is composed of amorphous silicon. Hereinafter, the Nth stage is referred to as a present stage, and the (N+)th stage is referred to as a next stage.

Particularly, the gate wiring of the pull-up transistors (M1[N] and M1[N+1]) is formed in a first predetermined region by which a first predetermined area is defined. For example, the first predetermined region may have a rectangular shape. The active pattern of the pull-up transistors (M1[N] and M1[N+1]) is formed on the gate wiring of the pull-up transistors (M1[N] and M1[N+1]). The drain electrodes of the pull-up transistors (M1[N] and M1[N+1]) are branched from the main drain wiring 300 extended in a downward direction and are formed on the active pattern of the pull-up transistors (M1[N] and M1[N+1]). Each of the source electrodes of the pull-up transistors (M1[N] and M1[N+1]) is formed between the branches (or drain lines) of the drain electrodes. Namely, each of the branches (or source lines) of the source electrodes is formed between the branches (or drain lines) of the drain electrodes. The source electrode of the pull-up transistors (M1[N] and M1[N+1]) may be further formed at the exterior of the drain electrodes of the pull-up transistors (M1[N] and M1[N+1]). Each of the source electrodes of the pull-up transistors (M1[N] and M1[N+1]) is electrically connected to gate lines through contact holes (CNT1, CNT2). For example, the width of each of the drain lines may be about 5 $\mu$m, and the width of each of the gate lines may be about 5 $\mu$m. For example, the width of the main drain line may be greater than about 5 $\mu$m. The less the distance (L) between a drain line and a source line is, the better is the property of the thin film transistor (TFT). For example, the less the distance (L) between a drain line and a source line is, the larger is the transistor size (W/L).

Particularly, the gate wiring of the pull-down transistors (M2[N] and M2[N+1]) is formed in a second predetermined region by which a second predetermined area is defined. For example, the second predetermined region may have a rectangular shape. The active pattern of the pull-down transistors (M2[N] and M2[N+1]) is formed on the gate wiring of the pull-down transistors (M2[N] and M2[N+1]). The drain electrodes of the pull-down transistors (M2[N] and M2[N+1]) are branched from the main drain wiring 300 extended in a upward direction and are formed on the active pattern of the pull-down transistors (M2[N] and M2[N+1]). Each of the drain electrodes of the pull-down transistors (M2[N] and M2[N+1]) is electrically connected to the gate lines through contact holes (CNT1, CNT2). Each of the source electrodes of the pull-down transistors (M2[N] and M2[N+1]) is formed between the branches (or drain lines) of the drain electrodes. Namely, each of the branches (or source lines) of the source electrodes is formed between the branches (or drain lines) of the drain electrodes. The source electrode of the pull-up transistors (M2[N] and M2[N+1]) may be further formed at the exterior of the drain electrodes of the pull-up transistors (M2[N] and M2[N+1]).

Particularly, the plurality of source electrodes of the pull-up transistors (M1[N] and M1[N+1]) and the plurality of drain electrodes of the pull-down transistors (M2[N] and M2[N+1]) are commonly connected to the first contact hole CNT1 in order that the source electrodes of the pull-up transistors (M1[N] and M1[N+1]) and the plurality of drain electrodes of the pull-down transistors (M2[N] and M2[N+1]) may be commonly connected to gate lines. Since the height of the source electrodes of the pull-up transistors (M1[N] and M1[N+1]) or the height of the source electrodes of the pull-down transistors (M2[N] and M2[N+1]) is different from the height of gate lines, the source electrodes of the pull-up transistors (M1[N] and M1[N+1]) or the pull-down transistors (M2[N] and M2[N+1]) is connected to the gate lines by means of a bridge that is formed between a first indium tin oxide (ITO1) layer and a second contact hole CNT2. The first indium tin oxide (ITO1) layer comprises a conductive material. The first indium tin oxide (ITO1) layer is connected to a first contact hole CNT1.

The carry buffer transistor TR1 is formed at a position adjacent to the pull-up transistor M1 in order to supply the first clock ckv or the second clock ckvb applied to the drain electrode of the pull-up transistor M1 of the present stage to the gate electrode of the third transistor M3 of the next stage.

Particularly, the gate electrode of the carry buffer transistor TR1 is commonly connected to the gate electrode of the pull-up transistors (M1[N] and M1[N+1]). The drain electrode of the carry buffer transistor TR1 may be branched from the main drain wiring of the pull-up transistors (M1[N] and M1[N+1]). The source electrode of the carry buffer transistor TR1 detours (or bypasses) the pull-up transistors (M1[N] and M1[N+1]) and the pull-down transistors (M2[N] and M2[N+1]) to be extended to a gate electrode of the third transistor M3 of the next stage.

Since the height of the branches (or source line) of the source electrodes of the carry buffer transistor TR1 is different from the height of gate wiring connected to the gate electrode of the third transistor M3 of the next stage, the source electrode of the carry buffer transistor TR1 is connected to the gate wiring connected to the gate electrode of the third transistor M3 by means of a bridge that is formed between a second indium tin oxide (ITO2) layer and a fourth contact hole CNT4. The second indium tin oxide (ITO2) layer comprises a conductive material. The second indium tin oxide (ITO2) layer is connected to the source line of the carry buffer transistor TR1 through a third contact hole CNT3.

The shift register of FIGS. 7 and 8 is used in the liquid crystal display panel having a small or a medium screen size such as 525 (176×3)×192, but the shift register of FIGS. 7 and 8 may not be used in the liquid crystal display panel having a large screen size because of the signal delay problem.

The transistor size of the pull-up or the pull-down transistor (M1 or M2) needs to be increased in order that the shift register of FIGS. 7 and 8 may be used in the liquid crystal display panel having the large screen size. However, there is a limit in the increase of the transistor size of the pull-up or the pull-down transistor (M1 or M2) because of the limit of a chip area for the shift register.

Therefore, the reliability and the yield for manufacturing the liquid crystal display device may not be guaranteed because the threshold voltage of the thin film transistor varies due to the limit of the transistor size of the pull-up or the pull-down transistor (M1 or M2) and the property of the amorphous silicon thin film transistor.

Figure 16B:
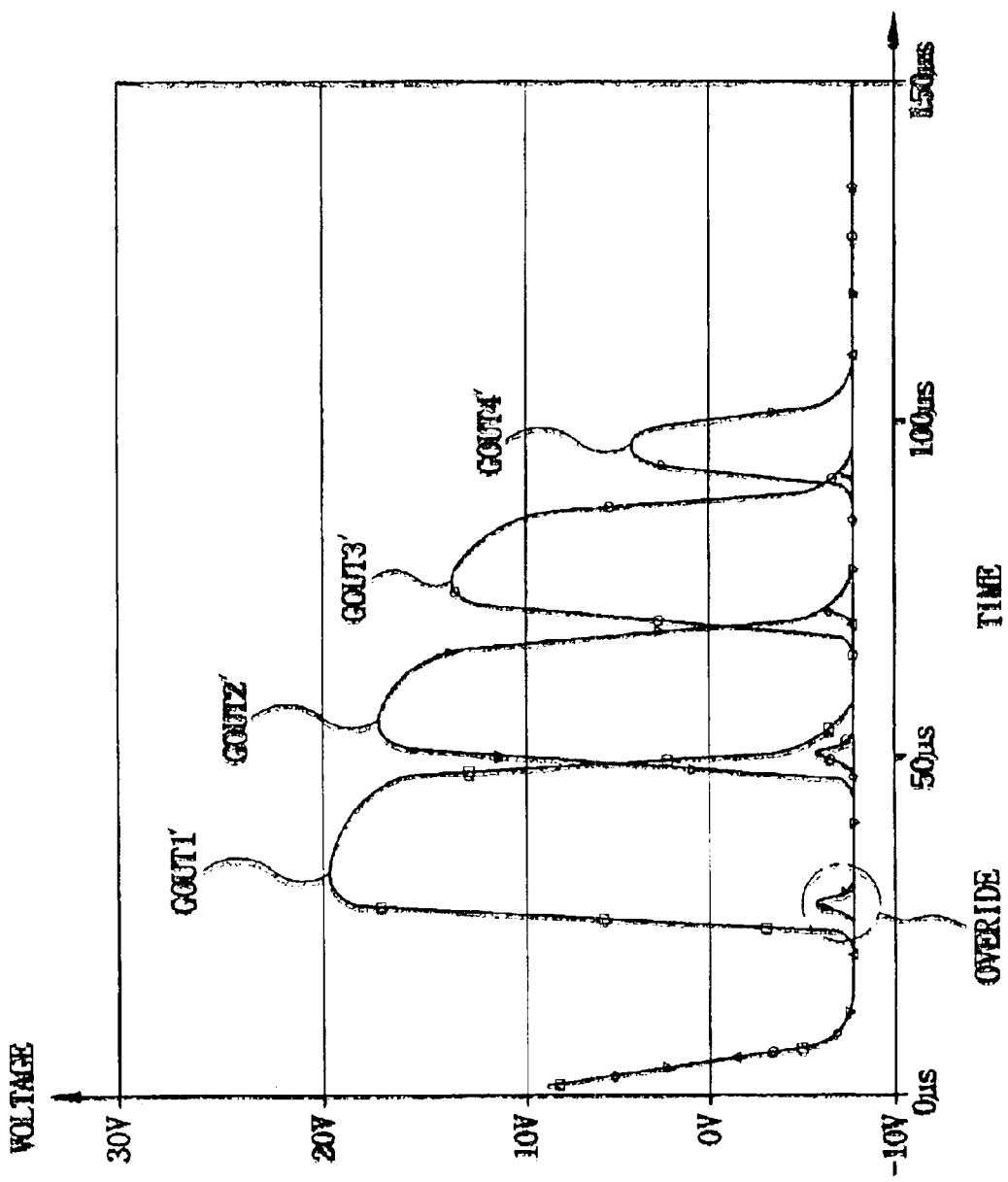
Figure 16C:
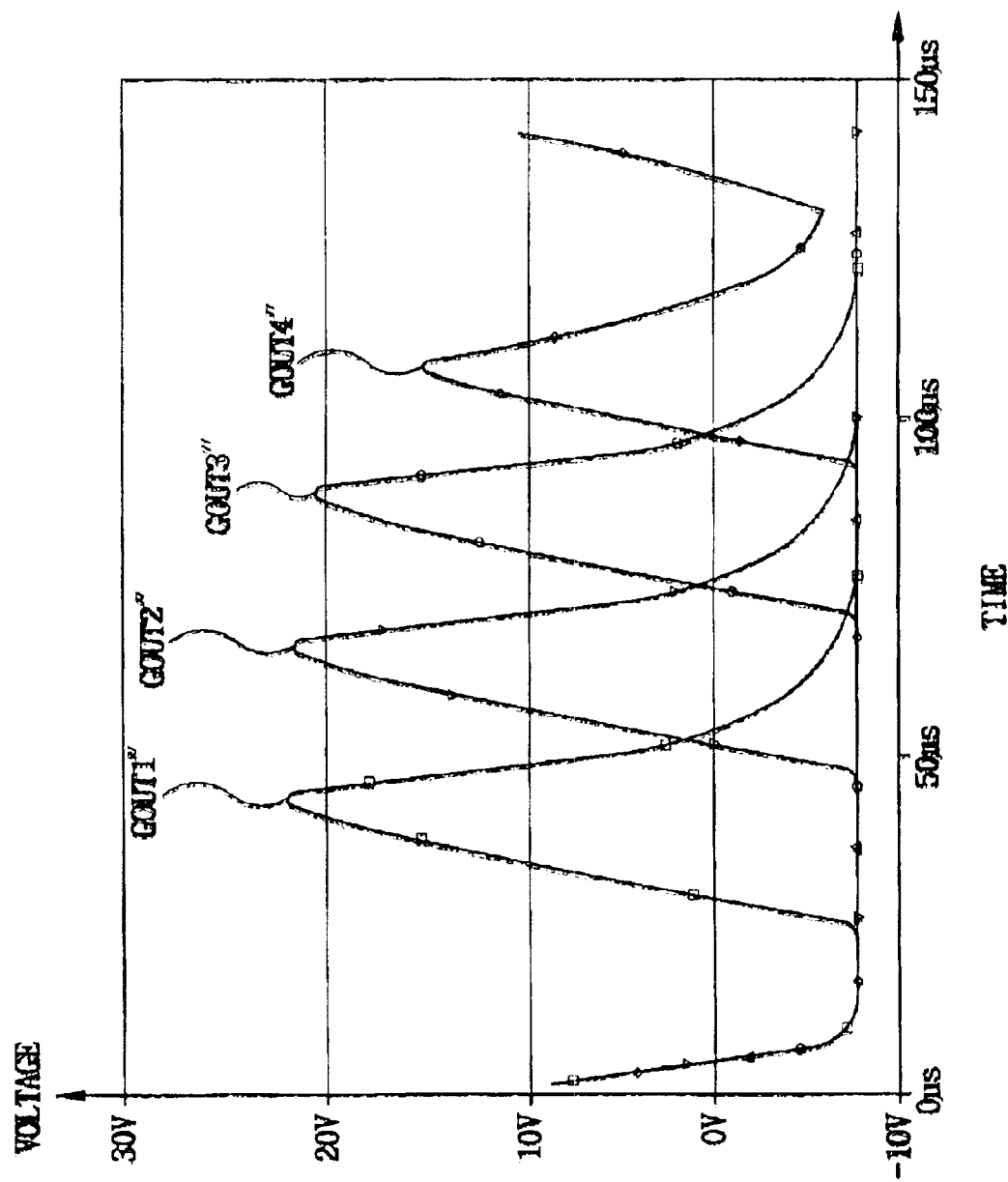

FIGS. 16A, 16B and 16C are graphs showing the gate line driving signal outputted from the shift register of FIG. 7.

Referring to FIG. 16A, when the thin film transistors of the shift register have normal threshold voltages in a room temperature, the gate line driving signals ($GOUT_1$, $GOUT_2$, $GOUT_3$, . . . ) are similar to a square wave and have a uniform peak voltage level of about 25 volts.

Referring to FIG. 16B, the threshold voltage of the thin film transistors of the shift register decreases according as the temperature increases, the gate line driving signals ($GOUT'_1$, $GOUT'_2$, $GOUT'_3$, . . . ) are similar to a square wave, but the gate line driving signals ($GOUT'_1$, $GOUT'_2$, $GOUT'_3$, . . . ) have a decreasing peak voltage level. Namely, the peak voltage level of the first gate line driving signal $GOUT'_1$ has about 20 volts, and the peak voltage level of the second gate line driving signal $GOUT'_2$ is lower than 20 volts.

As shown in FIG. 16B, an override signal of which waveform is like a spark is applied to specific gate lines. The gate line driving signals ($GOUT_1$, $GOUT_2$, $GOUT_3$, . . . ) have a decreasing peak voltage level due to the override signal, so that gate line driving signals having abnormal waveform are generated.

Referring to FIG. 16C, the threshold voltage of the thin film transistors of the shift register increases according as the temperature decreases, the gate line driving signals ($GOUT''_1$, $GOUT''_2$, $GOUT''_3$, . . . ) is not similar to a square wave, and the gate line driving signals ($GOUT''_1$, $GOUT''_2$, $GOUT''_3$, . . . ) have a decreasing peak voltage level. Namely, the peak voltage level of the first gate line driving signal $GOUT''_1$ has about 22 volts, and the peak voltage level of the second gate line driving signal $GOUT''_2$ is lower than 22 volts.

When the thin film transistors of the shift register have normal threshold voltages in a room temperature, the shift register operates normally, and the gate line driving signals outputted from the shift register are similar to a square wave and have a uniform peak voltage level.

However, when the threshold voltage of the thin film transistors of the shift register varies according as the temperature decreases (or increases), the gate line driving signals outputted from the shift register has an abnormal waveform, or a uniform peak voltage level. Therefore, the gate line driving signals having an abnormal waveform does not normally turn on the switching devices (switching elements) disposed on the liquid crystal display panel, and the display quality of the liquid crystal display device is deteriorated.

As shown in FIG. 6, the shift register has a circuit structure in which the gate line driving signal outputted from the previous stage affects the gate line driving signal outputted from the present stage, certain stages may not output a gate line driving signal when the threshold voltage of the thin film transistors of the shift register varies and each of the stages are driven sequentially by the shift register, especially in the liquid crystal display device having a large display screen size.

Figure 17:
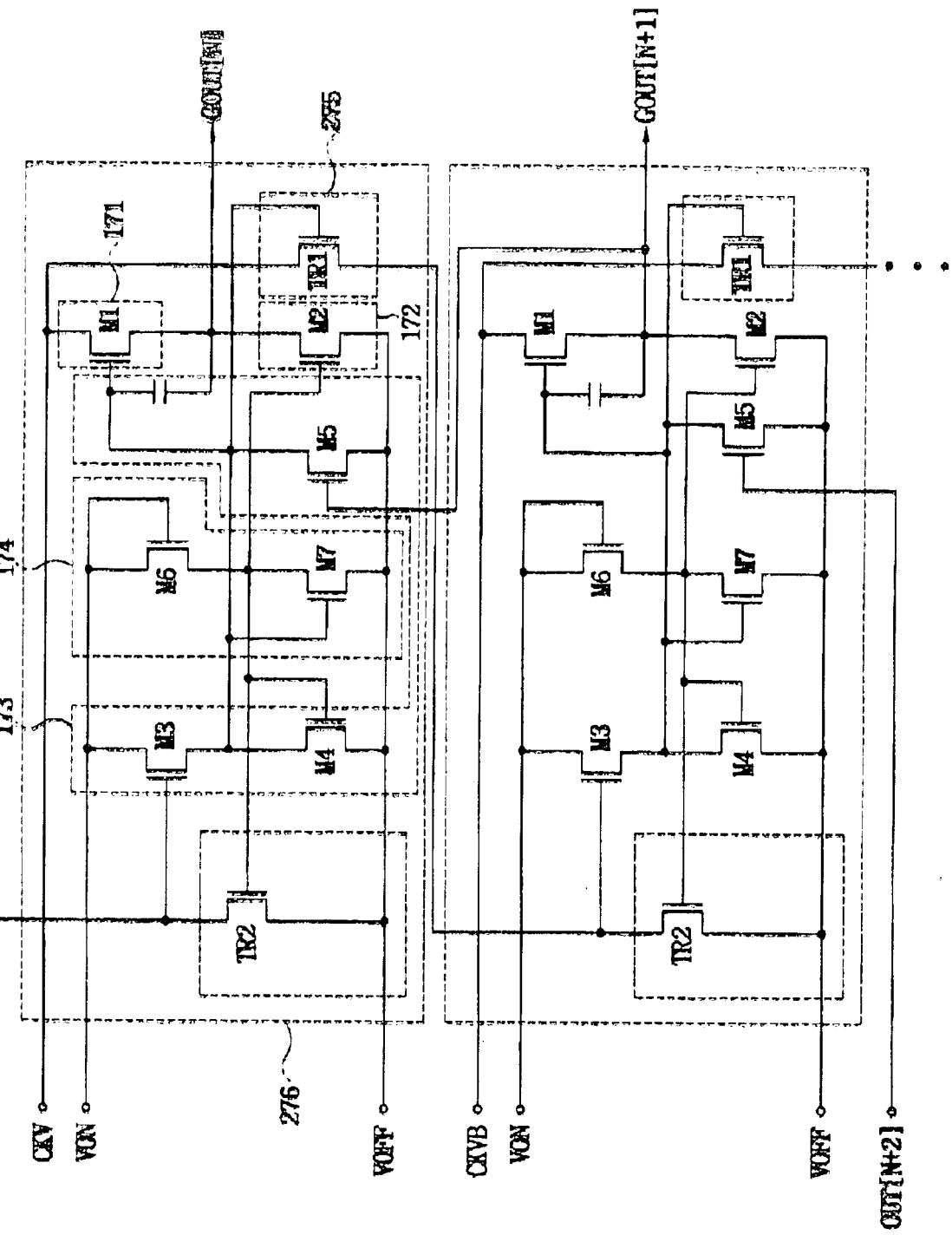
FIG. 17 is a block diagram showing a shift register used in a gate driver circuit according to a second exemplary embodiment of the present invention.

FIG. 17 is a block diagram showing a shift register used in a gate driver circuit according to a second exemplary embodiment of the present invention.

Referring to FIG. 17, each of the stages of the shift resister includes a pull-up part 171, a pull-down part 172, a pull-up driver part 173, a pull-down driver part 174, a first carry buffer 275 and a second carry buffer 276. In FIG. 17, the same reference numerals denote the same elements in FIG. 7, and thus the detailed descriptions of the same elements will be omitted.

The first carry buffer 275 includes a first carry buffer transistor TR1 and outputs the first clock ckv or the second clock ckvb to the next stage.

Particularly, a gate of the first carry buffer transistor TR1 is connected to an input terminal of the pull-down driver part 174, a drain of the first carry buffer transistor TR1 is connected to a clock terminal CKV or CKVB, and a source of the carry buffer transistor TR1 is connected to the second carry buffer 276 of the next stage.

The second carry buffer 276 includes a second carry buffer transistor TR2 that is controlled by the pull-down driver part 174, or an inverter. Particularly, the buffer transistor M3 is turned on by the first clock ckv or the second clock ckvb that is supplied from the first carry buffer 275 to be applied to the pull-up part 171, then the output voltage of the pull-down driver part 174 (or the inverter) has a low voltage level, and the second carry buffer 276 is turned off. Therefore, the voltage level of the carry signal may not be lowered when the carry signal is transferred to the second carry buffer transistor TR2.

A drain of the second carry buffer transistor TR2 is connected to an input terminal of the pull-up driver part 173 of the present stage and is also connected to the source of the first carry buffer transistor TR1. A gate of the second carry buffer transistor TR2 is connected to a gate of the second transistor M2, or the pull-down part 172, and a source of the second carry buffer transistor TR2 receives the first power voltage through the first power voltage terminal VOFF.

In addition, after a 1 H period, the second carry buffer transistor TR2 maintains a turn-on state while the pull-down driver part 174 is turned on, and applies the first power voltage Voff to the buffer transistor M3 so as to turn off the buffer transistor M3. The first power voltage terminal VOFF is the same as the power voltage terminal VSS of FIG. 5.

Since the clock signals instead of the gate line driving signal outputted from the previous stage are used as the carry signal, the gate line driving signal outputted from each of the stages are independent of the gate line driving signal of the previous stage.

Hereinafter, an upper stage of FIG. 17 is referred to as a previous stage $SRC_N$, a lower stage of FIG. 17 is referred to as a present stage $SRC_{N+1}$ in order to describe the operation of the shift register of the present invention.

The carry buffer transistor TR1 of the previous stage $SRC_N$ receives the first clock ckv or the second clock ckvb and transfers the first clock ckv or the second clock ckvb to the present stage $SRC_{N+1}$ as a carry signal. Since the clock signals having substantially a uniform voltage level is used as the carry signal, the RC delay due to the RC load of the gate lines may not occur.

The third transistor M3 remains in a turn-off state before the carry signal CA[N] is applied to a gate of the third transistor M3. When the carry signal CA[N] is applied to the gate of the third transistor M3, after a predetermined period, the third transistor M3 is turned on to form a current path through which the second power voltage Von is charged at the capacitor C.

When the capacitor C of the pull-up driver part 173 of the present stage is charged, the second carry buffer transistor TR2 is turned off. When the present stage has an idle state, the power voltage Voff applied to the second carry buffer transistor TR2 is applied to the gate of the buffer transistor M3 and maintain the turn-off states of the buffer transistor M3.

Particularly, the third transistor M3 of the pull-up driver part 173 of the present stage maintains a turn-off state and is changed to an idle state when the carry signal is applied to the third transistor M3 through the first carry buffer transistor TR1 of the previous stage. Therefore, the gate of the third transistor M3 has a voltage level corresponding to a divided voltage formed by the resistance of the first carry buffer transistor TR1 and the resistance of the second transistor M2.

When the second carry buffer transistor TR2 is turned off and the carry signal such as the clock signal is applied to the gate of the buffer transistor M3, the buffer transistor M3 is turned on, and the voltage Von is applied to the capacitor C.

Figure 18:
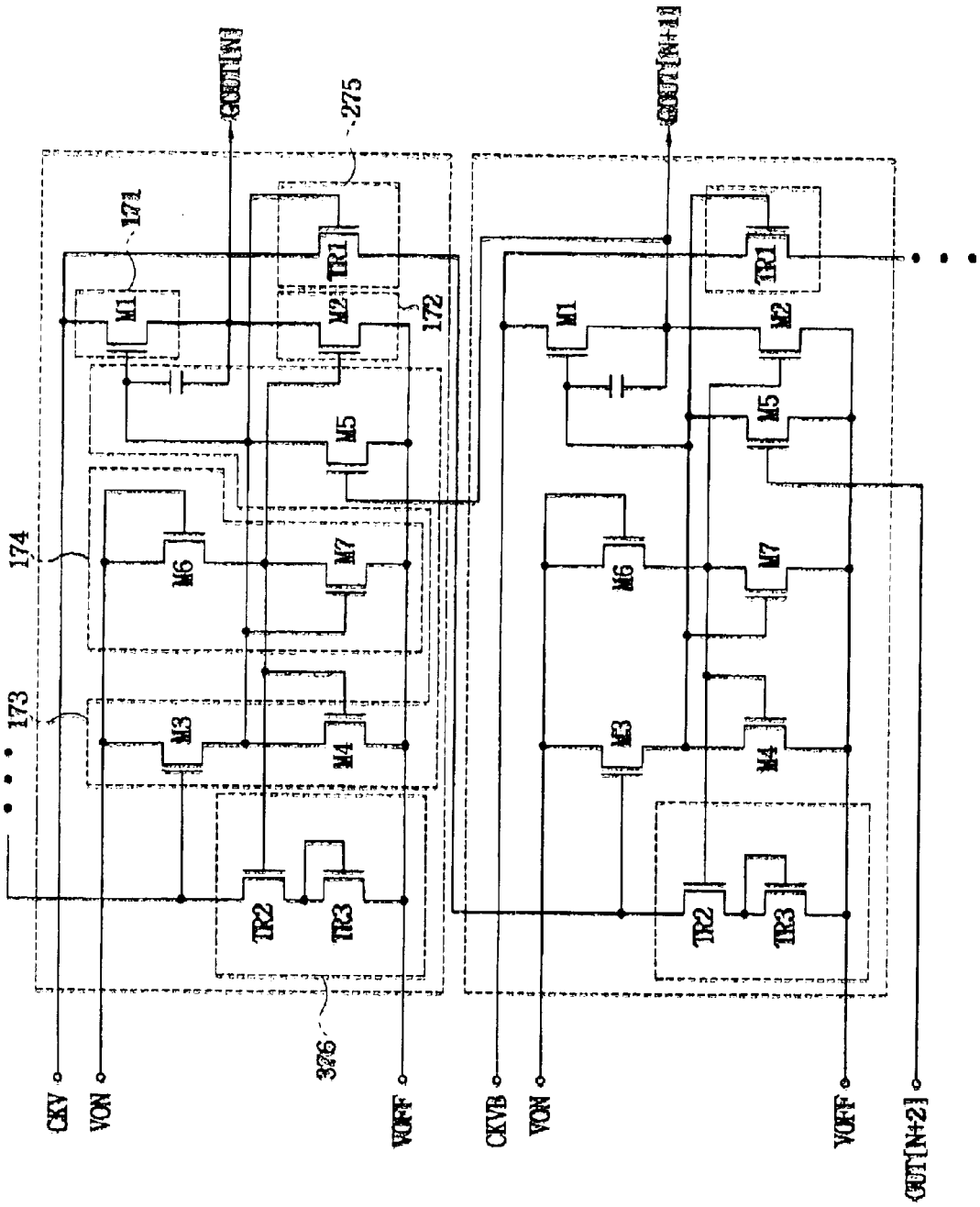
FIG. 18 is a block diagram showing a shift register used in a gate driver circuit according to a third exemplary embodiment of the present invention.

FIG. 18 is a block diagram showing a shift register used in a gate driver circuit according to a third exemplary embodiment of the present invention.

Referring to FIG. 18, each of the stages of the shift resister includes a pull-up part 171, a pull-down part 172, a pull-up driver part 173, a pull-down driver part 174, a first carry buffer 275 and a second carry buffer 376. In FIG. 18, the same reference numerals denote the same elements in FIG. 7, and thus the detailed descriptions of the same elements will be omitted.

The first carry buffer 275 includes a first carry buffer transistor TR1 and outputs the first clock ckv or the second clock ckvb to the next stage.

Particularly, a gate of the first carry buffer transistor TR1 is connected to an input terminal of the pull-down driver part 174, a drain of the first carry buffer transistor TR1 is connected to a clock terminal CKV or CKVB, and a source of the carry buffer transistor TR1 is connected to the second carry buffer 376 of the next stage.

The second carry buffer 376 includes second and third carry buffer transistors TR2 and TR3. Particularly, the second carry buffer 376 is turned off when the output of the pull-down driver part 174 (or an inverter) has a low voltage level. Therefore, the voltage level of the carry signal may not be lowered when the carry signal is transferred to the second carry buffer 376. In addition, after a 1 H period, the second carry buffer 376 maintains a turn-on state while the pull-down driver part 174 is turned on so as to turn off the buffer transistor M3.

A drain of the second carry buffer transistor TR2 is connected to an input terminal of the pull-up driver part 173 of the present stage and is also connected to the source of the first carry buffer transistor TR1 of the previous stage. A gate of the second carry buffer transistor TR2 is connected to a gate of the second transistor M2, or the pull-down part 172, and a source of the second carry buffer transistor TR2 is connected to the drain of the third carry buffer transistor TR3. The first power voltage terminal VOFF is the same as the power voltage terminal VSS of FIG. 5.

Hereinafter, an upper stage of FIG. 18 is referred to as a previous stage $SRC_N$, and lower stage of FIG. 18 is referred to as a present stage $SRC_{N+1}$ in order to describe the operation of the shift register of the present invention.

The carry buffer transistor TR1 of the previous stage $SRC_N$ receives the first clock ckv and transfers the first clock ckv to the present stage $SRC_{N+1}$ as a carry signal. Since the clock signal has substantially a uniform voltage level, the RC delay due to the RC load of the gate lines may not occur.

When the capacitor C of the pull-up driver part 173 of the present stage is charged, the second carry buffer transistor TR2 is turned off. When the present stage has an idle state, the voltage (Voff+Vth) of the third carry buffer transistor TR3 is applied to the gate of the buffer transistor M3 and maintain the turn-off state of the buffer transistor M3.

Particularly, the third transistor M3 of the pull-up driver part 173 of the present stage maintains a turn-off state and is changed to an idle state when the carry signal is applied to the third transistor M3 through the first carry buffer transistor TR1 of the previous stage. Therefore, the gate of the third transistor M3 has a voltage level corresponding to a divided voltage formed by the resistance of the first carry buffer transistor TR1, the resistance of the second carry buffer transistor TR2 and the threshold voltage of the third carry buffer transistor TR3.

When the second carry buffer transistor TR2 is turned off and the carry signal is applied to the gate of the buffer transistor M3, the buffer transistor M3 is turned on, and the voltage Von is applied to the capacitor C.

When a clock having a low voltage level such as the voltage level Voff is applied to the gate of the buffer transistor M3, the buffer transistor is turned off. The point of time for the turn-on or the turn-off of the buffer transistor M3 depends on the voltage level of the voltage applied to the gate of the buffer transistor M3.

The point of time for the turn-on or turn-off of the buffer transistor M3 is inversely proportional to the threshold voltage of the buffer transistor M3. When the threshold voltage of the buffer transistor M3 decreases due to the increase of peripheral temperature, the point of time for the turn-on or turn-off of the buffer transistor M3 becomes earlier compared with the case where the buffer transistor M3 has a normal threshold voltage. When the threshold voltage of the buffer transistor M3 increases due to the decrease of peripheral temperature, the point of time for the turn-on or turn-off of the buffer transistor M3 is delayed. Therefore, the electric charges charged at the capacitor C varies according to the variation of the peripheral temperature, and the gate line driving signal varies according to the voltage due to the electric charges charged at the capacitor C.

The generation of an override signal may be prevented. The override signal is generated when the threshold voltage becomes lower and the second carry buffer transistor TR2 is not completely turned off. The override signal may turn on the discharge transistor M5 of the previous stage and lowers the output voltage of the pull-up transistor M1 of the previous stage, so that the gate line driving signal outputted from the previous stage may be lowered.

According to the third exemplary embodiment of the present invention, the gate of the buffer transistor M3 has a voltage level corresponding to a divided voltage formed by the resistance of the second and third carry buffer transistor TR1, the threshold of the buffer transistor M3 and the resistance of the first carry buffer transistor TR1. Even though the threshold voltage of the buffer transistor M3 varies according to the variation of the peripheral temperature, the threshold voltage of the third carry buffer transistor TR3 varies also according to the variation of the peripheral temperature, the voltage level of the carry signal depends on the peripheral temperature, and the carry signal is applied to the gate of the buffer transistor M3, to thereby cancel the effect due to the variation of the threshold voltage. The variation of the voltage level of the gate line driving signal may be prevented.

Figure 19A:
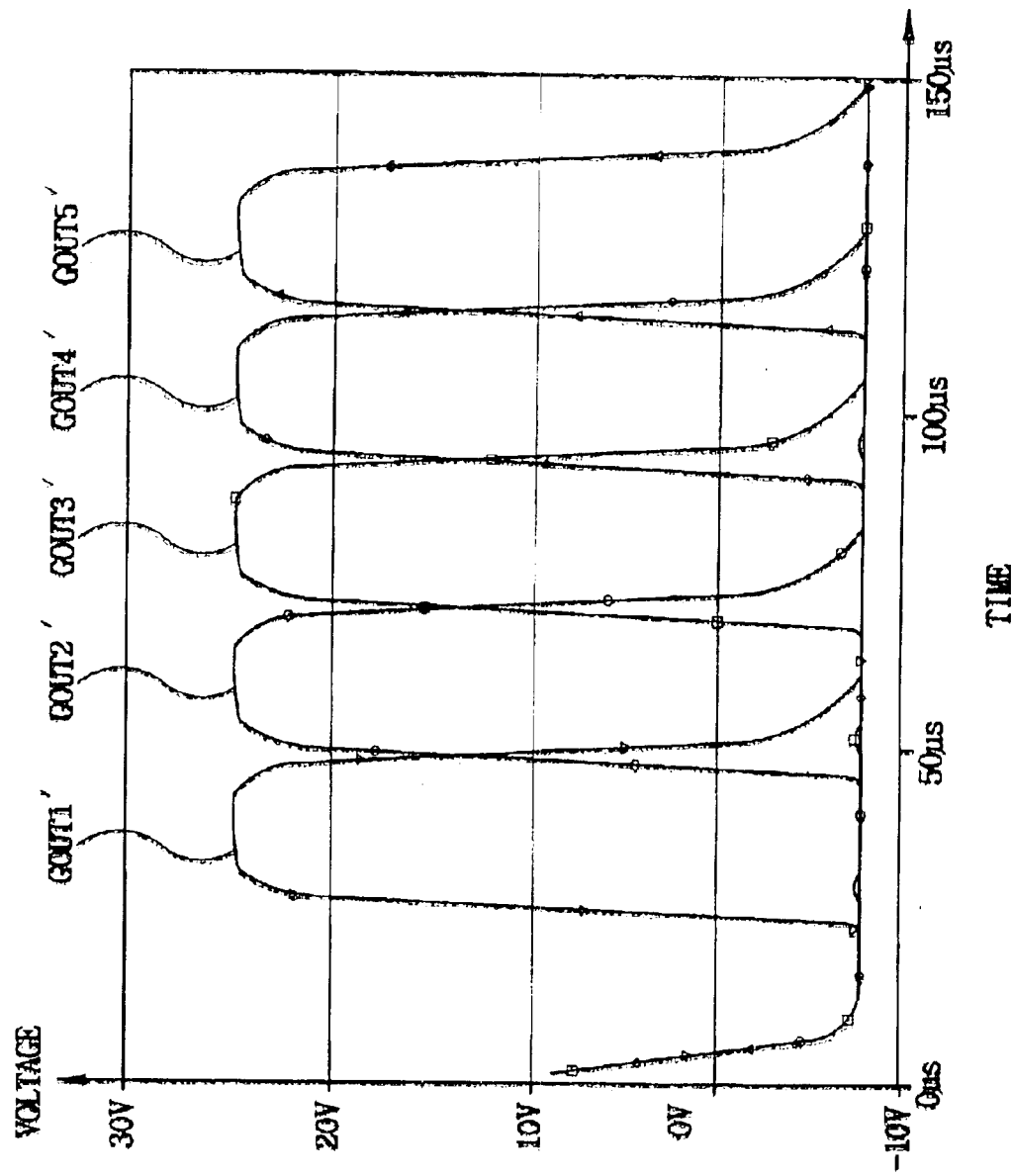
FIGS. 19A and 19B are graphs showing the output of the shift register of FIG. 18.
Figure 19B:
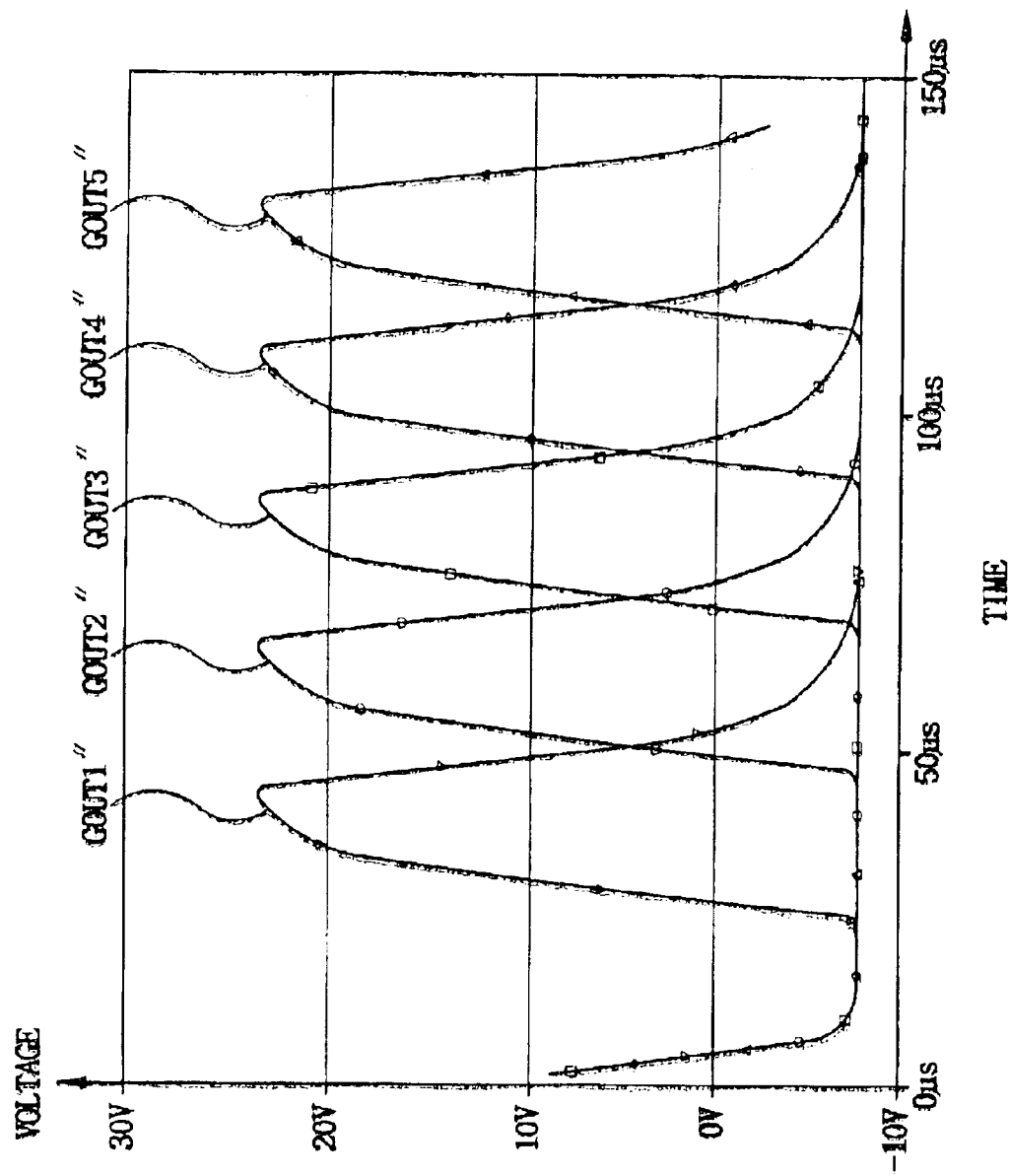

FIGS. 19A and 19B are graphs showing the output of the shift register of FIG. 18.

As shown in FIG. 16A, when the thin film transistors of the shift register have normal threshold voltages in a room temperature, the gate line driving signals (GOUT$_1$, GOUT$_2$, GOUT$_3$, . . . ) are similar to a square wave.

Referring to FIG. 19A, the threshold voltage of the thin film transistors of the shift register decreases according as the temperature increases, the gate line driving signals (GOUT'$_1$, GOUT'$_2$, GOUT'$_3$, . . . ) are similar to a square wave, and the gate line driving signals (GOUT'$_1$, GOUT'$_2$, GOUT'$_3$, . . . ) have about 25 volts. The voltage level of the override signal shown in FIG. 19A is much less than that of the override signal shown in FIG. 16B. Normal gate line driving signals are outputted.

Referring to FIG. 19B, the threshold voltage of the thin film transistors of the shift register increases according as the temperature decreases, the gate line driving signals (GOUT"$_1$, GOUT"$_2$, GOUT"$_3$, . . . ) are similar to a square wave, the gate line driving signals (GOUT"$_1$, GOUT"$_2$, GOUT"$_3$, . . . ) have a uniform voltage level of about 25 volts. The gate line driving signals (GOUT"$_1$, GOUT"$_2$, GOUT"$_3$, . . . ) of FIG. 19B is more similar to the square wave, and the voltage level of the gate line driving signals (GOUT"$_1$, GOUT"$_2$, GOUT"$_3$, . . . ) is more uniform than that of the gate line driving signals (GOUT"$_1$, GOUT"$_2$, GOUT"$_3$, . . . ) of FIG. 16C.

As shown in FIGS. 19A and 19B, since the shift register includes carry buffers in each of the stages, the shift register may output normal gate line driving signals even when the threshold voltage of the thin film transistor varies due to the variation of the peripheral temperature.

According to the third exemplary embodiment of the present invention, since each of the stages includes first, second and third carry buffer transistors TR1, TR2 and TR3, the present stage receives the first clock ckv or the second clock ckvb having a uniform voltage level as a carry signal, and the gate line driving signal outputted from the present stage may be independent of the gate line driving signal outputted from the previous stage. The carry signal compensates the variation of the threshold voltage. Therefore, the shift register is independent of the variation of the threshold voltage of the thin film transistors, and the reliability, productivity and the yield for manufacturing the liquid crystal display device having a large screen size and a large resolution may be enhanced.

Figure 20:
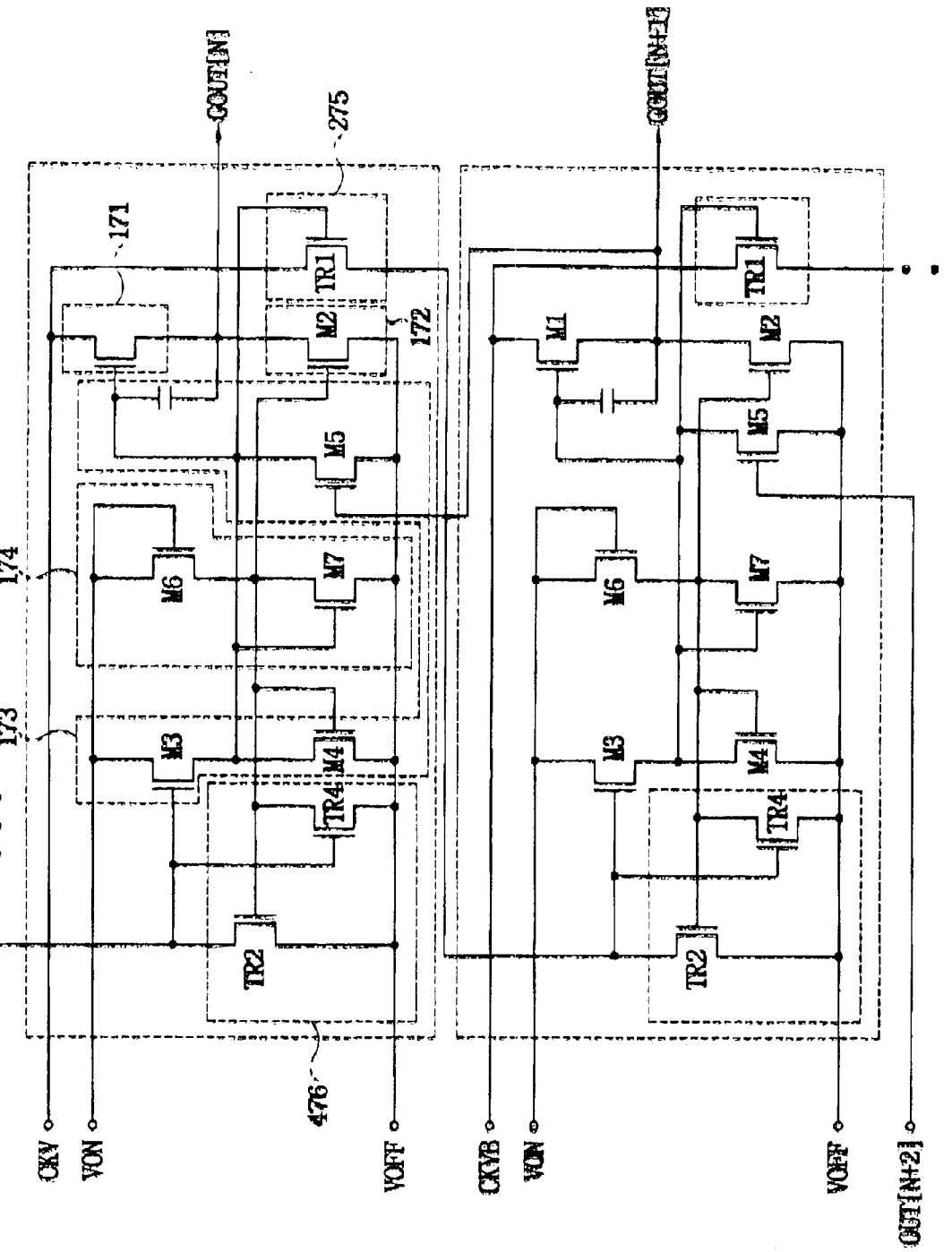
FIG. 20 is a block diagram showing a shift register used in a gate driver circuit according to a fourth exemplary embodiment of the present invention.

FIG. 20 is a block diagram showing a shift register used in a gate driver circuit according to a fourth exemplary embodiment of the present invention.

Referring to FIG. 20, each of the stages of the shift resister includes a pull-up part 171, a pull-down part 172, a pull-up driver part 173, a pull-down driver part 174, a first carry buffer 275 and a second carry buffer 476. In FIG. 20, the same reference numerals denote the same elements in FIG. 7, and thus the detailed descriptions of the same elements will be omitted.

The second carry buffer 476 includes second and fourth carry buffer transistors TR2 and TR4. Particularly, the second carry buffer 476 is turned off when the output of the pull-down driver part 174 (or an inverter) has a low voltage level. Therefore, the voltage level of the carry signal may not be lowered when the carry signal is transferred to the second carry buffer 476. In addition, after a 1 H period, the second carry buffer 476 maintains a turn-on state while the pull-down driver part 174 is turned on so as to turn off the buffer transistor M3.

A drain of the second carry buffer transistor TR2 is connected to an input terminal of the pull-up driver part 173 of the present stage and is also connected to the source of the first carry buffer transistor TR1 of the previous stage. A gate of the second carry buffer transistor TR2 is connected to the gate of the second transistor M2, or the pull-down part 172, and a source of the second carry buffer transistor TR2 receives the first power voltage Voff through the first power voltage terminal VOFF. The first power voltage terminal VOFF is the same as the power voltage terminal VSS of FIG. 5.

A drain of the fourth carry buffer transistor TR4 is connected to the gate of the second carry buffer transistor TR2, a gate of the fourth carry buffer transistor TR4 is connected to the drain of the second carry buffer transistor TR2, and a source of the fourth carry buffer transistor TR4 receives the first power voltage Voff through the first power voltage terminal VOFF.

Hereinafter, an upper stage of FIG. 20 is referred to as a previous stage SRC$_N$, and lower stage of FIG. 20 is referred to as a present stage SRC$_{N+1}$ in order to describe the operation of the shift register according to the fourth exemplary embodiment of the present invention.

The carry buffer transistor TR1 of the previous stage SRC$_N$ receives the first clock ckv and transfers the first clock ckv to the present stage SRC$_{N+1}$ as a carry signal. Since the clock signal has substantially a uniform voltage level, the RC delay due to the RC load of the gate lines may not occur.

When the capacitor C of the pull-up driver part 173 of the present stage is electrically charged, the second carry buffer transistor TR2 is turned off. When the present stage is in an idle state, the voltage (Voff) of the second carry buffer transistor TR2 is applied to the gate of the buffer transistor M3 and maintains the turn-off state of the buffer transistor M3.

Particularly, the third transistor M3 of the pull-up driver part 173 of the present stage maintains a turn-off state. When the carry signal is applied to the third transistor M3 through the first carry buffer transistor TR1 of the previous stage, the gate of the third transistor M3 has a voltage level corresponding to a divided voltage formed by the resistance of the first carry buffer transistor TR1 and the resistance of the second carry buffer transistor TR2.

When the second carry buffer transistor TR2 is turned off, and the carry signal is applied to the gate of the buffer transistor M3, the buffer transistor M3 is turned on, and a current path is formed between the buffer transistor M3 and the capacitor C so that the voltage Von is applied to the capacitor C.

When a clock having a low voltage level such as the voltage level Voff is applied to the gate of the buffer transistor M3, the buffer transistor M3 is turned off.

When the carry signal generated from the previous stage is applied to the gate of the fourth carry buffer transistor TR4, the fourth carry buffer transistor TR4 is turned on, to thereby rapidly lower the voltage level of the gate of the second carry buffer transistor TR2. Namely, the fourth carry buffer transistor TR4 increases the switching speed of the second carry buffer transistor TR2. Therefore, the operation speed of the carry buffer may be increased.

Figure 21:
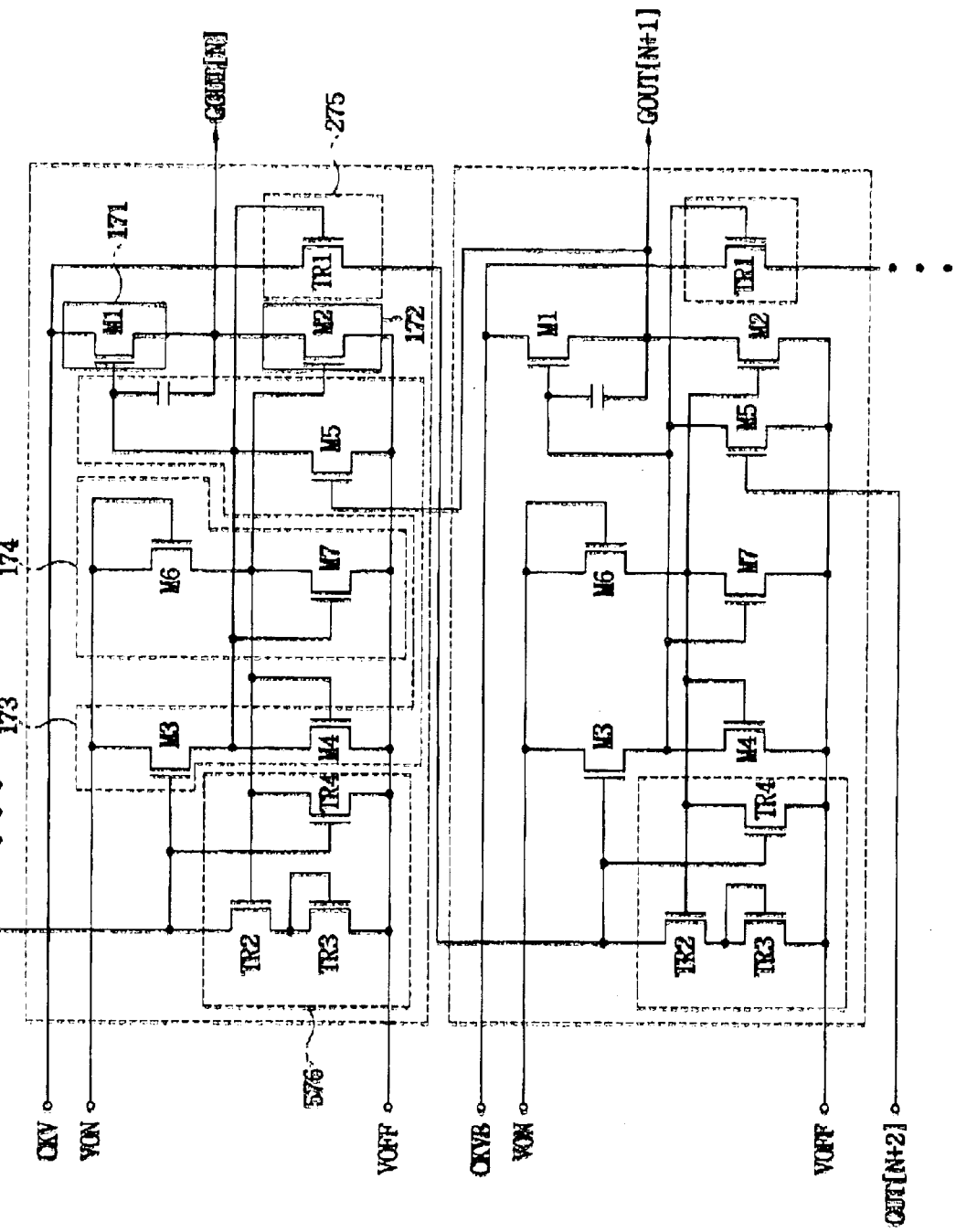
FIG. 21 is a block diagram showing a shift register used in a gate driver circuit according to a fifth exemplary embodiment of the present invention.

FIG. 21 is a block diagram showing a shift register used in a gate driver circuit according to a fifth exemplary embodiment of the present invention.

Referring to FIG. 21, each of the stages of the shift resister includes a pull-up part 171, a pull-down part 172, a pull-up driver part 173, a pull-down driver part 174, a first carry buffer 275 and a second carry buffer 576. In FIG. 21, the same reference numerals denote the same elements in FIG. 7, and thus the detailed descriptions of the same elements will be omitted.

The first carry buffer 275 includes a first carry buffer transistor TR1 and outputs the first clock ckv or the second clock ckvb to the next stage. Particularly, a gate of the first carry buffer transistor TR1 is connected to an input terminal of the pull-down driver part 174, a drain of the first carry buffer transistor TR1 is connected to a clock terminal CKV or CKVB, and a source of the carry buffer transistor TR1 is connected to the second carry buffer 576 of the next stage.

The second carry buffer 576 includes second, third and fourth carry buffer transistors TR2, TR3 and TR4. Particularly, the second carry buffer 576 is turned off when the output of the pull-down driver part 174 (or an inverter) has a low voltage level. Therefore, the voltage level of the carry signal may not be lowered when the carry signal is transferred to the second carry buffer 576. In addition, after a 1 H period, the second carry buffer 576 maintains a turn-on state while the pull-down driver part 174 is turned on so as to turn off the buffer transistor M3.

A drain of the second carry buffer transistor TR2 is connected to an input terminal of the pull-up driver part 173 of the present stage and is also connected to the source of the first carry buffer transistor TR1 of the previous stage. A gate of the second carry buffer transistor TR2 is connected to a gate of the second transistor M2, or the pull-down part 172, and a source of the second carry buffer transistor TR2 is connected to the drain of the third carry buffer transistor TR3.

The drain and a gate of the third carry buffer transistor TR3 are commonly connected with each other and are connected to the source of the second carry buffer transistor TR2, and the source of the third carry buffer transistor TR3. A source of the third carry buffer transistor TR3 receives the first power voltage Voff through the first power voltage terminal VOFF. The first power voltage terminal VOFF is the same as the power voltage terminal VSS of FIG. 5.

A drain of the fourth carry buffer transistor TR4 is connected to the gate of the second carry buffer transistor TR2, a gate of the fourth carry buffer transistor TR4 is connected to the drain of the second carry buffer transistor TR2, and a source of the fourth carry buffer transistor TR4 receives the first power voltage Voff through the first power voltage terminal VOFF.

When the carry signal generated from the previous stage is applied to the gate of the fourth carry buffer transistor TR4, the fourth carry buffer transistor TR4 is turned on, to thereby rapidly lower the voltage level of the gate of the second carry buffer transistor TR2. Namely, the fourth carry buffer transistor TR4 increases the switching speed of the second carry buffer transistor TR2. Therefore, the operation speed of the carry buffer may be increased.

According to the fifth exemplary embodiment of the present invention, since the carry buffer further includes the fourth carry buffer transistor TR4 for controlling the turn-on or turn-off of the second carry buffer transistor TR2, the switching speed of the second carry buffer transistor TR2 may be increase.

Figure 22:
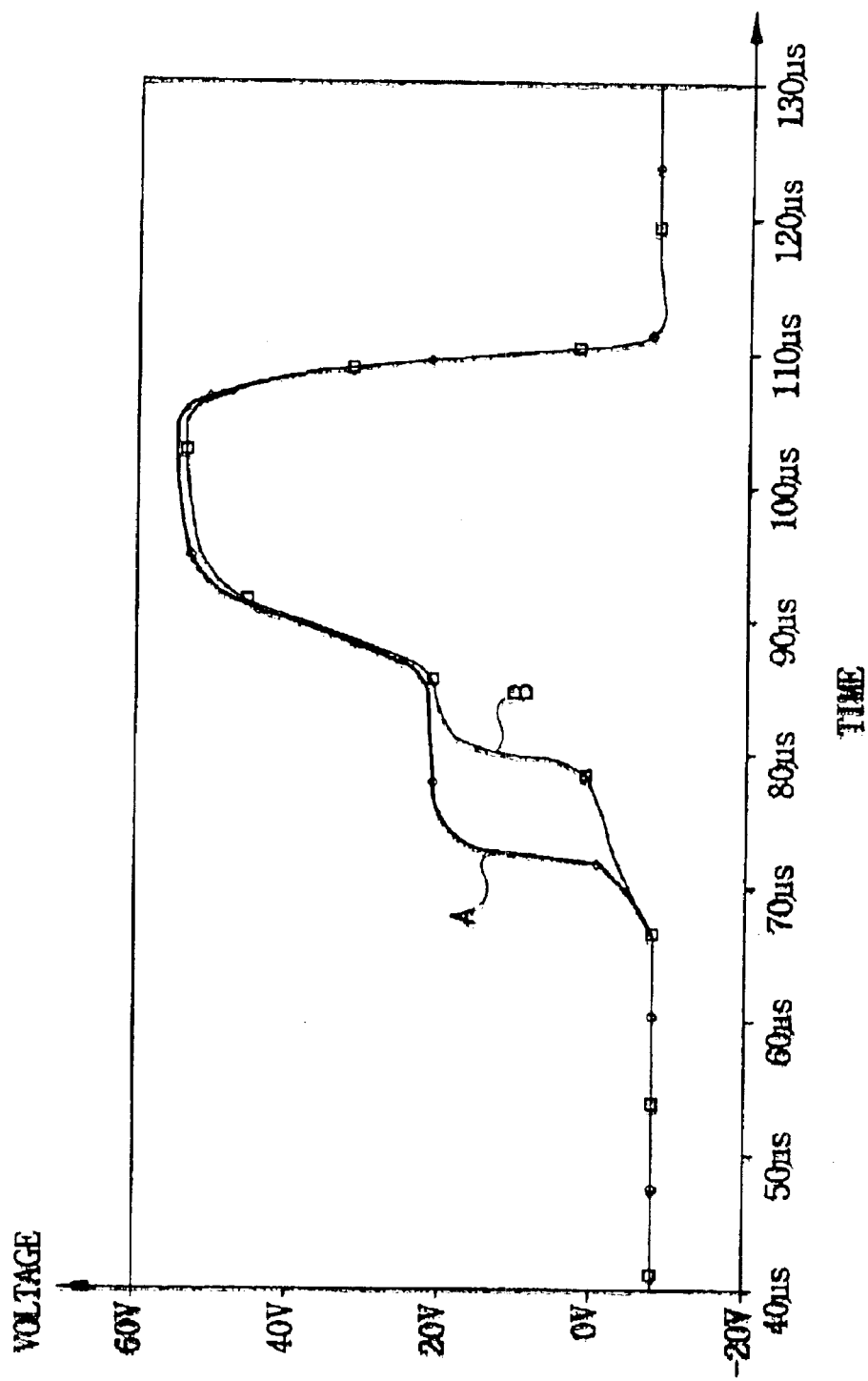
FIG. 22 is a graph showing the voltage measured at the capacitor of FIG. 21.

FIG. 22 is a graph showing the voltage measured at the capacitor of FIG. 21. Especially, a portion 'A' represents the voltage measured at the capacitor when the carry buffer have the fourth carry buffer transistor TR4, and a portion 'B' represents the voltage measured at the capacitor when the carry buffer does not have the fourth carry buffer transistor TR4.

As shown in FIG. 22, when the fourth carry buffer transistor TR4 is added to the carry buffer, the turn-off time of the second carry buffer transistor TR2 may be reduced, the turn-on or turn-off time of the third transistor M3 may be reduced, so that the voltage measured at the capacitor may be increased. Therefore, the carry buffer that has the fourth carry buffer transistor TR4 may be used in the liquid crystal display device having a large display screen size and a high resolution, the turn-on or turn-off of the third transistor M3 may be controlled by a maximum voltage, and the performance of the shift register may be increased.

As described above embodiments of the present invention, instead of an output signal (or a gate line driving signal) outputted from an output terminal OUT of a previous stage, a carry buffer for generating the carry signal independent of the output signal of the previous stage is disposed in each of the stages, to thereby prevent an abnormal operation of the shift register due to the variation of the threshold voltage of the thin film transistors. In addition, the reliability of the shift register may be enhanced throughout a wide range of peripheral temperature, and the yield for manufacturing the shift register may be increased because the tolerance of the variation of the threshold voltage may be increased.

Figure 23:
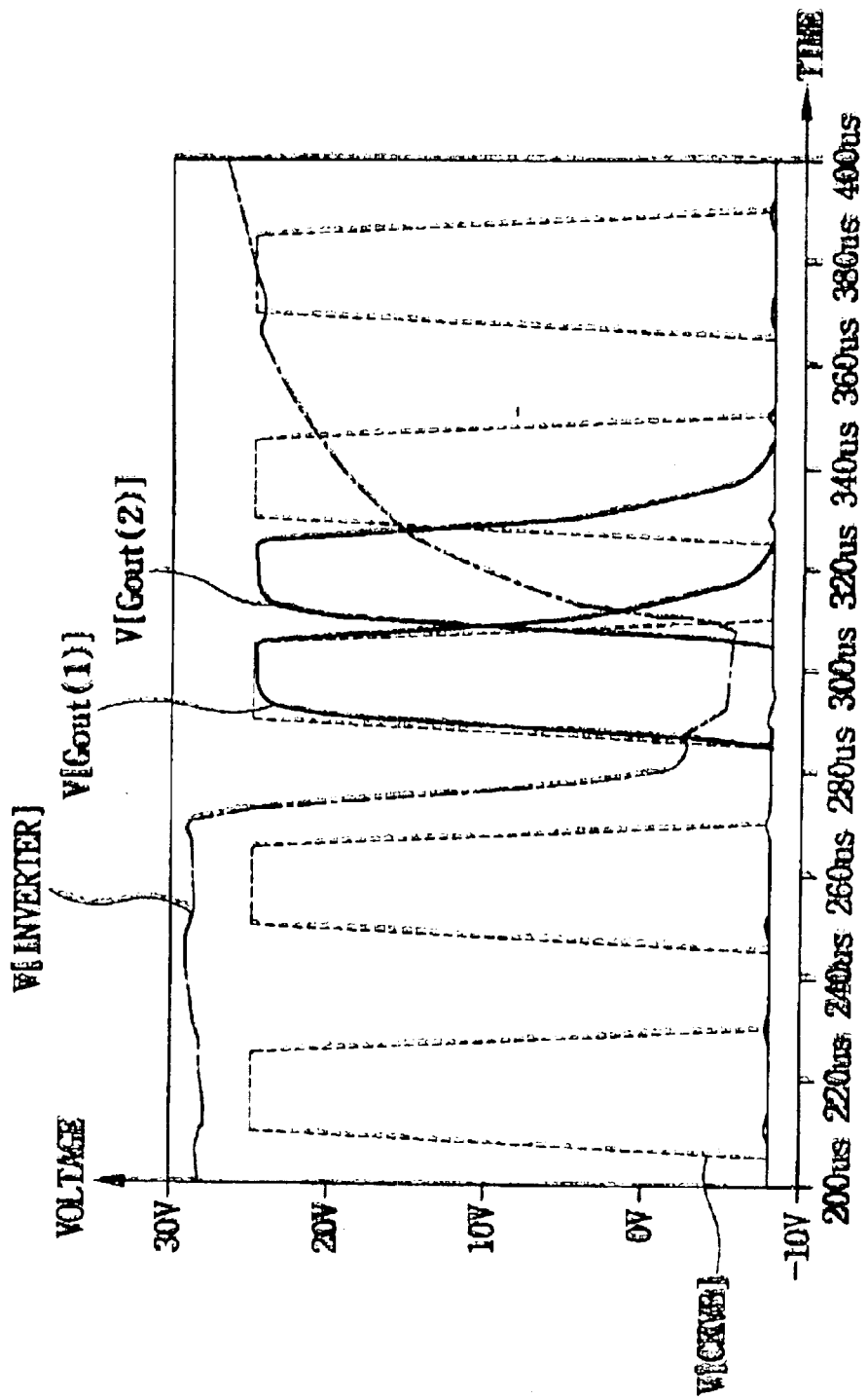
FIG. 23 is a graph showing the gate line driving signal outputted from the shift register of FIG. 7.

FIG. 23 is a graph showing the gate line driving signal outputted from the shift register of FIG. 7. FIG. 23 represents a waveform of an output voltage (or voltage at the node N2) outputted from the pull-down driver part (or an inverter) when a clock signal V[CKVB] is applied to each of the stages. V[GOUT(1)] represents an output voltage of a first stage according to the variation of the output voltage outputted from the inverter, and V[GOUT(2)] represents an output voltage of a second stage according to the variation of the output voltage of the inverter.

Referring to FIG. 23, the output voltage outputted from the inverter has a relatively slow slope, or rises slowly from a low voltage level to a high voltage level. Namely, the operation speed of the inverter is slow.

The slope of the inverter depends upon a resistance of the inverter and a parasitic capacitance C1 of the pull-down transistor M2. The larger the R×C1 value is, the slower is the slope of the inverter, and the slower is the operation speed of the inverter.

Especially, when the gate driver circuit, or the shift register drives the gate lines connected to the thin film transistors disposed on the liquid crystal display panel having a large display screen size, the parasitic capacitance of the pull-up and pull-down transistors M1 and M2 increases since the transistor size of the pull-up and pull-down transistors M1 and M2 increases. A transistor size is referred to the ratio (W/L) of a channel width (W) of the transistor to a channel length (L) of the transistor. Accordingly, the R×C1 increases and the slope of the inverter is slow.

The size of the inverter needs to be increased in order to increase the operation speed of the inverter. In order to increase the size of the inverter increases, a large layout area is required and the power consumption of the inverter increases. Therefore, the size of the inverter needs to be minimized. However, when the inverter is designed to have a minimum size, the operation speed of the inverter is slow.

As shown in FIG. 23, when the operation speed of the inverter is slow, especially the output voltage of the inverter is slowly changed from a low voltage level to a high voltage level, the pulse width of the gate line driving signals—for example V[Gout(1)], V[Gout(2)]—is larger than 1 H. 1 H is referred to as a pulse width of a clock signal. The pulse width of the gray scale voltage outputted from a data driver circuit 160 is also 1 H.

For example, the pixel connected to the output terminal OUT of the first gate line is affected by the gray scale voltage applied to the data line connected to the next gate line connected to the next stage. Therefore, when the pulse width of the V[Gout(1)] is larger than 1 H, image display quality is deteriorated. Generally, the minimum value of the gray scale voltage is about 0 volt, an effective pulse width of the gate line driving signal V[Gout(n)] is, preferably, less than or equal to 1 H. The effective pulse width of the gate line driving signal V[Gout(n)] is referred to as a pulse width of the portion of the gate line driving signal V[Gout(n)] that has a voltage level larger than 0 volt. Especially, in order to reduce the deterioration of the image display quality, the voltage level of the gate line driving signal needs to be rapidly changed from a high level to a low level when the voltage level of the inverter is changed from a low level to a high level, and the effective pulse width of the gate line driving signal V[Gout(n)] is, preferably, less than or equal to 1 H.

Hereinafter, a shift register, which has a minimum size of inverter under the limit of the layout area and may prevent the deterioration of the image display quality, is described.

Figure 24:
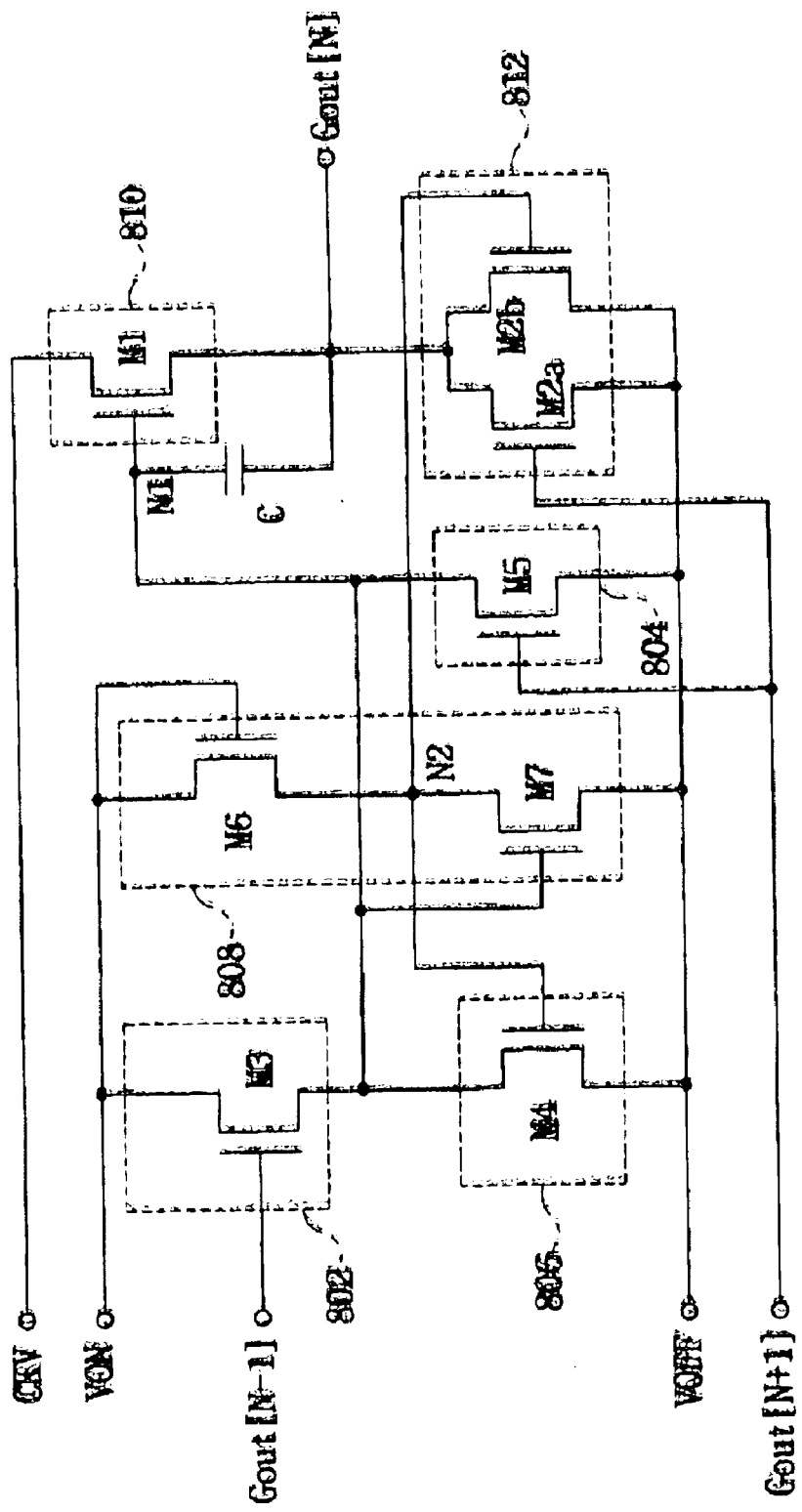
FIG. 24 is a block diagram showing a unit stage of a shift register used in a gate driver circuit according to a sixth exemplary embodiment of the present invention.

FIG. 24 is a block diagram showing a unit stage of the shift register used in a gate driver circuit according to a sixth exemplary embodiment of the present invention.

Referring to FIG. 24, the unit stage includes a buffer transistor 808, a hold transistor 806, a discharge transistor 804, an inverter 808, a pull-up transistor 810 and a pull-down transistor 812. The unit stage of FIG. 24 has some differences from the unit stage of FIG. 7.

First, the size of the inverter 808, the size of the pull-up transistor M1 and the size of the pull-down transistor M2 of FIG. 24 are the same as those of FIG. 7. However, the pull-down transistor M2 is divided into a first pull-down transistor M2a and a second pull-down transistor M2b. For example, when the transistor size of the pull-down transistor M2 of FIG. 7 has 1, the ratio of the transistor size between the first pull-down transistor M2a and the second pull-down transistor M2b may be 0.1:0.9. Preferably, the transistor size of the second pull-down transistor M2b is larger than that of the first pull-down transistor M2a.

Second, the first pull-down transistor M2a is driven by the output voltage of the inverter 808, the second pull-down transistor M2b is driven by the second pull-up driver transistor M5 and the gate line driving signal V[Gout(n+1)] outputted from the next stage. The second pull-up driver transistor M5 discharges the electric charges charged at the capacitor C.

Since the second pull-down transistor M2b is driven by the gate line driving signal V[Gout(n+1)] outputted from the next stage, the effective pulse width of the gate line driving signal V[Gout(n)] may be less than or equal to 1 H. In addition, the transistor size of the first pull-down transistor M2a, which has a capacitive load, is reduced and the operation speed of the inverter increases.

Figure 25:
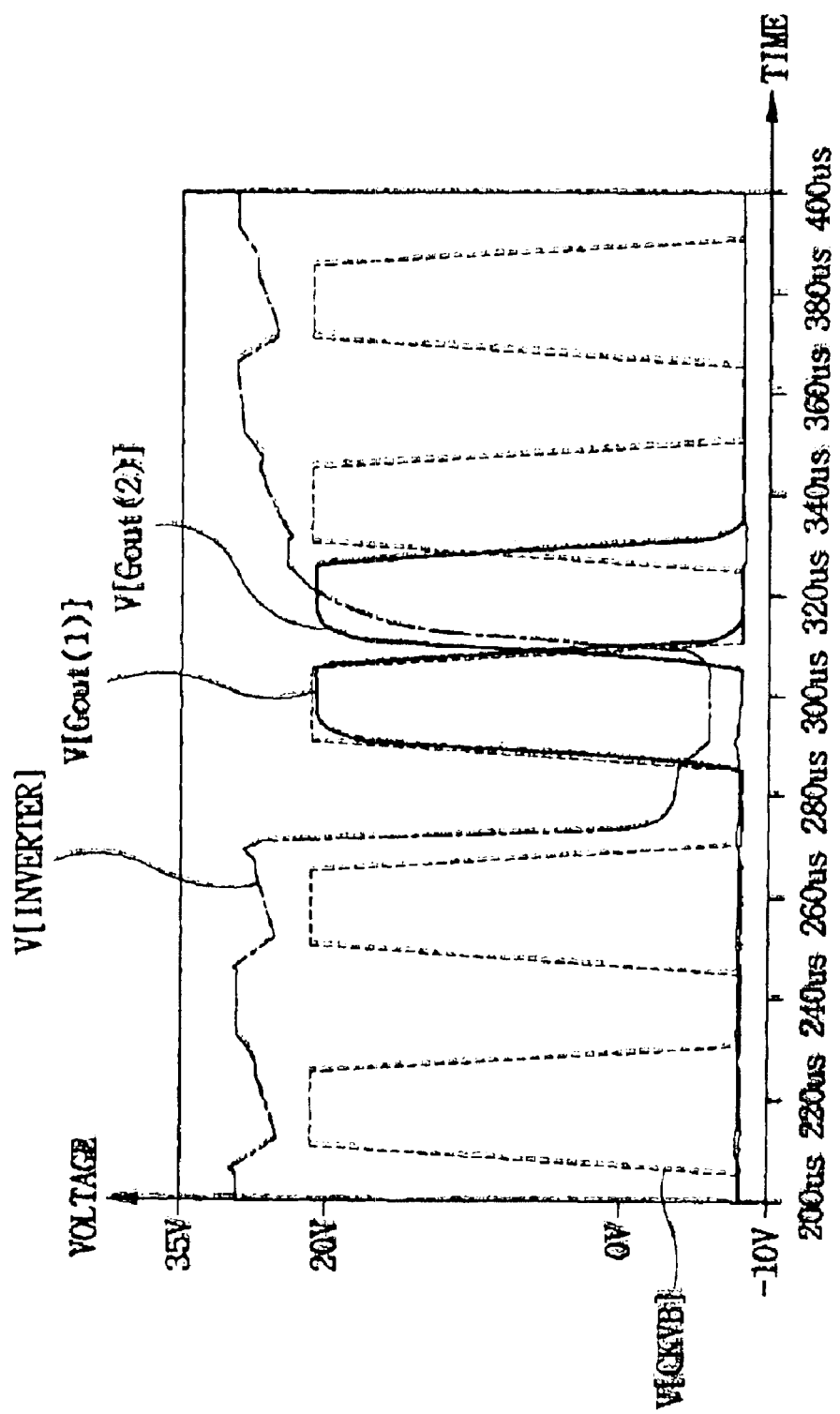
FIG. 25 is a graph showing the gate line driving signal outputted from the shift register of FIG. 24.

FIG. 25 is a graph showing the gate line driving signal outputted from the shift register of FIG. 24. Especially, FIG. 25 shows the gate line driving signal outputted from the shift register when the ratio of the transistor size between the first pull-down transistor M2a and the second pull-down transistor M2b is about 0.1:0.9.

Referring to FIG. 25, the effective pulse width of the gate line driving signal V[Gout(n)] outputted from the shift register of FIG. 25 is less than or equal to 1 H, and the slope of the output voltage of the inverter of FIG. 25 is steeper than the slope of the output voltage of the inverter of FIG. 23. The operation speed of the inverter of FIG. 25 is faster than that of the inverter of FIG. 23.

Figure 26:
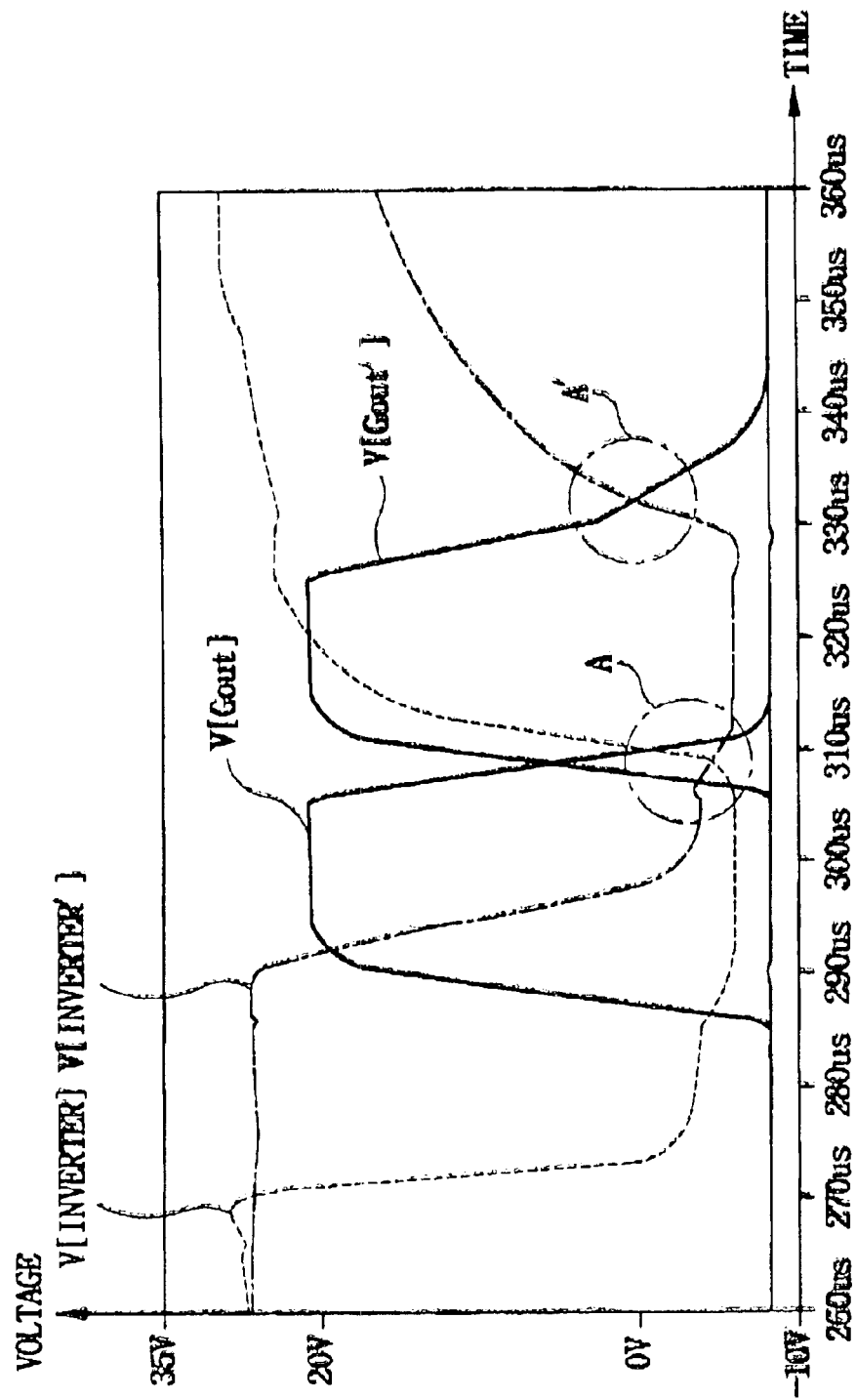
FIG. 26 is a graph showing the gate line driving signal outputted from the shift register of FIG. 7 and the gate line driving signal outputted from the shift register of FIG. 24.

FIG. 26 is a graph showing the gate line driving signal outputted from the shift register of FIG. 7 and the gate line driving signal outputted from the shift register of FIG. 24. FIG. 26 shows the output voltages of the inverters of FIG. 23 and FIG. 25 simultaneously. The output voltages of the inverters of FIG. 23 is V[INVERTER'], the output voltage of the shift register of FIG. 23 is V[Gout'], output voltages of the inverters of FIG. 25 is V[INVERTER], and the output voltage of the shift register of FIG. 25 is V[Gout].

Referring to FIG. 26, the slope of output voltage V[INVERTER] of the inverter 808 of FIG. 24 is larger than the output voltage V[INVERTER'] of the inverter of FIG. 23 in the rising edge of the output voltage. Referring to 'A' and 'A'' of FIG. 26, the voltage level of the output voltage V[Gout] of the shift register of FIG. 24 is more rapidly changed from a high level to a low level than the voltage level of the output voltage V[Gout'] of the shift register of FIG. 23, so that the effective pulse width of the gate line driving signal V[Gout(n)] may be less than or equal to 1H.

Figure 27:
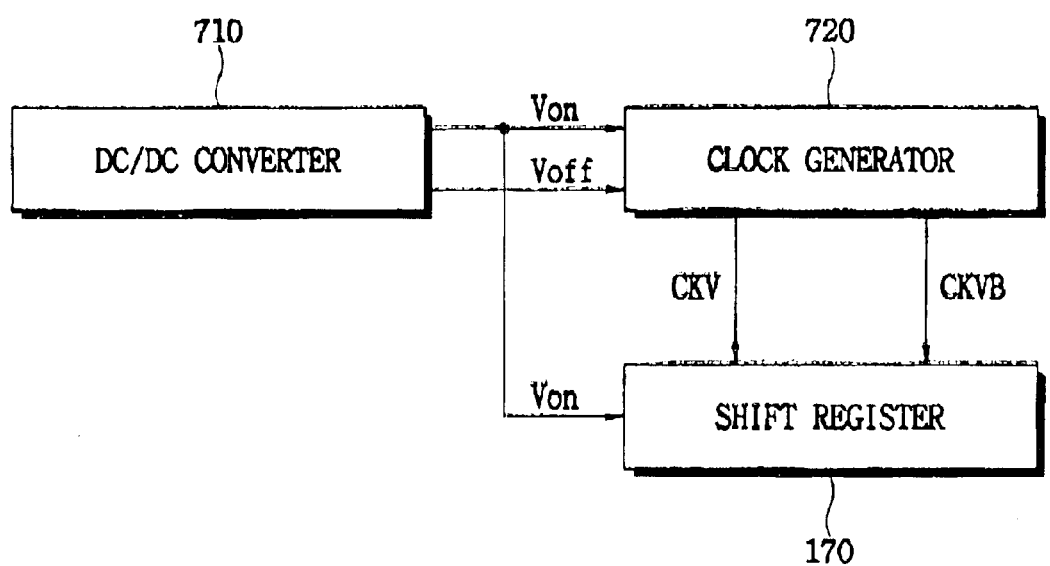
FIG. 27 is a block diagram showing a power supply and a clock generator according to a seventh exemplary embodiment of the present invention.

FIG. 27 is a block diagram showing a power supply and a clock generator according to a seventh exemplary embodiment of the present invention.

Referring to FIG. 27, the power supply may be a DC-to-DC converter 710, and the output power voltage Von of the DC-to-DC converter 710 is applied to both the clock generator 720 and the shift register 170. The clock generator 720 receives the power voltage Von and Voff and generates the clock signals ckv and ckvb to provide the shift register 170 with the clock signals ckv and ckvb. Namely, the clock generator 720 and the shift register 170 are driven by the same power voltage Von.

Figure 28:
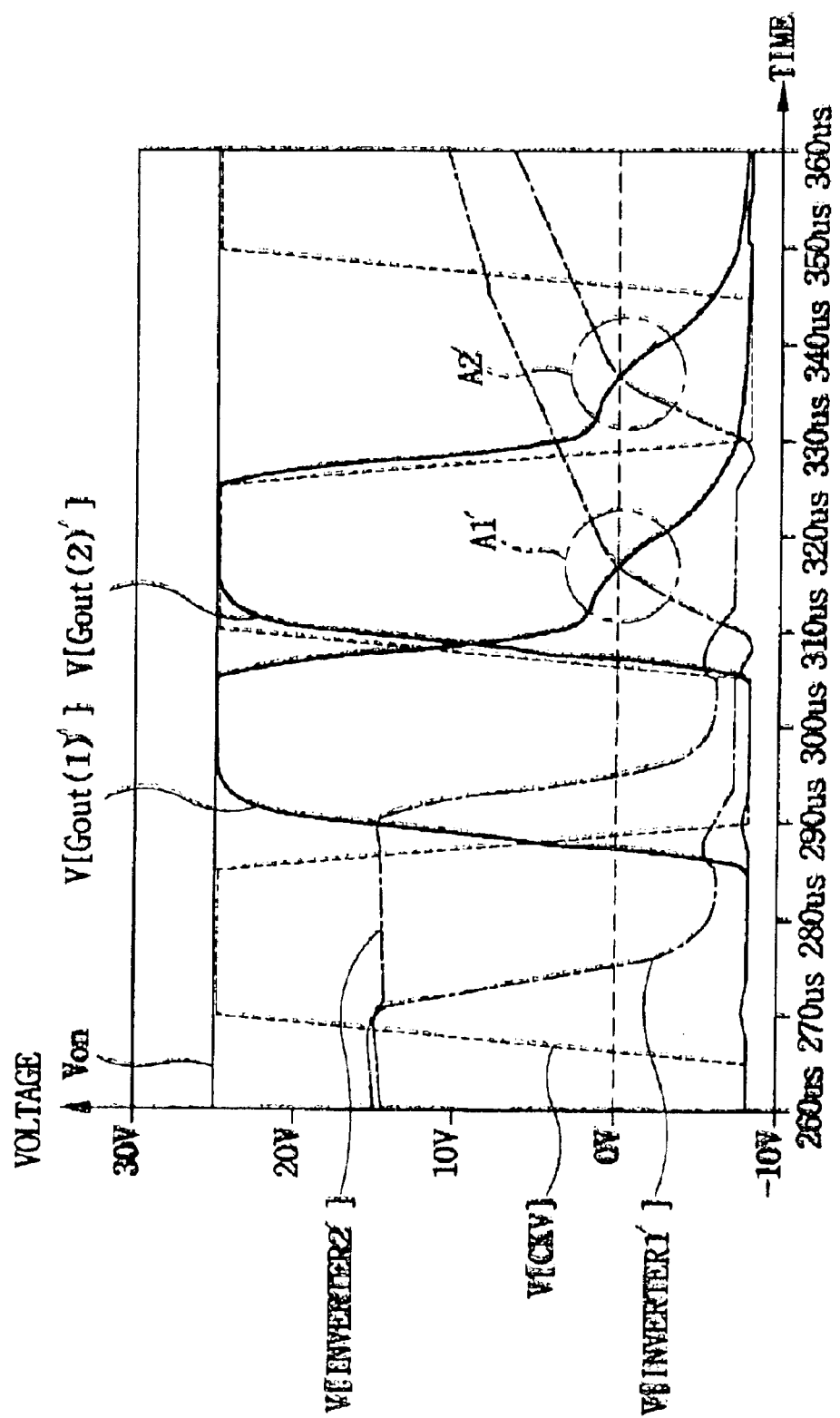
FIG. 28 is a graph showing the gate line driving signal outputted from the shift register when the same power voltage as that of the power voltage applied to the clock generator of FIG. 27 is applied to the shift register.

FIG. 28 is a graph showing the gate line driving signal outputted from the shift register when the same power voltage as that of the power voltage applied to the clock generator of FIG. 27 is applied to the shift register.

Referring to FIG. 28, when the same power voltage Von is applied to the clock generator 720 and the shift register 170, the variation of the gate line driving signal V[Gout(1)'] outputted from the first stage is shown according to the variation of the output voltage of the inverter 808 (or the pull-down driving transistors M6 and M7) of the first stage, and the variation of the gate line driving signal V[Gout(2)'] outputted from the second stage is shown according to the variation of the output voltage of the inverter 808 (or the pull-down driving transistors M6 and M7) of the second stage When the same power voltage Von is applied to the clock generator 720 and the shift register 170, the maximum voltage level of the clock signal is substantially the same as the high level of the power voltage Von.

When the same power voltage Von is applied to the clock generator 720 and the shift register 170 in the liquid crystal display device having a large display screen size, image display quality may be deteriorated according as the capacitive load due to the gate lines increases.

As shown in FIG. 28, the pulse width of the gate line driving signal V[Gout(1)'] larger than 1 H (a pulse width of the clock signal). Generally, the minimum value of the gray scale voltage is about 0 volt, an effective pulse width of the gate line driving signal V[Gout(n)] is, preferably, less than or equal to 1 H. Especially, in order to reduce the deterioration of the image display quality, the voltage level of the gate line driving signal needs to be rapidly changed from a high level to a low level when the voltage level of the output voltage outputted from the inverter 808 is changed from a low level to a high level, and the effective pulse width of the gate line driving signal V[Gout(n)] is, preferably, less than or equal to 1 H.

Since the operation speed of the inverter 808 (or the pull-down transistors M6and M7) is slow, the pulse width of the gate line driving signal V[Gout(1)'] is larger than 1 H. As shown in the portion A1' and A2' of FIG. 28, since the output voltage outputted from the inverter 808 has a slow slope, or rises slowly from a low level to a high level, the voltage level of the gate line driving voltage V[Gout(1)'] and V[Gout(2)'] falls slowly below a low level in the vicinity of portion A1' and A2'. Therefore, the effective pulse width of the gate line driving voltage V[Gout(1)'] and V[Gout(2)'] is larger than 1 H.

When the effective pulse width of the V[Gout(n)'] is larger than 1 H, the pixel connected to the output terminal OUT of the nth gate line is affected by the gray scale voltage applied to the data line connected to the next gate line ((n+1)th gate line) connected to the next stage. Therefore, image display quality may be deteriorated. The voltage level of the output voltage of the inverter 808 needs to be rapidly changed from a low level to a high level in order that the effective pulse width of the V[Gout(n)'] may be not larger than 1 H. Namely, the slope of the output voltage of the inverter needs to be large. The amplitude of the output voltage of the inverter may be increased in order that the slope of the output voltage of the inverter may be increased.

Figure 29:
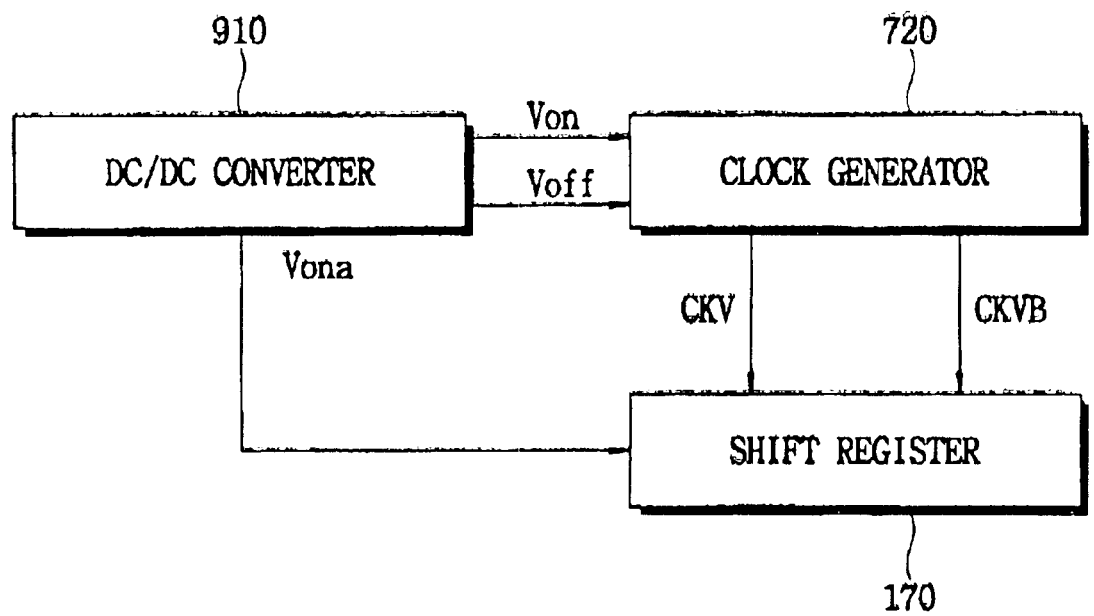
FIG. 29 is a block diagram showing a power supply and a clock generator according to a seventh exemplary embodiment of the present invention.

FIG. 29 is a block diagram showing a power supply and a clock generator according to a seventh exemplary embodiment of the present invention.

Referring to FIG. 29, a DC-to-DC converter 910 generates a power voltage Von and applies the power voltage Von to the clock generator 720. The DC-to-DC converter 910 generates another power voltage Vona and applies the power voltage Vona to the shift register 170. The power voltage Vona has a voltage level different from that of the power voltage Von. Namely, the power voltage Vona different from the power voltage Von is applied to the shift register 170.

Preferably, the amplitude of the power voltage Vona is larger than that of the power voltage Von so as to maintain the maximum output voltage of the inverter 808 to be larger than the maximum output voltage of the inverter of FIG. 28.

Figure 30:
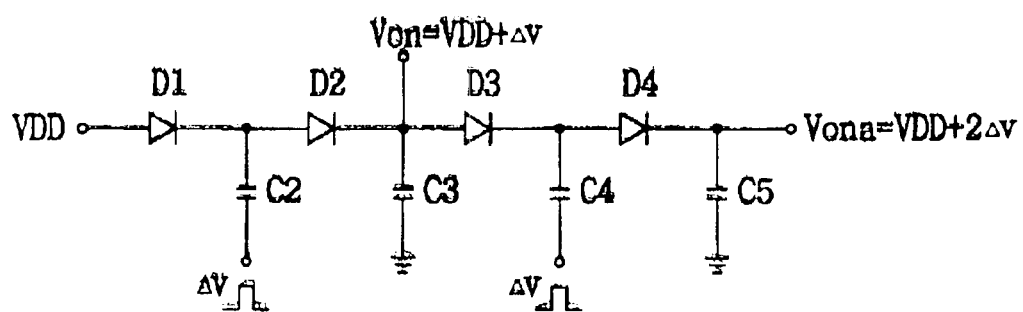
FIG. 30 is a circuit diagram showing an example of a DC-to-DC converter of FIG. 29.

FIG. 30 is a circuit diagram showing an example of a DC-to-DC converter of FIG. 29. FIG. 30 shows a DC-to-DC converter for generating the power voltage Vona larger than the power voltage Von.

Referring to FIG. 30, the DC-to-DC converter receives a DC voltage VDD and generates the power voltage Von (VDD+ΔV) and the power voltage Vona (VDD+2ΔV) by means of a charge pump circuit. For example, the charge pump circuit includes a plurality of diodes D1, D2, D3 and D4 serially connected with each other and a plurality of capacitors C2, C3, C4 and C5.

The DC voltage VDD is applied to the anode of the diode D1, ΔV is applied to capacitor C2, and Von (VDD+ΔV) is outputted from a cathode of diode D2. The Von is applied to the anode of the diode D3, ΔV is applied to capacitor C4, and Vona (VDD+2ΔV) is outputted from a cathode of diode D4. Therefore, Vona (>Von) and Von may be generated by means of the charge pump circuit. In addition, Vona (>Von) and Von may be generated by means of a voltage level shifter circuit. Von may be varied, and Vona may be also varied independent of Von.

When Vona (>Von) is applied to the shift register 170, as shown in FIGS. 7 and 29, the inverter 808 is driven by Vona that is applied to the shift register through the drain of the transistor M6. Accordingly, the output voltage of the inverter 808 driven by Vona increases the output voltage of the inverter driven by Von. In addition, the voltage level of the output voltage of the inverter is rapidly changed from a low level to a high level. Therefore, the effective pulse width of V[Gout(n)] is substantially 1 H or not larger than 1 H, and the image display quality may not be deteriorated.

Figure 31:
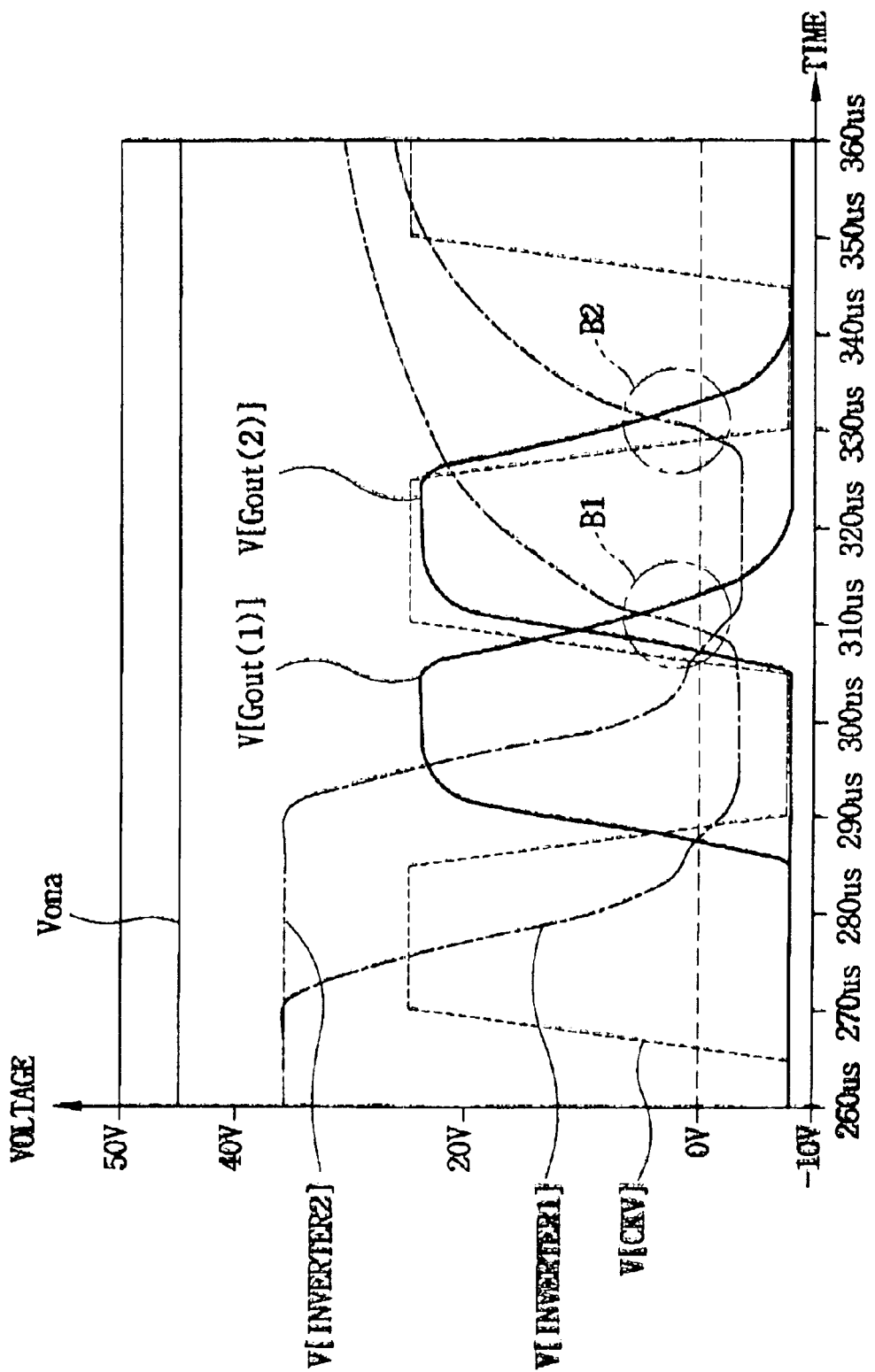
FIG. 31 is a graph showing the gate line driving signal outputted from the shift register when the power supply and the clock generator of FIG. 29 drive the shift register.

FIG. 31 is a graph showing the gate line driving signal outputted from the shift register when the power supply and the clock generator of FIG. 29 drive the shift register.

In FIG. 28, about 25 volts of Von is applied to the inverter 808, and the maximum output voltage of the inverter 808 is about 15 volts. In FIG. 31, about 45 volts of Von is applied to the inverter 808, and the maximum output voltage of the inverter 808 is about 35 volts. Therefore, regarding to the portion B1 and B1' of the rising edge of the output voltage of the inverter, the effective pulse widths of V[Gout(1)] and V[Gout(1)] are smaller than those of FIG. 28.

Figure 32:
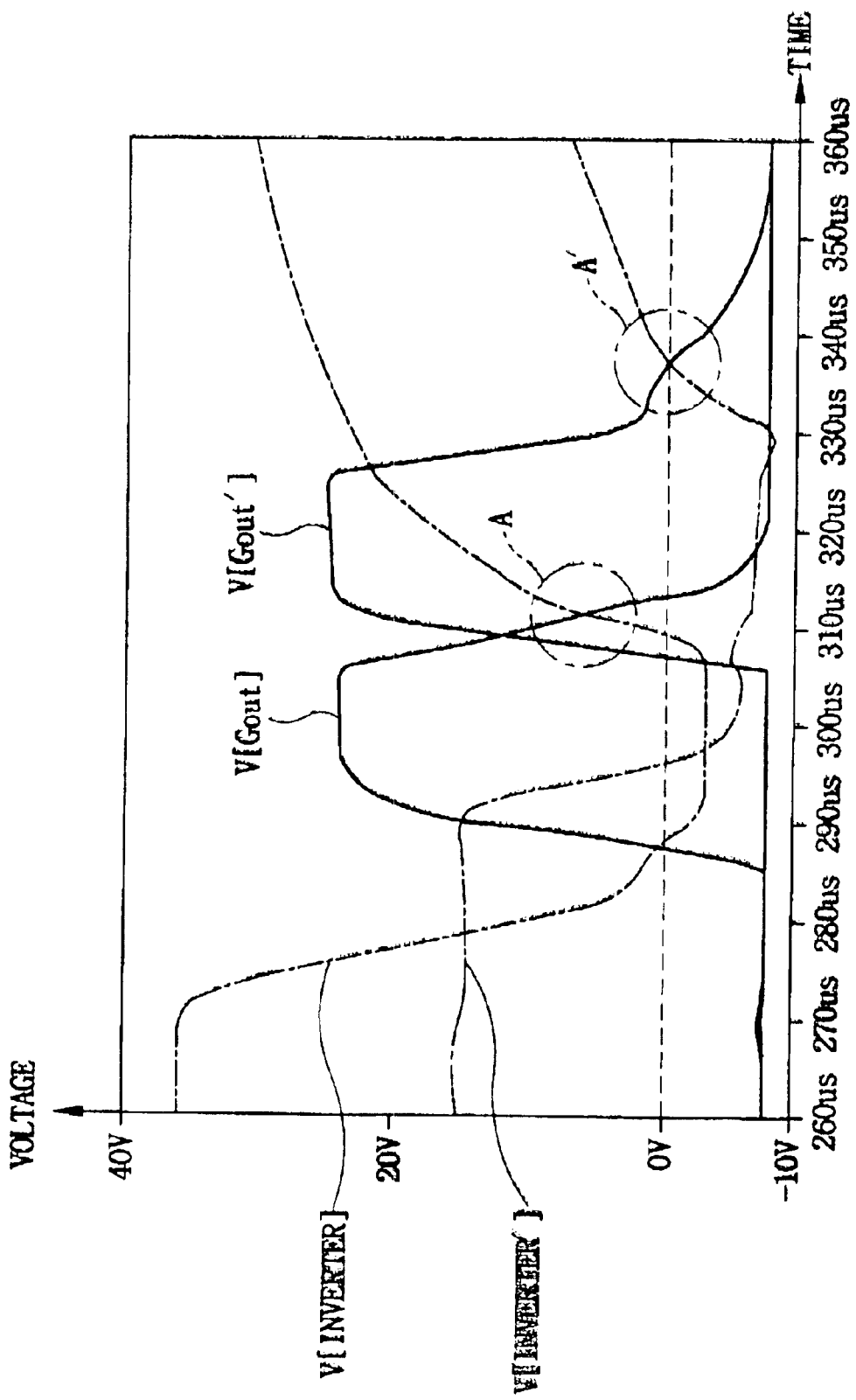
FIG. 32 is a graph showing the gate line driving signals outputted from the shift register when the power supply and the clock generator of FIGS. 29 and 28 drive the shift register.

FIG. 32 is a graph showing the gate line driving signals outputted from the shift register when the power supply and the clock generator of FIGS. 29 and 28 drive the shift register.

Referring to FIG. 32, V[Gout'] represents the gate line driving signal when the clock generator and the shift register are driven by the same power voltage Von. V[Gout] represents the gate line driving signal when Von is applied to the clock generator and Vona larger than Von is applied to the shift register.

Regarding to the portion A and A' of the falling edge of the output voltage of the inverter, the effective pulse widths of V[Gout] is narrower than that of V[Gout'].

Although the above embodiments discuss the shift register for driving the gate lines of the liquid crystal display device, the present invention may also be utilized in the organic electroluminescent display device.

While the exemplary embodiments of the present invention and its advantages have been described in detail, it should be understood that various changes, substitutions and alterations can be made herein without departing from the scope of the invention as defined by appended claims.

What is claimed is:

1. A shift register including a plurality of cascade-connected stages, the stages receiving a first clock signal and a second clock signal to sequentially produce a plurality of scan line driving signals for selecting a plurality of scan lines, each of the stages comprising:
   a carry buffer for providing a next stage with a carry signal corresponding to the first clock signal or the second clock signal, the second clock signal having an inverted phase with respect to the first clock signal;
   a pull-up part for providing an output terminal with a first scan line driving signal corresponding to the first clock signal or the second clock signal;
   a pull-down part for providing the output terminal with a first power voltage;
   a pull-up driver part for turning on the pull-up part in response to the carry signal provided from a previous stage and turning off the pull-up part in response to a is second scan line driving signal of the next stage; and
   a pull-down driver part for turning off the pull-down part in response to the carry signal provided from the previous stage and turning on the pull-up part in response to the second scan line driving signal of the next stage.

2. The shift register of claim 1, wherein the carry buffer includes a first transistor for receiving the first or the second clock signal through a first drain electrode of the first transistor to output the carry signal in response to an output signal of the pull-down driver part through a first source electrode of the first transistor to the next stage, and the output signal is applied to a first gate electrode of the first transistor.

3. The shift register of claim 2, wherein the first transistor is formed at a position adjacent to the pull-up part so as to supply the first or the second clock signal to the pull-up driver part of the next stage.

4. The shift register of claim 2, wherein the pull-up part includes a second transistor,
   the pull-down part includes a third transistor, and the third transistor includes:
   the first gate electrode branched from a second gate wiring of the second transistor;
   the first drain electrode branched from a main wiring from which a second drain of the second transistor is branched; and
   the first source electrode bypassing the pull-up part and the pull-down part to be extended to a third gate of the pull-down part of the next stage.

5. The shift register of claim 4, wherein the first source electrode of the first transistor is connected to a third drain electrode of the third transistor by means of a bridge that is formed between the first source line and the third drain line.

6. A liquid crystal display device comprising:
   a display cell array formed on a transparent substrate, the display cell array including a plurality of gate lines, a plurality of data lines and a plurality of switching elements, the switching elements coupled to the gate lines and the data lines;
   a data driver circuit for providing each of the data lines with an image signal; and
   a gate driver circuit including a shift register, the shift register including a plurality of cascade-connected stages, the stages receiving a first clock signal and a second clock signal to sequentially produce a plurality of gate line driving signals for selecting the gate lines, each of the stages comprising:
      a carry buffer for providing a next stage with a carry signal corresponding to the first clock signal or the second clock signal, the second clock signal having an inverted phase with respect to the first clock signal;
      a pull-up part for providing an output terminal with a first gate line driving signal corresponding to the first clock signal or the second clock signal;
      a pull-down part for providing the output terminal with a first power voltage;
      a pull-up driver part for turning on the pull-up part in response to the carry signal provided from a previous stage and turning off the pull-up part in response to a second gate line driving signal of the next stage; and
      a pull-down driver part for turning off the pull-down part in response to the carry signal provided from the previous stage and turning on the pull-up part in response to the second gate line driving signal of the next stage.

7. A method of driving a shift register, the shift register including a plurality of cascade-connected stages, the stages receiving a first clock signal and a second clock signal to sequentially produce a plurality of scan line driving signals for selecting a plurality of scan lines, the method comprising:
   providing a next stage with a carry signal corresponding to the first clock signal or the second clock signal, the second clock signal having an inverted phase with respect to the first clock signal;
   producing a first scan line driving signal corresponding to the first clock signal or the second clock signal in response to the carry signal outputted from a previous stage; and
   lowering a first voltage level of the first scan line driving signal outputted from a present stage in response to a second scan line driving signal outputted from the next stage.

8. The method of claim 7, wherein the carry signal has a second voltage level corresponding to the first clock signal or the second clock signal and is independent of a parasitic resistor and a parasitic capacitor generated from the scan lines.

9. The method of claim 7, further comprising: lowering a second voltage level of the carry signal outputted from the previous stage in response to the first voltage level of the first scan line driving signal after a predetermined period.

10. A shift register including a plurality of cascade-connected stages, a first stage receiving a scan start signal, the stages receiving a first clock signal and a second clock signal to sequentially produce a plurality of scan line driving signals for selecting a plurality of scan lines, each of the stages comprising:

a first carry buffer for providing a next stage with a first carry signal corresponding to the first clock signal or the second clock signal, the second clock signal having an inverted phase with respect to the first clock signal;

a pull-up part for providing a first output terminal with a first scan line driving signal corresponding to the first clock signal or the second clock signal;

a pull-down part for providing the first output terminal with a first power voltage;

a pull-up driver part for turning on the pull-up part in response to a second carry signal outputted from the first carry buffer of a previous stage and turning off the pull-up part in response to a second scan line driving signal of the next stage;

a pull-down driver part for turning off the pull-down part in response to the first carry signal provided from the first carry buffer of the previous stage and turning on the pull-up part in response to the second scan line driving signal of the next stage; and a second carry buffer for lowering a first voltage level of the second carry signal, the first carry signal outputted from the first carry buffer of the previous stage to be applied to the pull-up part.

11. The shift register of claim 10, wherein the first carry buffer includes a first transistor for receiving the first or the second clock signal through a first drain electrode of the first transistor to output the carry signal in response to an output signal of the pull-down driver part through a first source electrode of the first transistor to the next stage, and the output signal is applied to a first gate electrode of the first transistor.

12. The shift register of claim 10, wherein the second carry buffer includes a second transistor, and the second transistor includes:

a second drain electrode coupled to a second output terminal of the first carry buffer of the previous stage and an input terminal of the pull-up driver part;

a second gate electrode coupled to the pull-down part; and a second source electrode for receiving the first power voltage.

13. The shift register of claim 10, wherein the second carry buffer includes:

a second transistor having a second drain electrode coupled to a second output terminal of the first carry buffer of the previous stage and an input terminal of the pull-up driver part, a second gate electrode coupled to the pull-down part, and a second source electrode for receiving the first power voltage; and a third transistor having a third drain electrode and a third gate electrode commonly coupled to the second source electrode, and a third source electrode for receiving the first power voltage.

14. The shift register of claim 10, wherein the second carry buffer includes:

a second transistor having a second drain electrode coupled to a second output terminal of the first carry buffer of the previous stage and an input terminal of the pull-up driver part, a second gate electrode coupled to the pull-down part, and a second source electrode for receiving the first power voltage; and a third transistor having a third drain electrode coupled to the second gate electrode of the second transistor, a third gate electrode coupled to the second drain electrode of the second transistor, and a third source electrode for receiving the first power voltage.

15. The shift register of claim 10, wherein the second carry buffer includes:

a second transistor having a second drain electrode coupled to a second output terminal of the first carry buffer of the previous stage and an input terminal of the pull-up driver part, a second gate electrode coupled to the pull-down part, and a second source electrode for receiving the first power voltage;

a third transistor having a third drain electrode and a third gate electrode commonly coupled to the second source electrode of the second transistor, and a third source electrode for receiving the first power voltage; and a fourth transistor having a fourth drain electrode coupled to the second gate electrode of the second transistor, a fourth gate electrode coupled to the second drain electrode of the second transistor, and a fourth source electrode for receiving the first power voltage.

16. A liquid crystal display device comprising:

a display cell array formed on a transparent substrate, the display cell array including a plurality of gate lines, a plurality of data lines and a plurality of switching elements, the switching elements coupled to the gate lines and the data lines;

a data driver circuit for providing each of the data lines with an image signal; and a gate driver circuit including a shift register, the shift register including a plurality of cascade-connected stages, a first stage receiving a scan start signal, the stages receiving a first clock signal and a second clock signal to sequentially produce a plurality of gate line driving signals for selecting a plurality of gate lines, each of the stages comprising:

a first carry buffer for providing a next stage with a first carry signal corresponding to the first clock signal or the second clock signal, the second clock signal having an inverted phase with respect to the first clock signal;

a pull-up part for providing a first output terminal with a first gate line driving signal corresponding to the first clock signal or the second clock signal;

a pull-down part for providing the first output terminal with a first power voltage;

a pull-up driver part for turning on the pull-up part in response to a second carry signal outputted from the first carry buffer of a previous stage and turning off the pull-up part in response to a second gate line driving signal of the next stage;

a pull-down driver part for turning off the pull-down part in response to the first carry signal provided from the first carry buffer of the previous stage and turning on the pull-up part in response to the second gate line driving signal of the next stage; and a second carry buffer for lowering a first voltage level of the second carry signal, the first carry signal outputted from the first carry buffer of the previous stage to be applied to the pull-up part.

17. A shift register including a plurality of cascade-connected stages, the stages receiving a first clock signal and a second clock signal to sequentially produce a plurality of scan line driving signals for selecting a plurality of scan lines, each of the stages comprising:

a pull-up switching device for providing an output terminal of each of the stages with a first scan line driving signal corresponding to the first clock signal or the second clock signal;
   a first pull-up driver switching device for turning on the pull-up switching device in response to a scan start signal or a second scan line driving signal outputted from a previous stage;
   a second pull-up driver switching device for turning off the pull-up switching device in response to a third scan line driving signal outputted from a next stage;
   a first pull-down switching device for providing the output terminal with a first power voltage;
   a pull-down driver switching device for turning off the pull-down switching device in response to the scan start signal or the second scan line driving signal outputted from the previous stage; and
   a second pull-down switching device, the second pull-down switching device being turned on in response to the third scan line driving signal to provide the output terminal with the first power voltage.

18. The shift register of claim 17, wherein each of the stage further comprises a third pull-up driver switching device, and the third pull-up driver switching device is turned off when the pull-up switching device is turned on and discharges the pull-up switching device.

19. The shift register of claim 17, wherein the first and second pull-down switching devices respectively includes a-Si NMOS thin film transistor.

20. The shift register of claim 19, wherein a first transistor size of the second pull-down switching device is larger than a second transistor size of the first pull-down switching device.

21. The shift register of claim 20, wherein the second transistor size is substantially nine times larger than the first transistor size.

22. A liquid crystal display device comprising:
   a display cell array formed on a transparent substrate, the display cell array including a plurality of gate lines, a plurality of data lines and a plurality of switching elements, the switching elements coupled to the gate lines and the data lines;
   a data driver circuit for providing each of the data lines with an image signal; and
   a gate driver circuit including a shift register, the shift register including a plurality of cascade-connected stages, the stages receiving a first clock signal and a second clock signal to sequentially produce a plurality of gate line driving signals for selecting a plurality of gate lines, each of the stages comprising:
      a pull-up switching device for providing an output terminal of each of the stages with a first gate line driving signal corresponding to the first clock signal or the is second clock signal;
      a first pull-up driver switching device for turning on the pull-up switching device in response to a scan start signal or a second gate line driving signal outputted from a previous stage;
      a second pull-up driver switching device for turning off the pull-up switching device in response to a third gate line driving signal outputted from a next stage;
      a first pull-down switching device for providing the output terminal with a first power voltage;
      a pull-down driver switching device for turning off the pull-down switching device in response to the scan start signal or the second gate line driving signal outputted from the previous stage; and
      a second pull-down switching device, the second pull-down switching device being turned on in response to the third gate line driving signal to provide the output terminal with the first power voltage.

23. A shift register including a plurality of cascade-connected stages, the stages receiving a first clock signal and a second clock signal to sequentially produce a plurality of scan line driving signals for selecting a plurality of scan lines, each of the stages comprising:
   a first pull-up driver switching device having a first electrode for receiving a second power voltage, a second electrode for receiving a scan start signal or a first scan line driving signal outputted from a previous stage, and a third electrode coupled to a first node;
   a pull-up switching device having a fourth electrode for receiving the first clock signal or the second clock signal, a fifth electrode coupled to the first node, and a sixth electrode coupled to an output terminal;
   a first pull-down switching device having a seventh electrode coupled to the output terminal, an eighth electrode coupled to a second node, and a ninth electrode for receiving a first power voltage;
   a second pull-down switching device having a tenth electrode coupled to the output terminal, an eleventh electrode for receiving a second gate line driving signal outputted from a next stage, and a twelfth electrode for receiving the first power voltage;
   a capacitor coupled between the first node and the output terminal;
   a second pull-up driver switching device having a thirteenth electrode coupled to the first node, a fourteenth electrode for receiving the second gate line driving signal outputted from the next stage, and a fifteenth electrode for receiving the first power voltage;
   a third pull-up driver switching device having a sixteenth electrode coupled to the first node, a seventeenth electrode coupled to the second node, and an eighteenth electrode for receiving the first power voltage;
   a first pull-up driver switching device having a nineteenth electrode and a twentieth electrode commonly coupled with each other to receive the second power voltage, and a twenty first electrode coupled to the second node; and
   a second pull-down driver switching device having a twenty second electrode coupled to the second node, a twenty third electrode coupled to the first node, and a twenty fourth electrode for receiving the first power voltage.

24. The shift register of claim 23, wherein the first and second pull-down switching devices respectively includes a-Si NMOS thin film transistor.

25. The shift register of claim 24, wherein the first and second pull-down switching devices respectively is a NMOS transistor, and a first transistor size of the second pull-down switching device is larger than a second transistor size of the first pull-down switching device.

26. The shift register of claim 25, wherein the second transistor size is substantially nine times larger than the first transistor size.

27. A method of driving a shift register, the shift register including a plurality of cascade-connected stages, the stages receiving a first clock signal and a second clock signal to sequentially produce a plurality of scan line driving signals for selecting a plurality of scan lines, the method comprising:
   receiving the first clock signal or the second clock signal to provide each of the stages with the first clock signal or the second clock signal, the first clock signal and the second clock signal having substantially a first voltage level corresponding to the first voltage level of a first power voltage;

generating a second power voltage to provide each of the stages with the second power voltage, the second power voltage having a second voltage level higher than the first voltage level by a predetermined voltage level;

generating a first scan line driving signal for selecting a first scan line coupled to a present stage;

lowering a third voltage level of the first scan line driving signal to a fourth voltage level lower than the third voltage level in response to a second scan line driving signal outputted from a next stage;

providing the first scan line with the first scan line driving signal having the fourth voltage level; and maintaining the fourth voltage level of the first scan line driving signal for a predetermined period when a voltage level of an output signal of a pull-down switching device is changed from a fifth voltage level to a sixth voltage level higher than the fifth voltage level after lowering the third voltage level of the first scan line driving signal.

28. The method of claim 27, wherein the first voltage level of the first power voltage is raised by the predetermined voltage level so as to generate the second power voltage having the second voltage level.

29. The method of claim 27, wherein the first voltage level of the first power voltage is regulated to be varied, and the second voltage level of the first power voltage is regulated independently of the first power voltage.

30. The method of claim 27, wherein a maximum voltage level of the output signal of the pull-down switching device is between the first voltage level and the second voltage level.

31. A method of driving a shift register, the shift register including a plurality of cascade-connected stages, the stages alternately receiving a first clock signal and a second clock signal generated from a clock generator to sequentially generate a plurality of scan line driving signals for selecting a plurality of scan lines, the first and second clock signal having substantially a first voltage level corresponding to the first voltage level of a first power voltage, each of the stages comprising:

a pull-up switching device for providing an output terminal of each of the stages with a first scan line driving signal corresponding to the first clock signal or the second clock signal;

a first pull-up driver switching device for turning on the pull-up switching device in response to a scan start signal or a second scan line driving signal outputted from a previous stage;

a second pull-up driver switching device for turning off the pull-up switching device in response to a third scan line driving signal outputted from a next stage;

a pull-down switching device for providing the output terminal with a third power voltage; and a pull-down driver switching device for turning off the pull-down switching device in response to the scan start signal or the second scan line driving signal outputted from the previous stage, wherein the method comprises:

receiving the first clock signal or the second clock signal to provide each of the stages with the first clock signal or the second clock signal;

generating a second power voltage to provide each of the stages with the second power voltage, the second power voltage having a second voltage level higher than the first voltage level by a predetermined voltage level;

generating a first scan line driving signal for selecting a first scan line coupled to a present stage during a high level period of the first clock signal or the second clock signal;

lowering a third voltage level of the first scan line driving signal to a fourth voltage level lower than the third voltage level in response to the third scan line driving signal outputted from the next stage;

providing the first scan line with the first scan line driving signal having the fourth voltage level; and maintaining the fourth voltage level of the first scan line driving signal for a predetermined period when a voltage level of an output signal of the pull-down switching device is changed from a fifth voltage level to a sixth voltage level higher than the fifth voltage level after lowering the third voltage level of the first scan line driving signal.

* * * * *